(12) United States Patent
Mikkelsen et al.

(10) Patent No.: US 10,663,631 B2
(45) Date of Patent: May 26, 2020

(54) NANOPATCH ANTENNAS AND RELATED METHODS FOR TAILORING THE PROPERTIES OF OPTICAL MATERIALS AND METASURFACES

(71) Applicant: Duke University, Durham, NC (US)

(72) Inventors: Maiken H. Mikkelsen, Durham, NC (US); David R. Smith, Durham, NC (US); Gleb M. Akselrod, Durham, NC (US)

(73) Assignee: Duke University, Durham, NC (US)

( * ) Notice: Subject to any disclaimer, the term of this patent is extended or adjusted under 35 U.S.C. 154(b) by 358 days.

(21) Appl. No.: 15/508,198

(22) PCT Filed: Oct. 10, 2015

(86) PCT No.: PCT/US2015/055033
§ 371 (c)(1),
(2) Date: Mar. 2, 2017

(87) PCT Pub. No.: WO2016/108990
PCT Pub. Date: Jul. 7, 2016

(65) Prior Publication Data
US 2017/0299784 A1    Oct. 19, 2017

Related U.S. Application Data

(60) Provisional application No. 62/062,235, filed on Oct. 10, 2014, provisional application No. 62/102,787, filed on Jan. 13, 2015.

(51) Int. Cl.
*G02B 5/00* (2006.01)
*H01L 33/06* (2010.01)
(Continued)

(52) U.S. Cl.
CPC .............. *G02B 5/008* (2013.01); *H01L 33/06* (2013.01); *H01L 33/26* (2013.01); *G02B 1/002* (2013.01); *H01L 33/44* (2013.01)

(58) Field of Classification Search
CPC ................................ G02B 5/008; H01L 33/06
(Continued)

(56) References Cited

U.S. PATENT DOCUMENTS

2004/0232406 A1* 11/2004 Weiss ...................... H02S 99/00
                                                                     257/35
2009/0231205 A1    9/2009 Burke et al.
(Continued)

OTHER PUBLICATIONS

Markus Pfeiffer, et al; "Enhancing the optical excitation efficiency of a single self-assembled quantum dot with a plasmoic nanoantenna." Jul. 2010. https://arxiv.org/abs/1007.3646.
(Continued)

*Primary Examiner* — Igwe U Anya
(74) *Attorney, Agent, or Firm* — Olive Law Group, PLLC

(57) ABSTRACT

Nanopatch antennas and related methods for enhancing and tailoring are disclosed. According to an aspect, an apparatus includes a conductive material defining a substantially planar surface. The apparatus also includes a conductive nanostructure defining a substantially planar surface. The conductive material and the conductive nanostructure are positioned such that the planar surface of the conductive material faces the planar surface of the conductive nanostructure, such that the planar surfaces are substantially parallel, and such that the planar surfaces are spaced by a selected distance. The apparatus also includes an optically-active material positioned between the planar surfaces.

37 Claims, 37 Drawing Sheets

(51) Int. Cl.
*H01L 33/26* (2010.01)
*H01L 33/44* (2010.01)
*G02B 1/00* (2006.01)

(58) Field of Classification Search
USPC .......................................................... 257/13
See application file for complete search history.

(56) References Cited

U.S. PATENT DOCUMENTS

| | | |
|---|---|---|
| 2010/0103049 A1 | 4/2010 | Tabakovic |
| 2010/0276598 A1 | 11/2010 | Kirby et al. |
| 2011/0025577 A1* | 2/2011 | Ward ................... H01Q 9/0407 343/848 |
| 2011/0204323 A1* | 8/2011 | Espiau de Lamaestre .................. H01L 33/0041 257/13 |
| 2013/0286633 A1* | 10/2013 | Rodriguez .............. H01L 33/50 362/84 |
| 2014/0048726 A1 | 2/2014 | Chen |
| 2015/0062686 A1* | 3/2015 | Smith ................... H01Q 17/007 359/240 |
| 2015/0369660 A1* | 12/2015 | Yu ....................... G02B 27/0075 250/338.4 |
| 2016/0211392 A1* | 7/2016 | So ........................ H01L 31/0296 |
| 2016/0218434 A1* | 7/2016 | Akyildiz .................. H01Q 1/38 |

OTHER PUBLICATIONS

International Search Report and Written Opinion for PCT/US2015/055033 dated Jul. 26, 2016.
International Preliminary Report on Patentability for PCT/US2015/055033 dated Apr. 11, 2017.

* cited by examiner

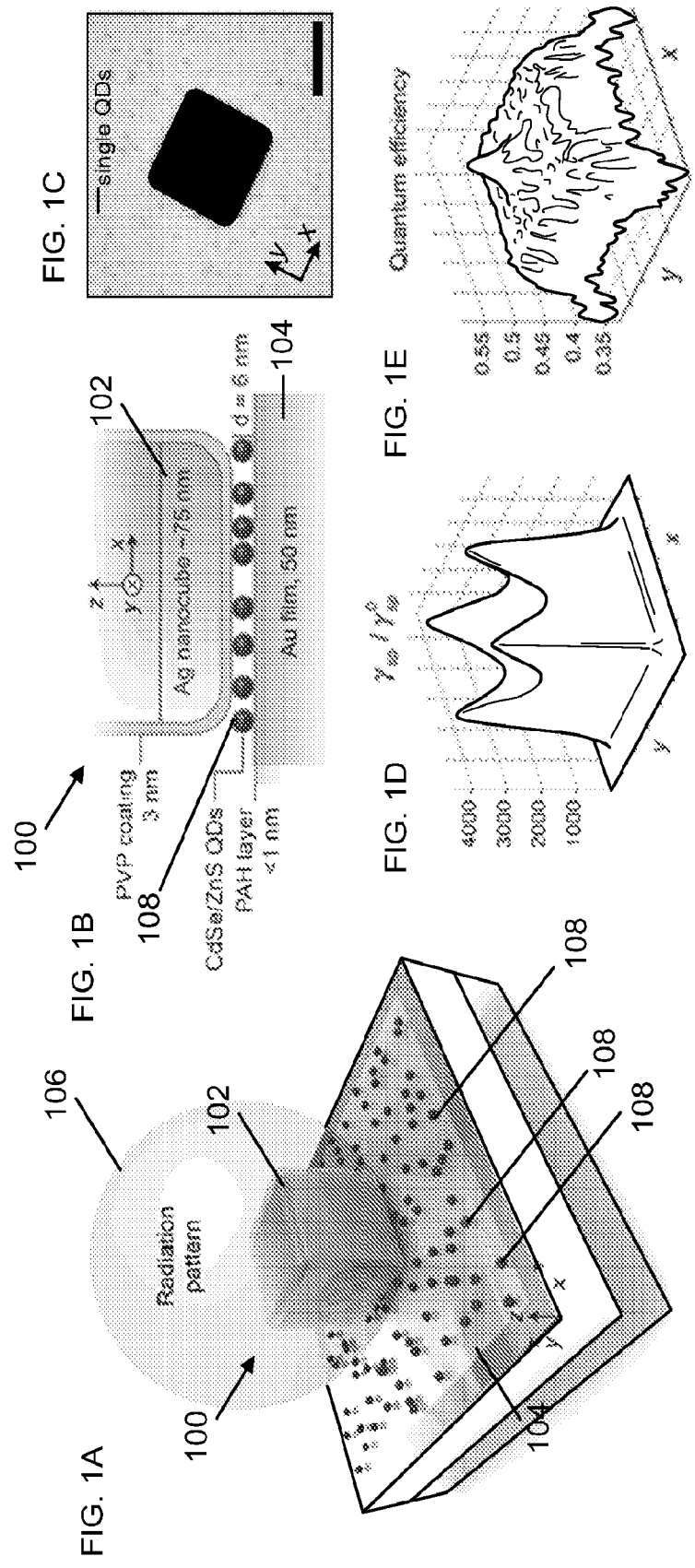

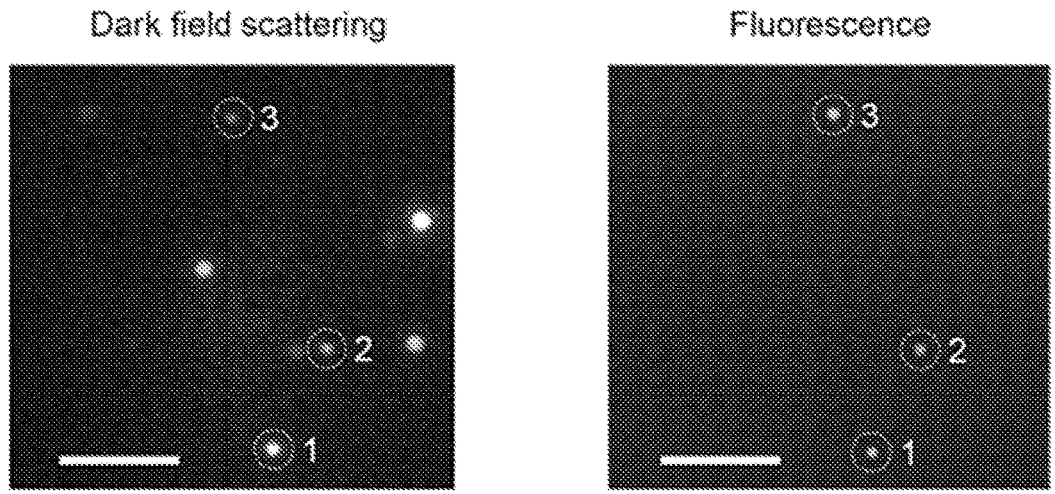
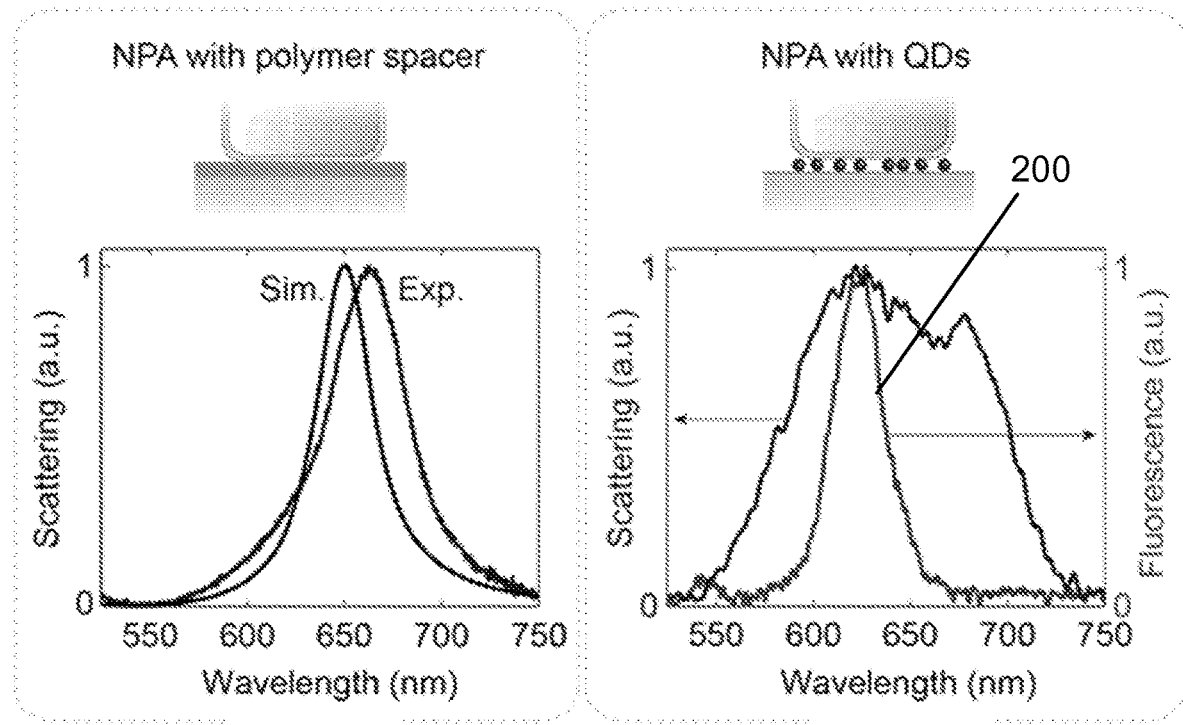
FIG. 2A  FIG. 2B  FIG. 2C  FIG. 2D

FIG. 4A
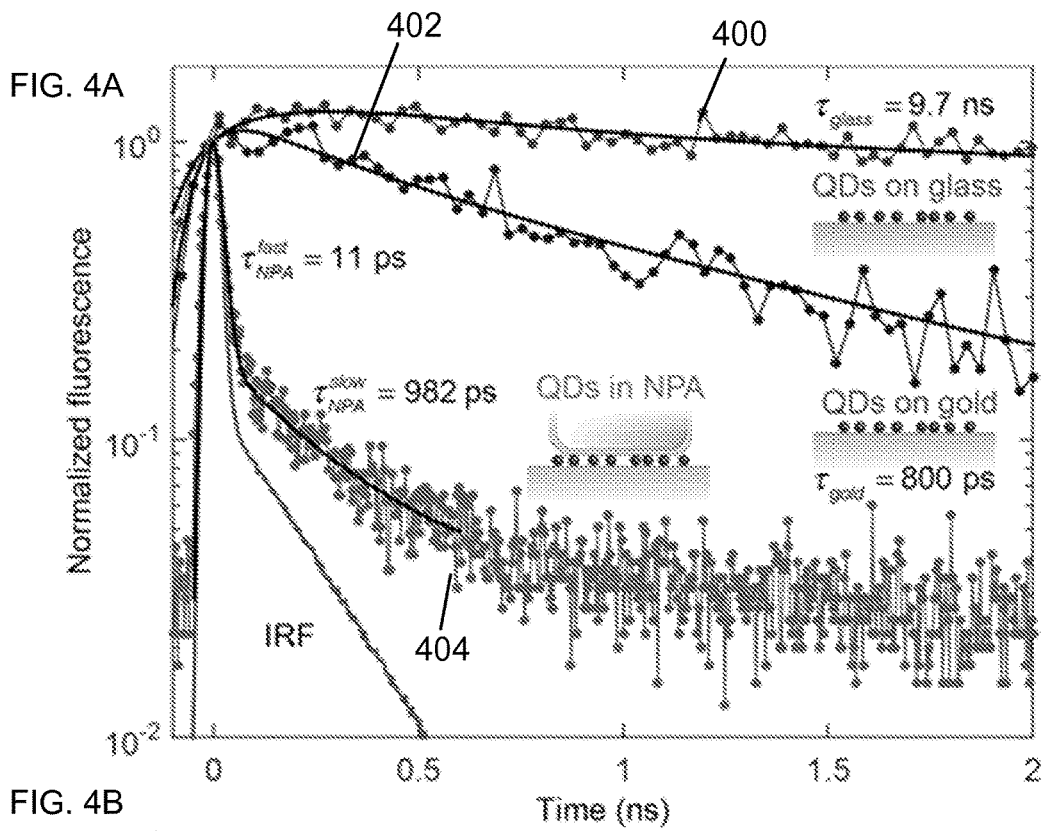
FIG. 4B
FIG. 4C
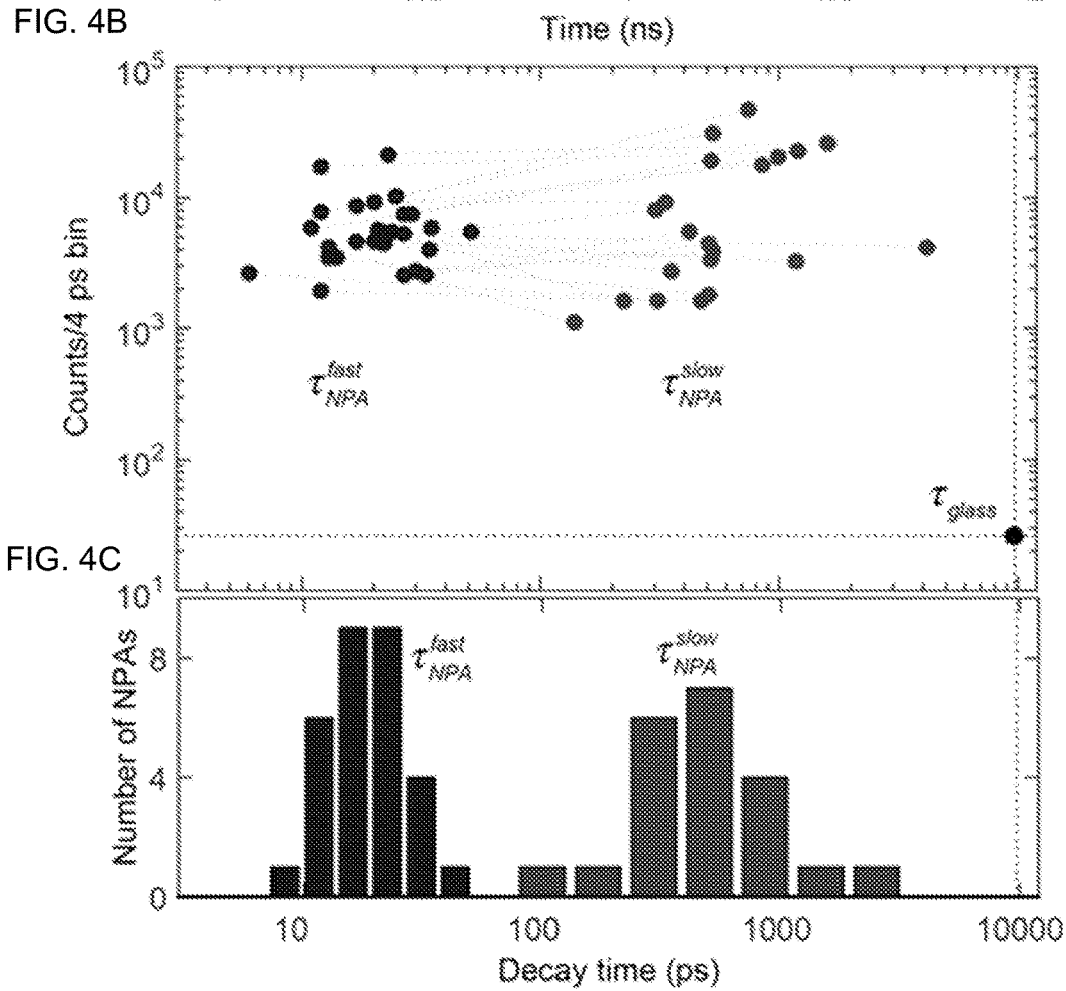

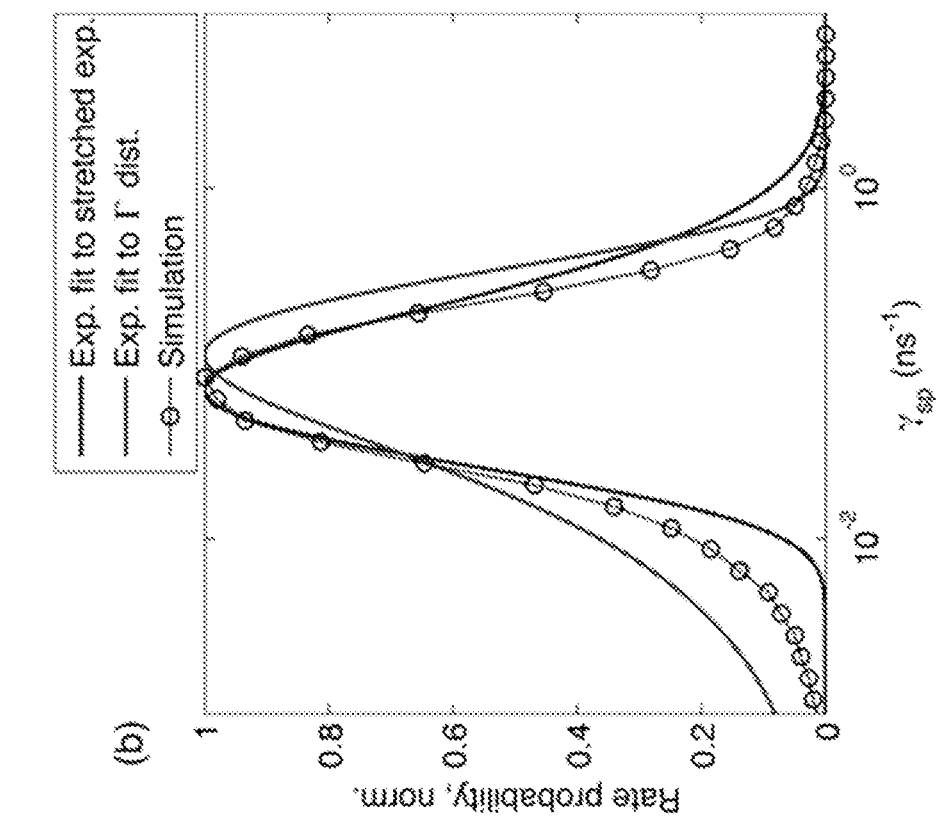
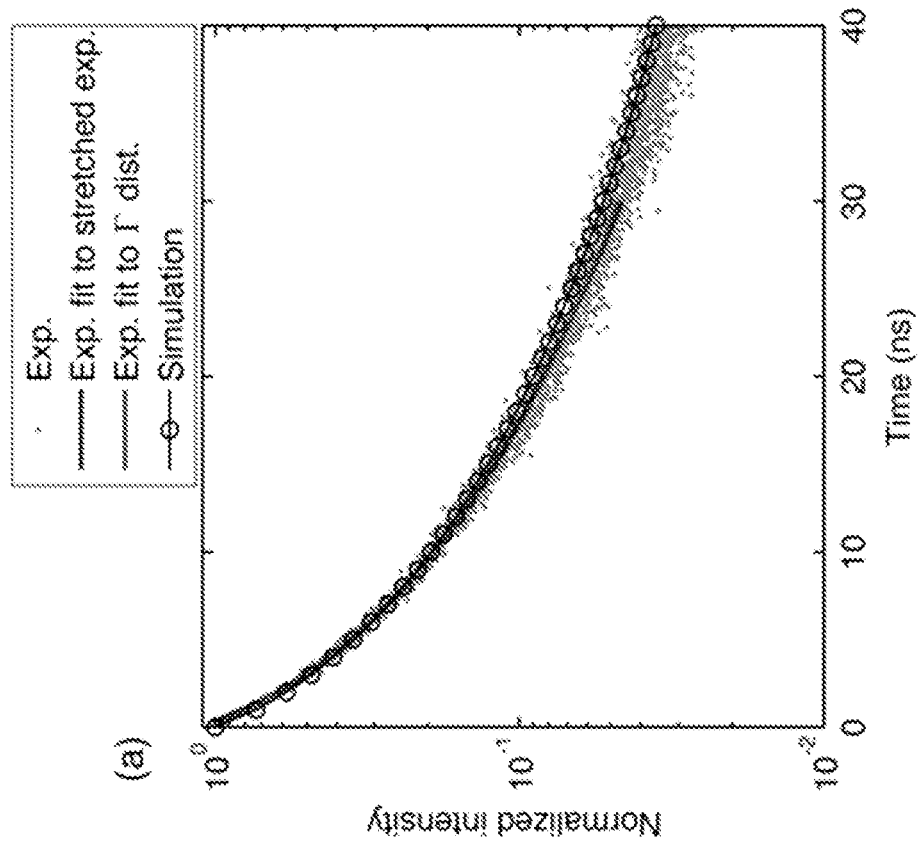
FIG. 8B
FIG. 8A

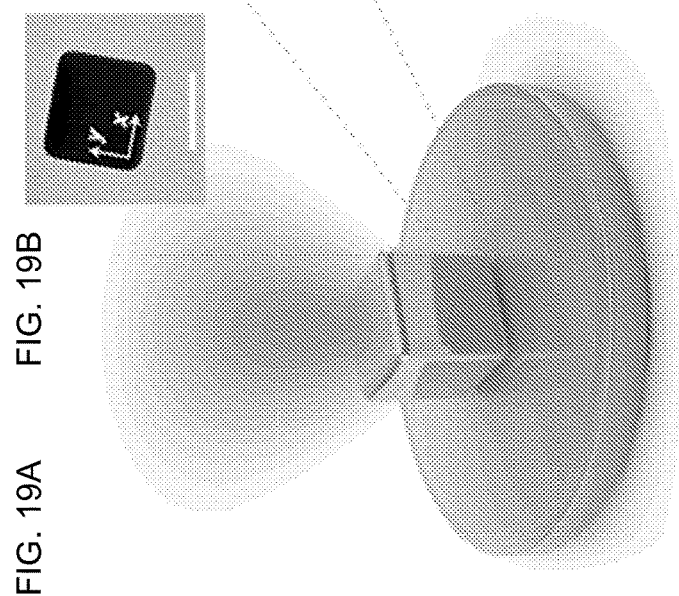
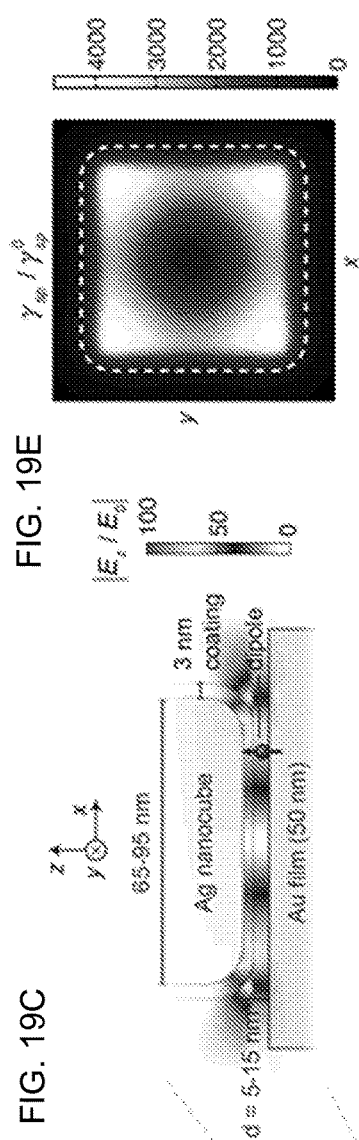
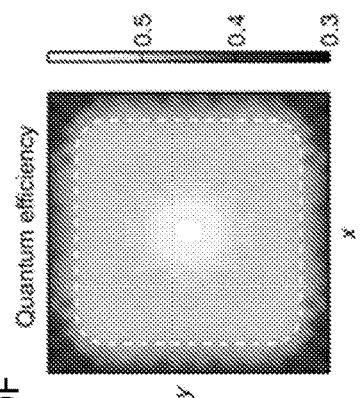
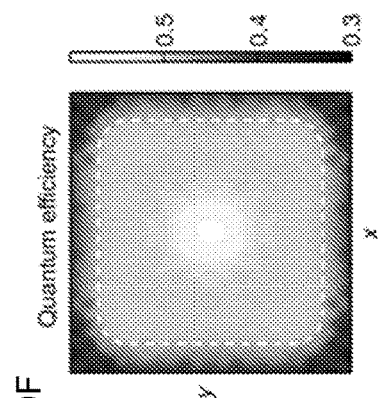
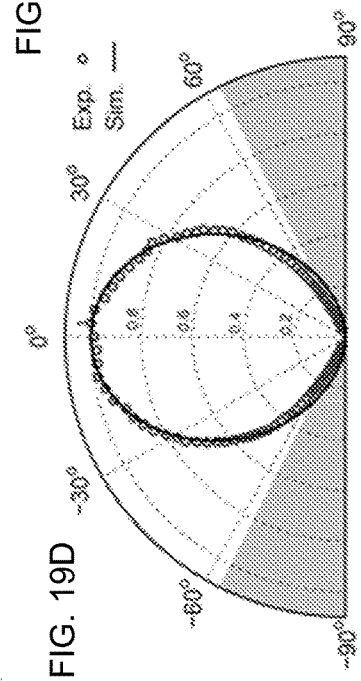
FIG. 19A  FIG. 19B
FIG. 19C
FIG. 19D
FIG. 19E
FIG. 19F

FIG. 20B

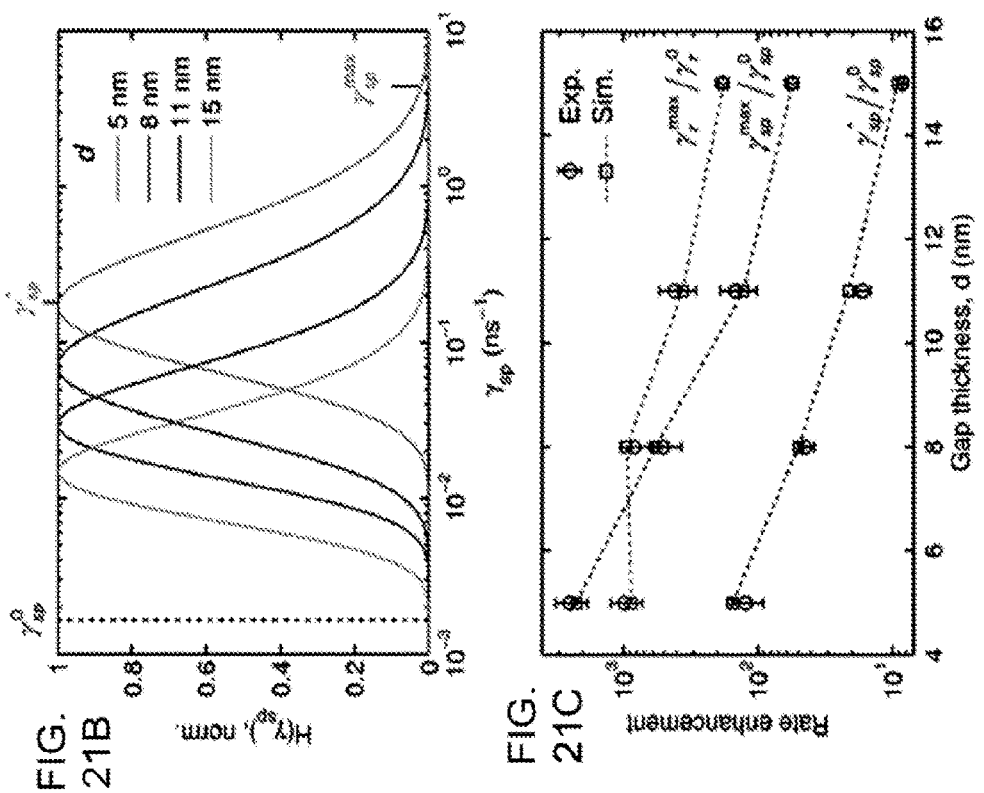
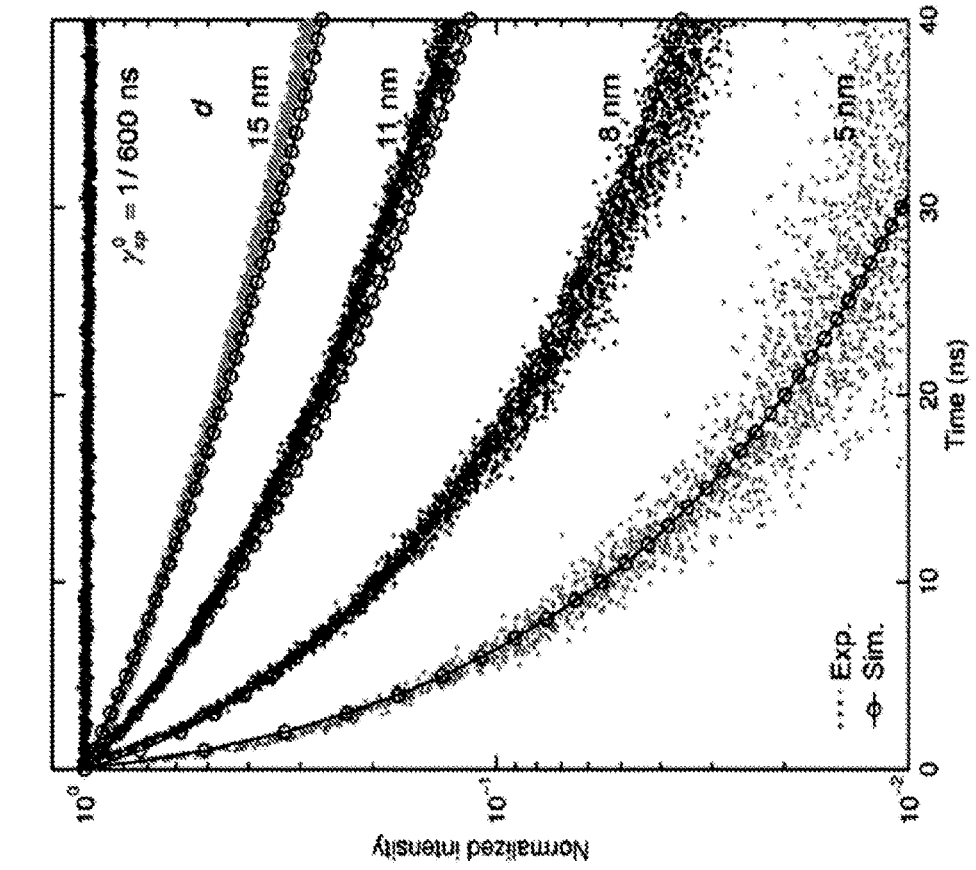
FIG. 21A
FIG. 21B
FIG. 21C

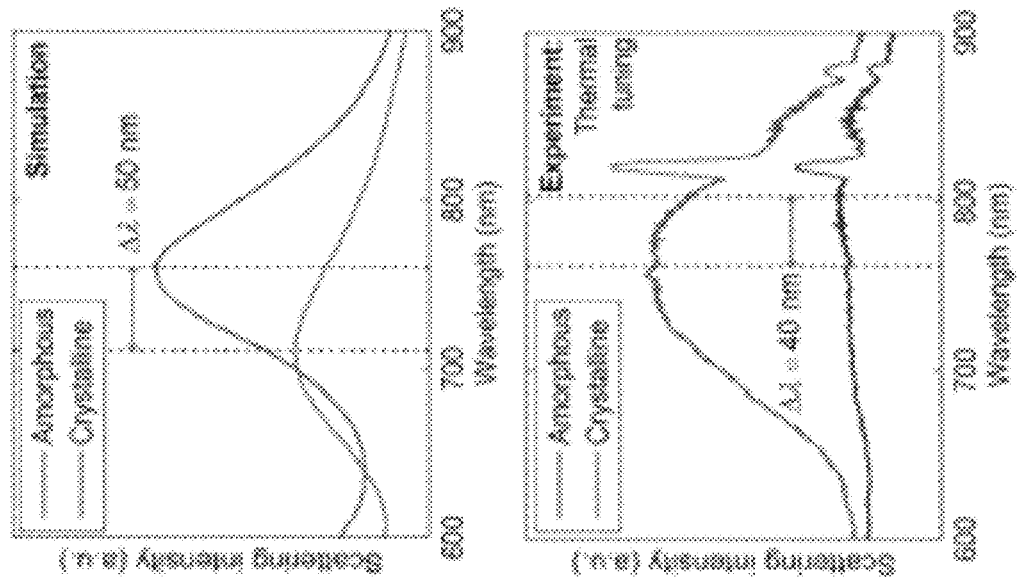
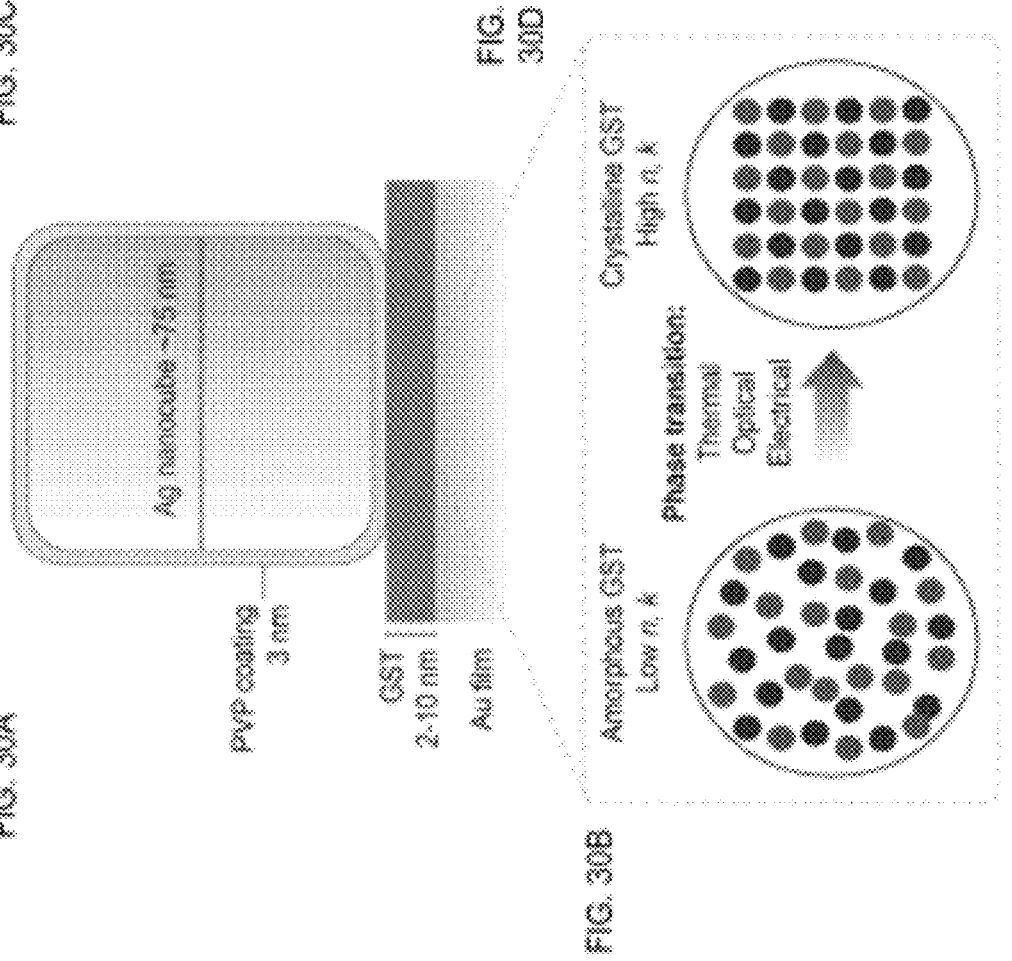
FIG. 30A
FIG. 30B
FIG. 30C
FIG. 30D

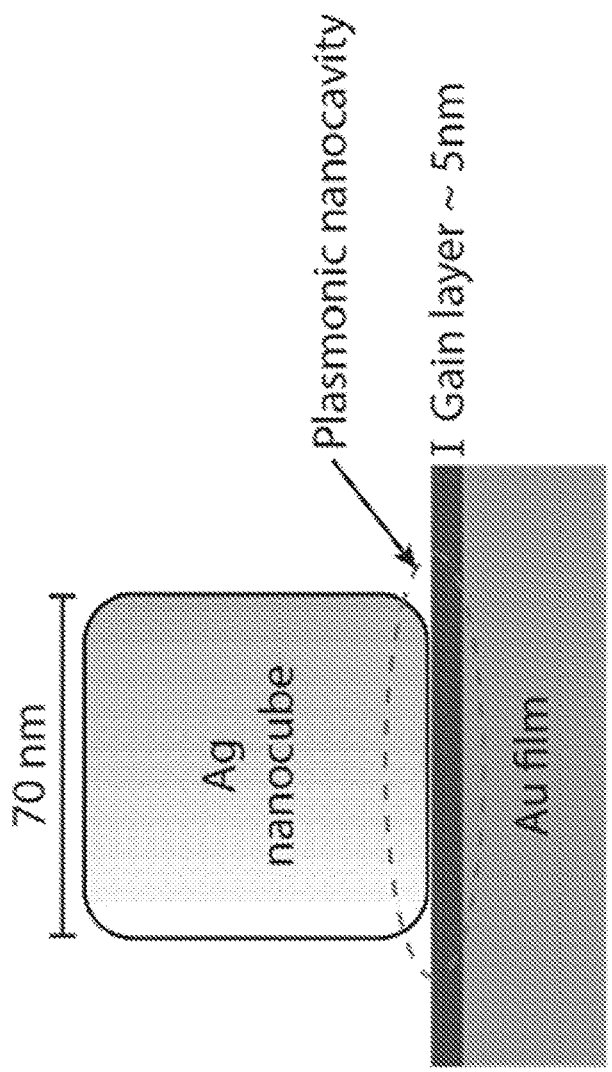
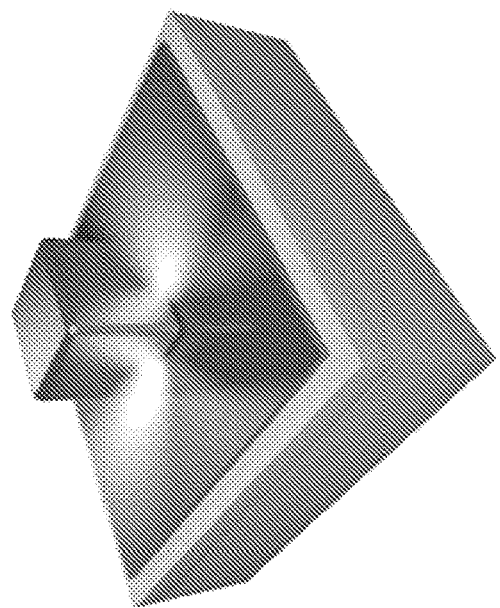
FIG. 33B
FIG. 33A

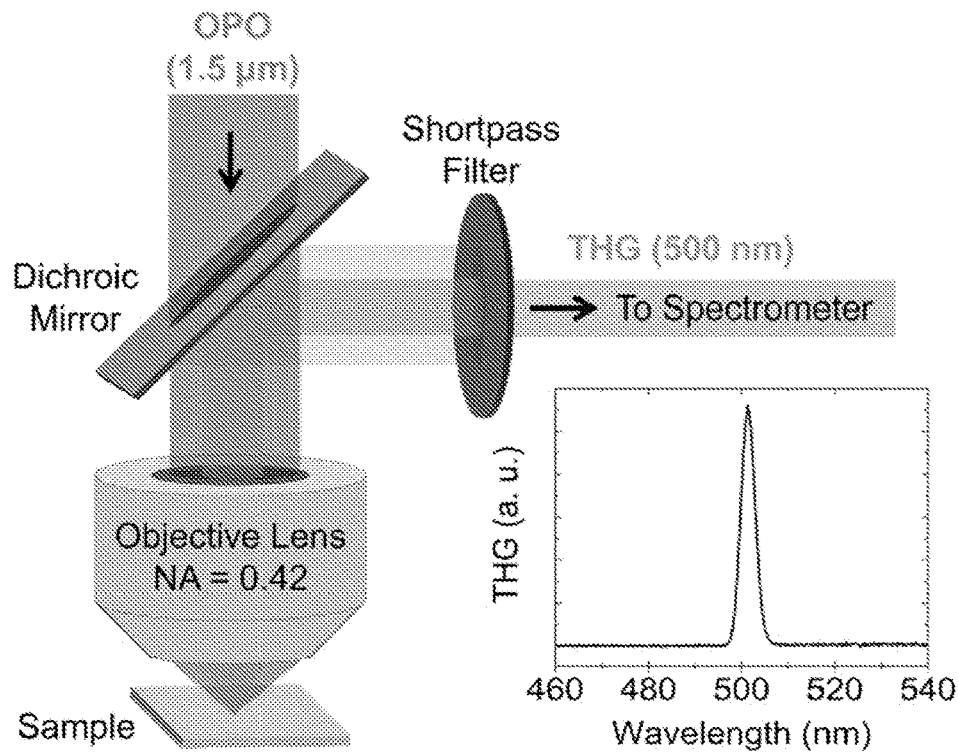
FIG. 39
FIG. 40A
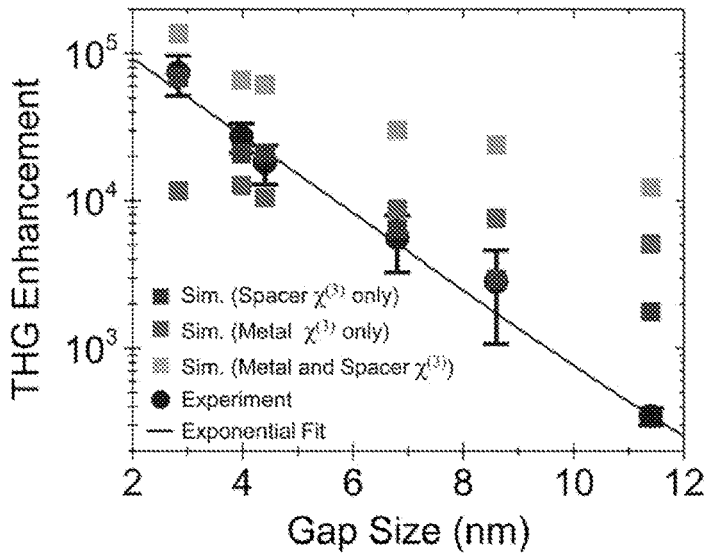
FIG. 40B    FIG. 40C
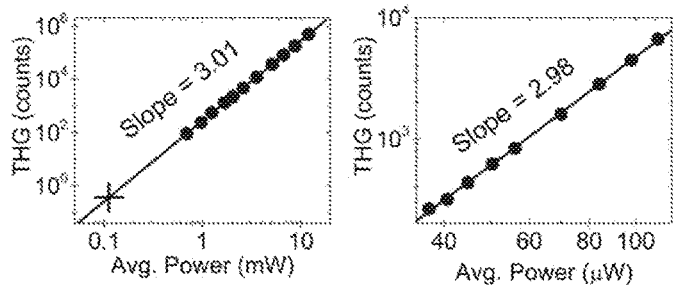

NANOPATCH ANTENNAS AND RELATED METHODS FOR TAILORING THE PROPERTIES OF OPTICAL MATERIALS AND METASURFACES

CROSS REFERENCE TO RELATED APPLICATIONS

This is a 371 national stage patent application, which claims priority to PCT International Patent Application No. PCT/US2015/055033, filed Oct. 10, 2015, and titled NANOPATCH ANTENNAS AND RELATED METHODS FOR TAILORING THE PROPERTIES OF OPTICAL MATERIALS AND METASURFACES, which claims the benefit of U.S. Provisional Patent Application No. 62/062,235, filed Oct. 10, 2014 and titled SYSTEMS AND METHODS FOR SPONTANEOUS EMISSION RATE ENHANCEMENT USING NANOSCALE PLASMONIC PATCH ANTENNAS, and U.S. Provisional Patent Application No. 62/102,787, filed Jan. 13, 2015 and titled SYSTEMS AND METHODS FOR TAILORING OF RADIATIVE AND NONRADIATIVE PROCESSES USING NANOSCALE PLASMONIC PATCH ANTENNAS; the disclosures of which are incorporated herein by reference in their entireties.

FEDERALLY SPONSORED RESEARCH OR DEVELOPMENT

This invention was made with government support under Federal Grant No. FA9550-12-1-0491 awarded by Air Force Office of Scientific Research (AFOSR). The Government has certain rights to this invention.

TECHNICAL FIELD

The present subject matter relates to nanopatch antennas control of optical processes.

BACKGROUND

Spontaneous emission is the process of photon emission by a quantum system as it transitions from an excited state to a ground state. The excited state lifetime is determined by the spatial overlap between the excited and ground state wavefunctions, and photonic density of states that is seen by the emitter. In quantum systems used as sources of spontaneous emission—such as molecules, quantum dots and semiconductor quantum wells—this lifetime is typically on the scale of 1-10 ns, corresponding to rates of 100-1,000 MHz. This relatively slow rate of spontaneous emission is limited both by the small physical size of the emitters and the low photonic density of states of free space. For photonic devices that are based on light emission, these long radiative lifetimes are a hindrance to high-speed devices.

A spontaneous emission source of particular interest for device applications is semiconductor quantum dots (QDs). These emitters combine a tunable emission wavelength at room temperature, high radiative quantum efficiency, excellent photostability, and ease of integration with other materials. For example, colloidal QDs have been demonstrated as stable, room-temperature single-photon sources, but the slow radiative rate associated with these systems limits the attainable repetition rate. Likewise, light emitting diodes are not used in telecommunications, in part due to the long spontaneous emission lifetimes. QDs are also promising as gain media for micro- and nanoscale lasers, but achieving a low lasing threshold has proven challenging due to non-radiative Auger recombination outcompeting the slow intrinsic radiative lifetime of ~20 ns.

To increase the rate of spontaneous emission of QDs, a range of approaches have been developed to engineer the photonic environment of the emitter and increase the photonic density of states. The figure of merit that characterizes the enhancement in the spontaneous emission rate is the Purcell factor, $F_P = \gamma_{sp}/\gamma_{sp}^0$, where $\gamma_{sp}^0$ is the intrinsic spontaneous emission rate and $\gamma_{sp}$ is the enhanced rate. Dielectric cavities coupled to epitaxial QDs were first used for Purcell enhancement and improved emission directionality. However, obtaining large Purcell factors, $F_P$ (~Q/V), in dielectric cavities demands high quality (Q) factors and small mode volumes (V). Earlier work has shown that significant fabrication effort is required to position a single QD at the maximum field of the cavity and to spectrally tune the QD emission to match the cavity mode. Despite advanced techniques to fabricate and tune high-Q cavities, including micropillar cavities, microtoroid resonators, and photonic crystal cavities, experimental values of the Purcell factor in dielectric optical cavities are presently limited to ~75. Additionally, these typically narrow band systems often require low temperatures and are not well suited for tailoring the broadband emission from room temperature emitters. However, room-temperature modulation of an LED based on a photonic crystal cavity has shown modulation rates of up to 10 GHz.

Plasmonic nanocavities, such as bowties, dimers, and film-coupled nanoparticles, have attracted interest in recent years because they offer large field enhancements, broad resonances (typical Q factors ~10-30), room-temperature operation and, in some cases, can be easily fabricated via colloidal synthesis. Plasmonic nanocavities support strong field enhancements and a strongly modified photonic density-of-states, thus providing a flexible means of controlling the spontaneous emission rate of quantum emitters and other light-matter interactions at the nanoscale. Typical drawbacks of plasmonics include losses due to non-radiative decay in the metals and limited control over the directionality of emission. Various plasmonic structures have been utilized to enhance the emission of QDs, but so far only limited Purcell factors of less than 145 have been demonstrated. Higher Purcell factors of up to 1,000 have been obtained for molecules, but such large enhancements of QDs have so far proven elusive. Furthermore, in plasmonic structures the Purcell enhancements are typically accompanied by low radiative efficiency due to significant non-radiative losses, or have low directionality of emission. For example, hybrid QD and Au nanoparticle structures assembled by atomic force microscopy nanomanipulation have shown Purcell factors up to 145 but radiative decay rate enhancements of only ~8. One-dimensional metamaterials with a hyperbolic dispersion have also been used to achieve control of spontaneous emission, but the Purcell factors have been limited to ~10.

SUMMARY

Disclosed herein are nanopatch antennas and related methods for control of optical processes such as spontaneous emission, absorption, nonlinear generation. According to an aspect, an apparatus includes a conductive material defining a substantially planar surface. The apparatus also includes a conductive nanostructure defining a substantially planar surface. The conductive material and the conductive nanostructure are positioned such that the planar surface of the conductive material faces the planar surface of the conductive nanostructure, such that the planar surfaces are substantially parallel, and such that the planar surfaces are spaced by a selected distance. The apparatus also includes an active material positioned between the planar surfaces.

According to another aspect, the conductive material defines a ground plane. Further, the planar surface of the conductive nanostructure, the planar surface of the ground plane, and lateral edges of the conductive nanostructure can be configured to confine multiple optical modes.

According to another aspect, the method includes exciting the optical modes by one of optically, electrically, or thermally, either externally or from within a space between the planar surfaces of the conductive nanostructure and the conductive material.

According to another aspect, the optical modes have electric and magnetic fields which are enhanced relative to the fields in free space or in a homogeneous material.

According to another aspect, the optical modes include a lowest energy (fundamental) mode having a dipolar and antisymmetric spatial profile and an effective magnetic dipole.

According to another aspect, the wavelength of the optical modes is one of in the visible, near infrared, and mid infrared spectral regions, determined by the size of the nanostructure and the thickness of a space between the planar surfaces of the conductive nanostructure and the conductive material.

According to another aspect, radiation of one of the optical modes into free space occurs at about the same rate as decay of the mode into excited electrons in the conductive material.

According to another aspect, the active material comprises optically emissive material. Further, the conductive material and the conductive nanostructure form a nanopatch antenna. Also, the optically emissive materials experience an enhanced spontaneous emission rate due to the presence of the nanopatch antenna.

According to another aspect, the conductive material comprises one of gold, silver, aluminum, and plasmonic material.

According to another aspect, a method further includes depositing a layer of one of a dielectric material and an optically active material on the planar surface of the conductive material.

According to another aspect, the optically-active material comprises a luminescent material.

According to another aspect, the luminescent material includes one of quantum dots, organic dyes, quantum wells, crystal color centers.

According to another aspect, the method further includes depositing the luminescent material on the planar surface of the conductive material.

According to another aspect, the luminescent material includes quantum dots having diameters between about 3-10 nanometers.

According to another aspect, the luminescent material include quantum dots made of a compound semiconducting material.

According to another aspect, the luminescent material is deposited by one of spin coating, dip coating, electrophoresis, and Langmuir-Blodgett deposition, or by direct chemical or physical vapor deposition.

According to another aspect, the conductive nanostructure comprises a nanocube.

According to another aspect, the nanocube is made of silver.

According to another aspect, the nanocube is a colloidally synthesized silver nanocube.

According to another aspect, the nanocube has a diameter between about 50-150 nm.

According to another aspect, the method further includes electrostatically adhering the conductive nanostructure to the optically-active material.

According to another aspect, the conductive nanostructure is substantially covered with a layer of polyvinyl pyrrolidone (PVP).

According to another aspect, the layer of PVP is about 3 nanometers thick.

According to another aspect, the method includes positioning a dielectric material between the planar surfaces.

According to another aspect, the planar surface of the conductive nanostructure is about 40-1000 nanometers in width.

According to another aspect, a width of the planar surface of the conductive nanostructure is a selected width for controlling the resonance wavelength of the nanostructure.

According to another aspect, the optically-active material comprises one or more of semiconductor material, quantum dots, luminescent material, and electrically tunable material.

According to another aspect, a selected distance between planar surfaces is about 1-20 nanometers.

According to another aspect, a spacer material is positioned between the planar surfaces for spacing the planar surfaces at the selected distance.

According to another aspect, the planar surfaces are spaced at the selected distance for controlling at least one of an electric field enhancement and resonance wavelength of the active material.

According to another aspect, the conductive nanostructure, the conductive material and the active material form a nanopatch antenna. Further, the method further includes providing a plurality of nanopatch antennas.

According to another aspect, the method includes fabricating the nanopatch antennas in random or periodic arrays with subwavelength spacing on a surface to form a metasurface.

According to another aspect, the method includes spatially patterning the metasurface on the micro-scale using one of photolithographic and lift-off techniques.

According to another aspect, the conductive material is a ground plan. Further, a spacer material is positioned between the conductive nanostructure and the conductive material to thereby provide a semiconductor forming a Schottky barrier with the ground plane and the conductive nanostructure.

According to another aspect, a spacer material is positioned between the conductive nanostructure and the conductive material, and wherein the spacer material has a resisitivity dependent upon temperature.

According to another aspect, a spacer material is positioned between the conductive nanostructure and the conductive material. The spacer material becomes more or less conductive upon optical excitation of the nanopatch antenna.

According to another aspect, the active material comprises a luminescent material including one of a single quantum dot, a single dye molecule, or other single quantum system that can emit only one photon at any given time.

According to another aspect, the active material comprises a luminescent material that is a layered material including monolayers of two-dimensional materials.

According to another aspect, the layered material includes one of graphene, boron nitride, and transition metal dichalcogenides.

According to another aspect, the active material comprises a luminescent material. The method further comprises electrically exciting the luminescent material by injecting electrons and holes into the luminescent material.

According to another aspect, the active material comprises a luminescent material. The method further comprises electrically or optically exciting the luminescent material until optical amplification occurs in the nanopatch antenna.

According to another aspect, the method further comprises providing a spacer material between the conductive nanostructure and the conductive material, wherein the spacer material has nonlinear optical response that is enhanced by the presence of the nanopatch antenna.

According to another aspect, the method includes providing a spacer material between the conductive nanostructure and the conductive material. The spacer material is responsive to heat or chemicals for changing the resonance of the nanopatch antenna.

According to another aspect, the method includes providing a spacer material between the conductive nanostructure and the conductive material. The spacer material changes the optical refractive index upon application of a voltage.

BRIEF DESCRIPTION OF THE DRAWINGS

The foregoing aspects and other features of the present subject matter are explained in the following description, taken in connection with the accompanying drawings, wherein:

FIG. 1A is a perspective view of a nanopatch antenna in accordance with embodiments of the present disclosure;

FIG. 1B is a partial side view of the nanopatch antenna shown in FIG. 1A;

FIG. 1C is a TEM image of an example silver nanocube and QDs on a metal film;

FIG. 1D is a simulated spatial map of spontaneous emission rate enhancement (Purcell factor);

FIG. 1E is a simulated spatial map of radiative quantum efficiency for a vertically oriented QD dipole situated in the gap between the nanocube and the gold film;

FIG. 2A is a dark scattering image showing individual nanopatch antennas as bright spots with different intensities because of different scattering amplitudes and resonant wavelengths (scale bar is 5 μm);

FIG. 2B is a fluorescence image of the same location shown in FIG. 2A when illuminated by a defocused 514 nm cw laser;

FIG. 2C illustrates measured and simulated scattering spectrum of a single NPA with a polymer filled gap and no QDs, in normalized units;

FIG. 2D illustrates measured scattering spectrum of a single NPA containing QDs in the gap region;

FIG. 4A is a graph showing normalized time-resolved fluorescence of QDs on a glass slide compared with QDs on an Au film and coupled to a single NPA;

FIG. 4B is a graph showing a scatter plot of fluorescence decay times for ~30 NPAs showing the relative intensity contributions of the fast and slow decay components;

FIG. 4C is a histogram showing the decay time distribution of the fast and slow components of the ~30 individually measured NPAs;

FIG. 8A illustrates a graph showing time-resolved fluorescence decay from a single NPA with an 8 nm gap and fits to two types of functions: (i) a stretched exponential and (ii) a Γ distribution, along with the simulation results;

FIG. 8B illustrates a graph showing distribution of rate constants obtained from fits to a stretched exponential and a Γ distribution (the rate distribution from the simulation results is also shown);

FIG. 19A is a schematic of an silver nanocube situated on a gold film separated by a 5-15 nm spacer layer containing a fluorescent material in accordance with embodiments of the present disclosure;

FIG. 19B is a transmission electron micrograph of single silver nanocube (the scale bar is 50 nm);

FIG. 19C is a schematic cross-section of an example film-coupled silver nanocube showing the simulated fundamental plasmonic gap mode with maximum field enhancement of ~100 in accordance with embodiments of the present disclosure;

FIG. 19D depicts simulated (black line) and measured (circles) radiation pattern from a single NPA, showing that most emission (84%) falls within the numerical aperture of the objective lens (NA=0.9) (gray regions represent angular regions that are not collected);

FIGS. 19E and 19F depict maps of the enhancement of the spontaneous emission rate and of the quantum efficiency relative to a dipole in free space as a function of position under the nanocube;

FIG. 20B shows a cross-section of an example experimental structure including Ru dye intercalated into a polymer film and situated between a gold film and a silver nanocube (the arrows indicate the typical directions of the transition dipole moments);

FIG. 21A is a graph showing measured and simulated time-resolved Ru dye emission for four gap thicknesses d, with intensities normalized to t=0 (The decay is non-exponential for all gap thicknesses which reflects the distribution of emission rates present for each nanocube. Each experimental curve is a measurement of a representative nanocube with the given gap thickness);

FIG. 21B is a graph showing distribution of measured emission rates $H(\gamma_{sp})$ for each gap thickness as obtained from a stretched exponential fit followed by a Laplace transform. (Rate distributions obtained from simulations are shown in FIG. 7. The maximum spontaneous emission rate $\gamma_{sp}^{max}$ is given by the slope of the time-resolved decay near t=0. The most likely emission rate $\gamma^*_{sp}$ is given by the mode of the rate distribution.)

FIG. 21C is a graph showing three measures of rate enhancement as function of gap thickness, both from experiment and from simulations (i) enhancement of the most likely emission rate $\gamma^*_{sp}/\gamma_{sp}^0$; (ii) enhancement of the maximum spontaneous emission rate $\gamma_{sp}^{max}/\gamma_{sp}^0$ (Purcell enhancement); and (iii) enhancement of the radiative rate given by $\gamma_r^{max}/\gamma_r^0=\gamma_{sp}^{max}QE/\gamma_{sp}^0 QE_0$, where QE is obtained from simulations;

FIG. 30A is a side cross-sectional view of a single nanopatch antenna with a tunable phase-change material embedded in the gap region, in accordance with embodiments of the present disclosure;

FIG. 30B is a schematic of the atomic structure of the chalcogenide phase-change material that is embedded in the gap region;

FIG. 30C is a graph of the simulated scattering resonance of the nanopatch antenna with the gap material in the amorphous and crystalline phases;

FIG. 30D is a graph of experimental scattering resonance of the nanopatch antenna with the gap material in the amorphous and crystalline phases;

FIG. 33A is a perspective view of a nanopatch antenna which is undergoing lasing action in accordance with embodiments of the present disclosure;

FIG. 33B is a side view of the nanopatch antenna shown in FIG. 33A, embedded with a lasing gain medium in the gap region;

FIG. 39 illustrates a schematic diagram of an experimental setup for measurement of third harmonic generation (THG);

FIG. 40A illustrates a graph showing a third harmonic generation enhancement (as compared to a bare gold film) vs gap size (g);

FIG. 40B illustrates a graph showing power dependence of the THG signal from a bare 30 nm gold film; and FIG. 40C illustrates a graph showing power dependence of the THG signal from a stripe pattern on the g=4.2 nm sample.

DETAILED DESCRIPTION

Figure 3A:
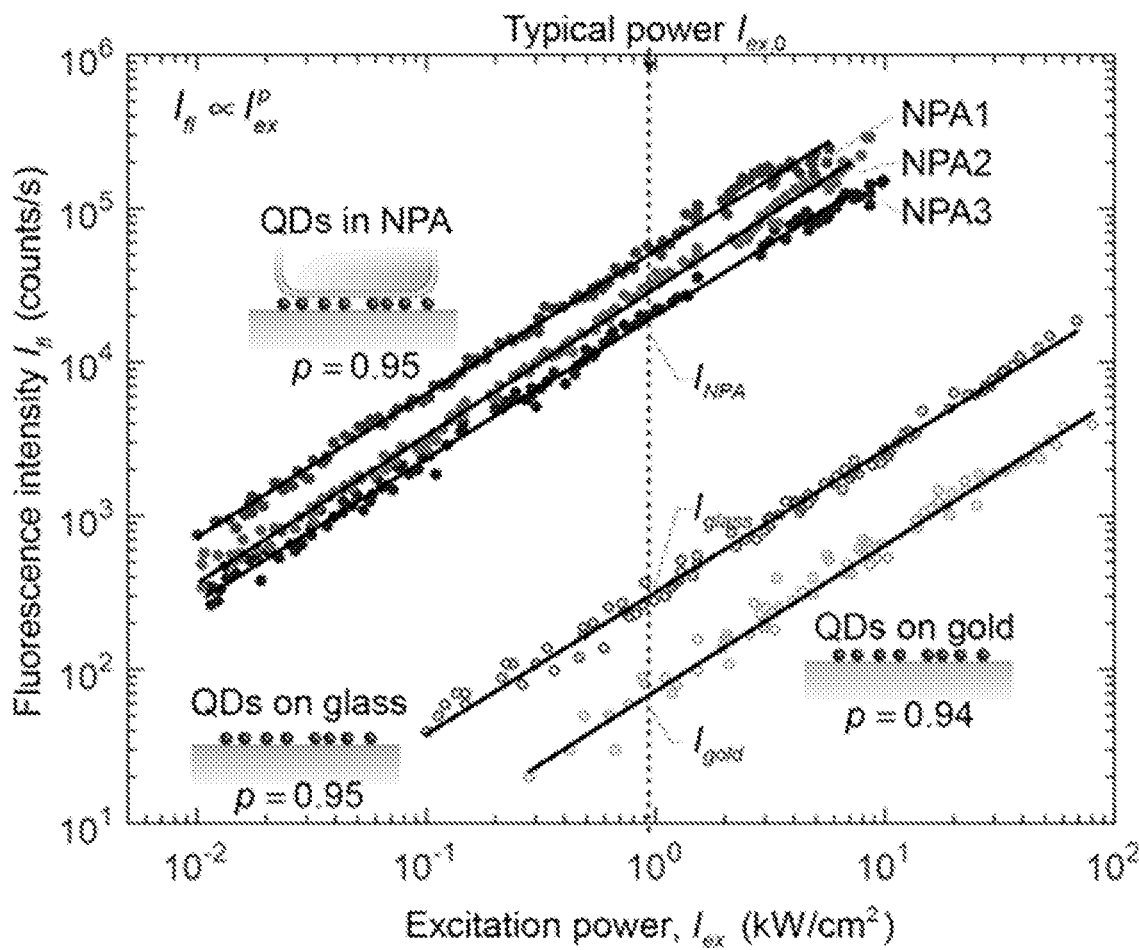
FIG. 3A is a graph that shows the dependence of the QD fluorescence intensity on the laser excitation power for three samples.

For the purposes of promoting an understanding of the principles of the present disclosure, reference will now be made to various embodiments and specific language will be used to describe the same. It will nevertheless be understood that no limitation of the scope of the disclosure is thereby intended, such alteration and further modifications of the disclosure as illustrated herein, being contemplated as would normally occur to one skilled in the art to which the disclosure relates.

Articles "a" and "an" are used herein to refer to one or to more than one (i.e. at least one) of the grammatical object of the article. By way of example, "an element" means at least one element and can include more than one element.

In this disclosure, "comprises," "comprising," "containing" and "having" and the like can have the meaning ascribed to them in U.S. Patent law and can mean "includes," "including," and the like; "consisting essentially of" or "consists essentially" likewise has the meaning ascribed in U.S. Patent law and the term is open-ended, allowing for the presence of more than that which is recited so long as basic or novel characteristics of that which is recited is not changed by the presence of more than that Which is recited, but excludes prior art embodiments.

Ranges provided herein are understood to be shorthand for all of the values within the range. For example, a range of 1 to 50 is understood to include any number, combination of numbers, or sub-range from the group consisting 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50.

Unless specifically stated or obvious from context, as used herein, the term "about" is understood as within a range of normal tolerance in the art, for example within 2 standard deviations of the mean. The term "about" can be understood as within 10%, 9%, 8%, 7%, 6%, 5%, 4%, 3%, 2%, 1%, 0.5%, 0.1%, 0.05%, or 0.01% of the stated value. Unless otherwise clear from context, all numerical values provided herein are modified by the term "about."

Unless otherwise defined, all technical terms used herein have the same meaning as commonly understood by one of ordinary skill in the art to which this disclosure belongs.

As referred to herein, the term "substrate" refers to a metallic solid material or medium to which another material is applied and to which the other material attaches. In an example, the substrate can be made of a suitable metal such as, but not limited to, gold, silver, or aluminum. The substrate may include different materials. For example, the substrate may be a gold film having a thin stack (1-20 nm) of alternating layers of poly(allylamine) hydrochloride (PAH) and polystyrene sulfonate (PSS) on a surface thereof. Any other suitable dielectric or active materials may be deposited on the metal film to form a spacer between the metal film and the nanocube.

As referred to herein, the term "quantum dot" refers to a nanocrystal made of semiconductor material that can exhibit quantum mechanical properties. As an example, quantum dots can be made of compound semiconductors such as, but not limited to, CdSe, CdS, PbS, PbSe, ZnS, and ZnSe.

As referred to herein, the term "plasmonic nanoparticle" refers to a particle whose electron density can couple with electromagnetic radiation of wavelengths that are larger than the particle due to the nature of the dielectric-metal interface between the medium and the particles. The metallic nanoparticle can feature a planar facet that can couple to the underlying metal film. A colloidally synthesized silver nanocube is an example of such a particle.

As referred to herein, the term "nanostructure" refers to a faced nanoparticle such as a nanocube electromagnetically coupled to a metal ground plane, separated by a spacer material. This nanostructure is also referred to as a nanopatch antenna, a patch antenna, a nanocavity, and a cavity As referred to herein, the term "spacer" can refer to the material between the plasmonic nanoparticle and the metal film. This material can also be referred to as the gap, the gap material, and the nanogap.

In accordance with embodiments of the present disclosure, plasmonic nanopatch antennas (NPAs) are disclosed that demonstrate an ultrafast and efficient source of spontaneous emission with a lifetime shorter than 11 ps, limited by the detector resolution, corresponding to an emission rate faster than 90 GHz. The ultrafast emission is achieved by integrating colloidal and photostable semiconductor QDs into the plasmonic structure. Nanometer precision control of the antenna dimensions and a quantitative understanding of the emission rates enables Purcell factors of up to $F_p$=880, while maintaining a high radiative efficiency and directional emission.

In accordance with embodiments of the present disclosure, a nanopatch antenna (NPA) system or other system as described herein may include a nanostructure defining a substantially planar surface and a conductive nanostructure defining a substantially planar surface. The conductive material and the conductive nanostructure may be positioned such that the planar surface of the conductive material faces the planar surface of the conductive nanostructure, such that the planar surfaces are substantially parallel, and such that the planar surfaces are spaced by a selected distance. Further, an optically-active material may be positioned between the planar surfaces of the conductive material and the conductive nanostructure.

As an example, FIG. 1A illustrates a perspective view of an nanopatch antenna 100 in accordance with embodiments of the present disclosure. FIG. 1B illustrates a partial side view of the nanopatch antenna 100 shown in FIG. 1A. Referring to FIGS. 1A and 1B, the nanopatch antenna 100 includes a silver nanocube 102 coupled to a metal film 104. As shown, the nanocube 102 may be any other suitable nanostructure having at least one substantially planar side that faces the metal film 104. For example, alternative to a nanocube, a disk-shaped nanostructure may be used and oriented such that one of its flat sides faces the metal film 104. In this example, the metal film 104 is made of gold, although it should be appreciated that any other suitable metal may be used, such as, but not limited to, silver and aluminum. Alternative to the metal film 104, any other suitable conductive material having a substantially planar surface and a high free electron density facing the nanocube 102 may be used. The fundamental plasmonic mode is a Fabry-Perot resonance resulting from multiple reflections of the waveguide mode beneath the nanocube 102 that propagate within the gap region. The dominant field is normal to the gap with the maximum field enhancement occurring at the nanocube edges and corners.

It is noted that although only one nanocube 102 is shown in FIGS. 1A and 1B, it should be appreciated that multiple nanocube may be likewise positioned and spaced with respect to the metal film 104. More particularly, the nanocubes may be spaced from each other along the same or substantially same plane. Each nanocube may have a flat surface facing the metal film 104.

With continued reference to FIG. 1A, a simulated directional radiation pattern from the antenna is depicted by reference numeral 106. Quantum dots (QDs) 108 are dispersed along the top surface of the metal film 104 as shown. Some of the QDs 108 are positioned in the space between the nanocube 102 and metal film 104.

FIG. 1C is a TEM image of an example silver nanocube and QDs on a metal film. The scale bar is 50 nm.

This unique plasmonic mode provided by embodiments of the presently disclosed subject matter has three important, example advantages. In one example, the resonance wavelength can be tuned by adjusting the nanocube size or the nanogap thickness (i.e., distance between the nanocube 102 and the metal film 104) while maintaining large field enhancements of up to 200-fold as an example. For example, the width or surface area of a substantially planar surface of the nanocube 102 can be selected for controlling a resonance wavelength of the QDs 108. Also, for example, the distance between the bottom surface of the nanocube 102 and the metal film 104 can be selected for controlling an electric field enhancement and resonance wavelength of the QDs 108. Using full-wave simulations, it is expected that these field enhancements translate into large Purcell factors, $\gamma_{sp}/\gamma_{sp}^0$, of up to 4,000 for emitters embedded in the gap region (see e.g., FIG. 1D). The largest enhancements occur for emitters located near the corners of the nanocube and with transition dipoles oriented vertically (along the z-axis), in the direction of the electric fields associated with the fundamental plasmon mode. It is also noted that even with small plasmonic gaps (<10 nm) and large field enhancements, the radiative efficiencies of the emitters coupled to the plasmon mode remain high (~50%) (see e.g., FIG. 1E). Further, it is noted that the NPAs exhibit a highly directional radiation pattern (see e.g., FIG. 1A) with a collection efficiency of 84% using a 0.9 NA objective. FIG. 1A shows a simulated far-field radiation pattern 106, assuming that a dipole is pointing in the vertical direction and is located near the nanocube corner, where the largest field enhancement can be achieved.

Figure 25:
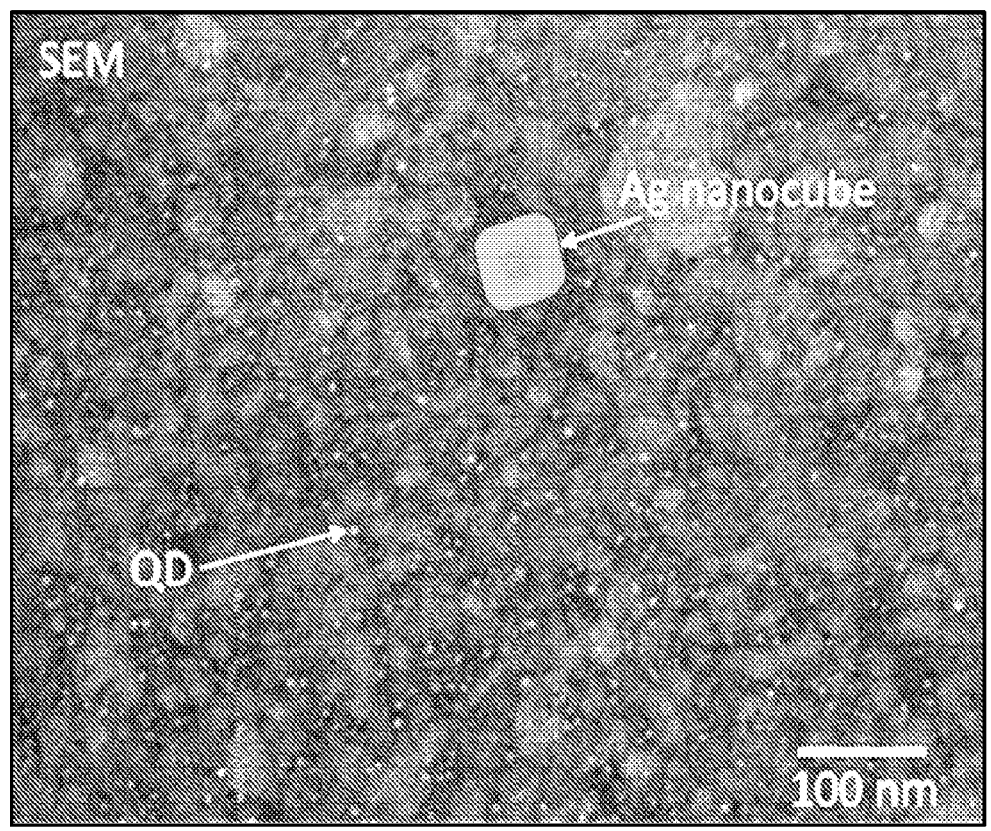
FIG. 25 is an SEM image of a sample containing a single nanocube and CdSe/ZnS QDs (light small dots), similar to the samples used for the optical experiments.
Figure 26:
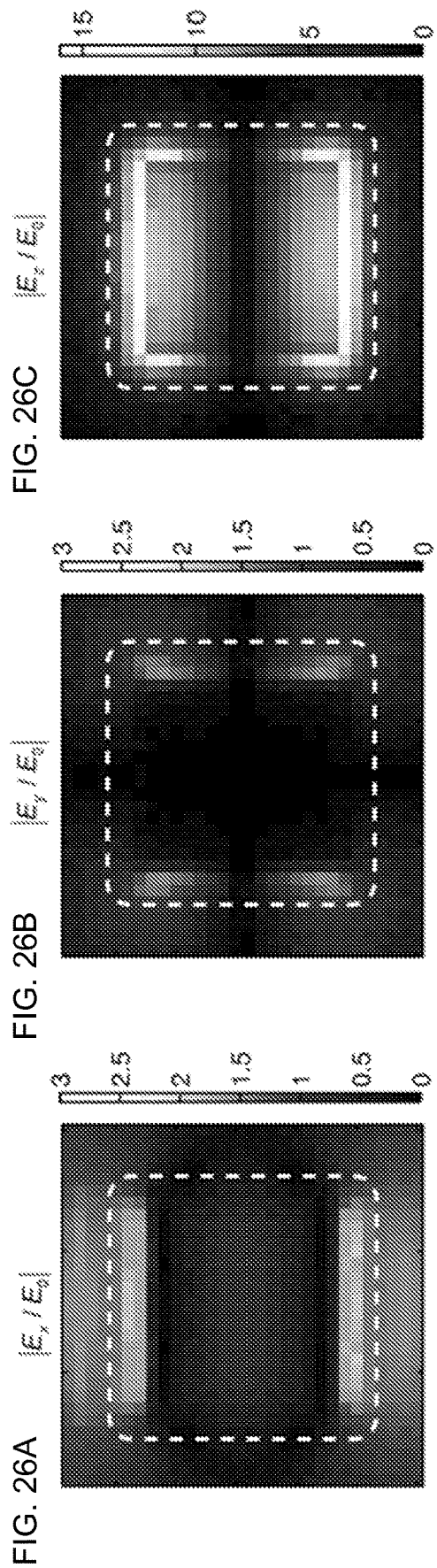
FIGS. 26A-26C depict field enhancement maps in the nanogap region for an excitation wavelength of 535 nm for the x, y, and z field components.

In accordance with embodiments, nanopatch antennas or other systems disclosed herein may be fabricated via the deposition of a sparse layer of colloidal QDs on top of a ~1 nm poly(allylamine) hydrochloride (PAH) layer on a gold (Au) film, followed by electrostatic adhesion of colloidally synthesized silver nanocubes. In an example, an average of about 10 QDs are located under each nanocube, as determined by transmission electron microscopy (TEM) of a similar sample prepared on a carbon film instead of an Au film (see e.g., FIG. 1C). Using a microscope, individual nanopatch antennas can be identified by dark field and fluorescence imaging (see FIGS. 2A and 2B), followed by spectroscopy (see FIGS. 2C and 2D) and time-resolved fluorescence measurements on the located nanoparticles (as disclosed herein). Referring to FIG. 2B, several NPAs, labelled 1, 2, and 3, are visible in the scattering and fluorescence images. Only NPAs resonant with the QD emission are visible in the fluorescence image. The scale bar is 5 µm. Due to the distribution of nanocube sizes, only a subset of NPAs is resonant with the QD fluorescence, as shown in FIG. 2B. In FIG. 2D, the measured fluorescence spectrum for QDs coupled to the NPA is also depicted by line 200 and shows good overlap with the scattering spectrum In the absence of QDs in the nanogap region, the scattering spectrum of a single NPA may be dominated by the lowest order fundamental mode with a single Lorentz peak as shown in the experiments (see FIG. 2C). Full-wave simulations show a similar resonance peak (see FIG. 2C) with the resonance wavelength determined by the nanocube size, and by the thickness and dielectric constant of the material in the gap region. When QDs are present in the nanogap, the scattering spectrum can be broadened (see FIG. 2D). Similar broadening, with some variation, is observed from the other measured NPAs (see FIG. 25). This mode broadening is attributed to an inhomogeneous dielectric environment in the cavity. The random spatial distribution of the QD positions results in a nonuniform dielectric constant in the nanogap and may also cause the nanocube to be tilted relative to the Au film. These geometrical effects can cause symmetry breaking between the TM and TE excitation modes, resulting in broadening of the scattering spectrum. Strong coupling can be ruled out as a mechanism for the mode splitting based on an estimate of the ensemble QD-nanocavity coupling energy (22 meV), which is found to be significantly smaller than the linewidth of the cavity resonance (150 meV). Furthermore, the mode splitting does not consistently occur around the energy of the QD emission peak, but instead varies between NPAs (FIG. 25). In addition, the emission spectrum of the QDs coupled to the NPA is unchanged relative to the intrinsic QD spectrum, confirming that the system is in the weak coupling regime (FIG. 26A).

To quantitatively estimate the enhancement in the fluorescence intensity of the QDs coupled to a single plasmonic NPA, a series of experiments were conducted on three different samples: (i) a sample containing QDs coupled to NPAs as described above; (ii) a sample with QDs adhered on top of a PAH layer on an Au film but without any nanocubes; and (iii) a sample with QDs adhered to a PAH layer on a glass slide. To ensure the same surface density of QDs, all samples are prepared with the same concentration of QDs in solution and had the same surface chemistry (PAH) prior to spin coating of the QDs. For excitation, a 535 nm Ti:sapphire laser was used with a pulse length of ~150 fs which is passed through a pulse picker to reduce the repetition rate from 80 to 40 MHz. The excitation laser is focused to a diffraction-limited spot, ~300 nm in diameter, and the QD fluorescence is collected in an epifluorescence configuration and measured by an avalanche photodiode (APD) (see Methods).

FIG. 3A illustrates a graph that shows the dependence of the QD fluorescence intensity on the laser excitation power for the three samples described above. Referring to FIG. 3A, the figure shows QD fluorescence intensity as a function of average incident laser power in three cases: on a glass slide, on an Au film and coupled to individual NPAs (NPAs 1-3). The solid lines are fits to a power law, with the power exponent, p, showing a nearly linear scaling. The vertical dashed line indicates the power at which subsequent measurements in this paper are performed under pulsed excitation. The fluorescence intensity from the QDs coupled to a single NPA is substantially higher than from the QDs on a PAH layer on a glass slide or an Au film. For QDs on a PAH layer on an Au film without any nanocubes, it was found that the fluorescence is quenched by ~70% compared with QDs on glass. This quenching can be attributed to short-range non-radiative energy transfer between the QDs and the Au film. The emission intensity from QDs coupled to a single NPA shows linear scaling with excitation power density in the range of 0.01 to 10 kW cm². At higher excitation power densities, permanent photobleaching of the QDs occurs before saturation of the excited state population can be reached. Some other measurements described herein are conducted at an excitation power density of $I_{ex,0}$=1 kW cm². For structures with a polymer gap layer and no QDs, it was found that the NPA scattering resonance was unmodified and stable for average excitation power densities with the femtosecond laser of up to 10 MW/cm².

Figure 3B:
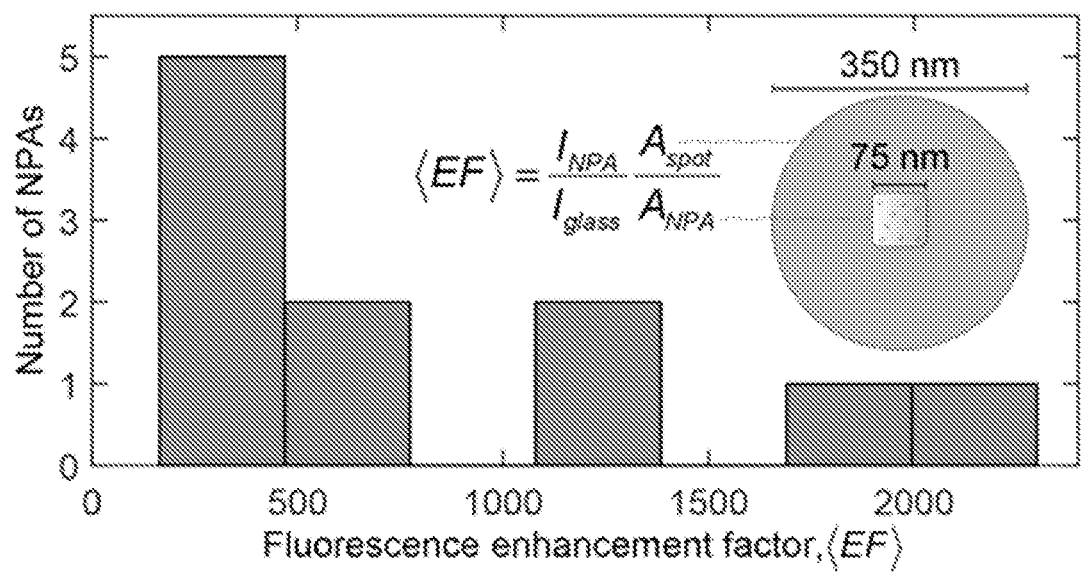
FIG. 3B is a histogram showing the distribution of the fluorescence enhancement factors of 11 measured NPAs.

The average enhancement in fluorescence intensity due to the NPA is given by the fluorescence enhancement factor $$\langle EF \rangle = \frac{I_{NPA}}{I_{glass}} \frac{A_{spot}}{A_{NPA}} \tag{1}$$

where $I_{NPA}$ and $I_{glass}$ are the fluorescence intensities measured in the far-field from a ~300 nm diameter laser spot exciting a single NPA and a glass slide with QDs, respectively. Both the intensities were corrected for background fluorescence around the nanocube and detector dark counts. The intensities are normalized by the area from which the fluorescence originates in each measurement, where $A_{spot}$ is the area of the excitation spot and $A_{NPA}$ is the area under a single nanocube. The relationship between the size of the nanocubes and resonance wavelength for a given gap thickness has been established previously. In addition, this was independently verified using scanning electron microscopy (SEM) that, for example, NPAs with a resonance of ~635 nm indeed correspond to a lateral nanocube size of 75 nm (FIG. 26B). Measurements of the fluorescence intensity from 11 individual NPAs show enhancement factors that vary from 177 to 2,300, with an average value of $\langle EF \rangle_{avg}$=831 (FIG. 3b). FIG. 3B illustrates a histogram showing the distribution of the fluorescence enhancement factors of the 11 measured NPAs. For these measurements, only NPAs with plasmon resonances around the QD emission wavelength (625-635 nm) were selected. The variation in $\langle EF \rangle$ can be attributed to two factors: (i) the random spatial distribution of QDs within the nanogap, with QDs near the nanocube edges experiencing higher excitation field enhancements, (see FIG. 1D) and (ii) the random orientation of each QD, with absorption dipoles oriented vertically having the largest coupling to the excitation field.

Figure 27:
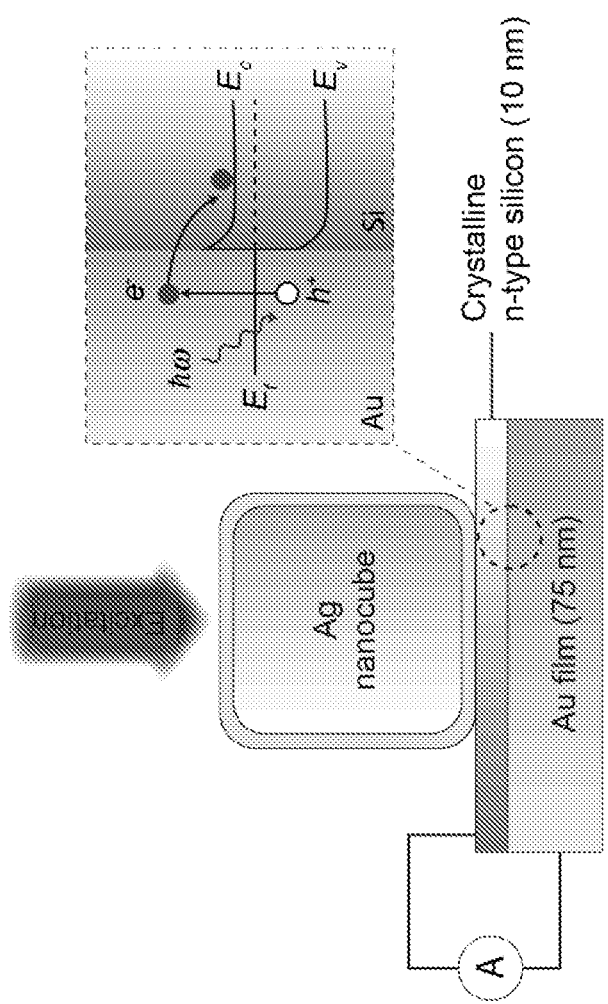
FIG. 27 depicts a schematic of a photodetector structure including an ultrathin silicon layer integrated into a nanogap of a nanopatch antenna in accordance with embodiments of the present disclosure.

Before investigating the emission rate enhancement, it is crucial to establish the origin of the total fluorescence enhancement and the radiative quantum efficiency of the QDs coupled to the NPA. The measured fluorescence enhancement is a combination of enhancements in the collection efficiency, the excitation rate and the radiative quantum efficiency that is averaged over the positions and orientations of the QDs in the nanogap:

$$\langle EF \rangle = \frac{1}{A_{NPA}} \int_{r,\theta} \frac{\eta}{\eta_0} \frac{\Gamma_{exc}(r,\theta)}{\theta_{exc}^0(\theta)} \frac{QE(r)}{QE^0} \sin\theta \, dr \, d\theta \tag{2}$$

where η, Γ, and QE are the emission collection efficiency, excitation rate and quantum efficiency in the NPA sample, respectively. Each of these values is normalized by the same quantity corresponding to the QDs on glass, which is denoted "0". The excitation rate $\Gamma_{exc}$ depends both on the location of the QD in the nanogap r and the dipole orientation θ. The excitation rate term is $$\frac{\Gamma_{exc}(r,\theta)}{\Gamma_{exc}^0(\theta)} = \frac{\frac{1}{2}[E_x^2(r) + E_y^2(r)]\sin^2\theta + E_z^2(r)\cos^2\theta}{E_0^2(r)\sin^2\theta} \tag{3}$$

where $E(r)_{x,y,z}$ are the electric field components in the x, y, and z directions at the excitation frequency (FIG. 27). The incident electric field for the control sample is assumed to be in-plane. Given a random distribution of QD orientations, integrating Eq. 3 over θ and r yields a value of the average excitation rate enhancement of $\langle \Gamma_{exc}/\Gamma_{exc}^0 \rangle$=30. Using the simulated far-field radiation pattern (see FIG. 1A), a collection efficiency was estimated from the NPA of η=84% using an objective with NA=0.9. Meanwhile, the collection efficiency from randomly oriented QDs on the glass slide using the same NA objective was estimated to be $\eta_0$=19%. The QE in the NPA is approximately spatially uniform in the gap region (see FIG. 1E) with an average value of ~0.5, whereas the intrinsic quantum yield of the QDs in solid state is taken to be $E_0$=0.1. By combining these calculations, the average fluorescence enhancement factor from the simulations is $\langle EF \rangle$=660. The agreement in the fluorescence enhancement factor between the theory and the experiment indicates that the high radiative quantum efficiency of the NPA predicted by the simulations is accurate.

FIG. 4A illustrates a graph showing normalized time-resolved fluorescence of QDs on a glass slide (line 400) compared with QDs on an Au film (line 402) and coupled to a single NPA (line 404). The instrument response function (IRF) is also shown. Fits to exponential functions convolved with the IRF are shown in black. A single exponential function is used for the QDs on glass and Au. A biexponential function is used to fit the NPA decay.

FIG. 4B illustrates a graph showing a scatter plot of fluorescence decay times for ~30 NPAs showing the relative intensity contributions of the fast and slow decay components. The dashed line connects the two components for each individual NPA. Some decay curves show a more robust fit to a single exponential, and, in these cases, the slow component is not shown. FIG. 4C illustrates a histogram showing the decay time distribution of the fast and slow components of the ~30 individually measured NPAs.

Having established the high QE of QDs coupled to single NPAs, time-resolved fluorescence measurements was used to demonstrate the enhancement of the spontaneous emission rate. FIG. 4A shows the normalized time dependence of the emission of QDs on glass, on an Au film, and coupled to a single NPA. The decay of QDs on a glass slide features a single exponential component with a lifetime of $\tau_{glass}$=9.7±0.1 ns. On an Au film without nanocubes, the QDs show a shortened lifetime of $\tau_{gold}$=0.8±0.03 ns but with a significantly reduced intensity, as shown in FIG. 3A, which is the result of direct metal quenching.

When the QDs are coupled to the NPA, a dramatic decrease in the fluorescence lifetime is observed (see FIG. 4A). This decrease in lifetime is accompanied by a simultaneous increase in the time-integrated fluorescence (see FIG. 3A). The measured fluorescence from a single NPA is a summation of the emissions from all of the random lateral positions and orientations of the QDs in the gap region, as each of these QDs has a different emission rate. The random dipole orientation of QDs ensures that a subset of QDs is always optimally coupled to the NPA, unlike horizontally oriented organic molecules which have unfavourable coupling to the dominant vertical electric field. The spatial and orientational summation is expected to produce a non-exponential decay curve with a distribution of rates. The observed fluorescence decay approaches the instrument response function (IRF) of the detector (—30 ps full width at half maximum), which hinders extraction of the full rate distribution. Instead, biexponential function deconvolved with the instrument response was used as an approximate fitting model, resulting in time constants of $\tau_{NPA}^{slow}$=981 ps and $\tau_{NPA}^{fast}$=11 ps for the NPA shown in FIG. 4A. The dominant fast component corresponds to a Purcell enhancement relative to QDs on glass of $F_P=\tau_{glass}/\tau_{NPA}^{fast}$=880. It is noted that this Purcell factor represents only a lower bound due to the detector resolution limit. The relative amplitudes of the fast and slow fluorescence decay components for ~30 other NPAs are shown in FIG. 4B along with the decay lifetime distribution in FIG. 4C. For some fluorescence decay curves, a single exponential was found to be a more robust fitting function because the lifetimes approached the IRF (see FIG. 4B). All of the NPAs showed a fast decay component in the range of 11 to 51 ps that corresponds to a maximum Purcell factor of 190 to 880. Critically, these large Purcell enhancements are obtained simultaneously with a high radiative QE, as demonstrated above.

To determine the Purcell enhancement using simulations, the position of the dipole source under the nanocube (see FIG. 1D) was averaged over all dipole orientations because the QDs are expected to be randomly oriented. This results in a predicted Purcell factor of $F_P$=990, corresponding to a lifetime of 10 ps, which is only slightly above the range of the measured Purcell factors. This result suggests that the experimental measurements underestimate the Purcell factor because the shortest detectable lifetime with the use of deconvolution is ~10 ps. Because this result is the average lifetime expected based on the simulations, the shorter components are not resolved.

In experiments, there has been demonstration of an ultrafast spontaneous emission source with an emission speed exceeding 11 ps from a hybrid system consisting of plasmonic nanoantennas coupled to ensembles of colloidal quantum dots, a material particularly well-suited for photonics applications. Large Purcell enhancements up to a factor of 880 and a 2,300-fold enhancement in the overall fluorescence combined with directional emission and high radiative quantum efficiency have been observed. The large Purcell factors are enabled by the strong field enhancement in a well-controlled sub-10-nm gap region between a silver nanocube and an Au film. The results suggest the possibility of integrating single QDs into plasmonic nanopatch antennas, expected to result in even higher Purcell factors for optimally oriented and positioned QDs, to be used as single photon sources. If electrical injection is integrated with these structures, the nanopatch antennas could function as light-emitting diodes operating at ~90 GHz frequencies. Furthermore, controlling the dimensions of the nanocubes and the gap thickness opens the possibility for resonances in the near infrared for spontaneous emission sources at telecommunication wavelengths.

Full-wave simulations of the NPAs were performed using the commercial finite-element simulation software COMSOL Multiphysics. The scattering of a single NPA was computed based on the scattered-field formulation, in which the scattered fields were obtained by subtracting them from the analytical solution of an incident plane wave in the absence of the NPA (background field). The impinging plane wave has a transverse-magnetic (TM) polarization and normal incidence is assumed. The radius of curvature of the nanocube corners were smoothed to 8 nm to obtain better agreement with the experimental scattering spectra. Moreover, the silver nanocube was surrounded by a thin 3 nm insulating PVP shell with refractive index n=1.4, in agreement with the experiment. The gold film substrate of the NPA was placed on a glass substrate, which is assumed to be semi-infinite with a refractive index of n=1.47. The simulated scattering spectrum in FIG. 2C is calculated assuming a 7 nm polymer layer loaded in the nanogap between the cube and the gold film and with no QDs present. These polymer layers have a purely dielectric nature with an index of refraction equal to n=1.4. FIG. 27 shows maps of the field enhancement in the nanogap region for an excitation wavelength of 535 nm.

To compute the spontaneous emission enhancement and the radiative quantum efficiency shown in FIGS. 1D and 1E, the QDs were modeled as a monochromatic point-dipole emitting at the resonance of the NPA. The Green's function of the system was computed by varying the position of the dipole emitter on a discrete 15×15 grid placed beneath the nanocube. The surface formed by the array of dipoles was placed in the center of the spacer layer in order to avoid quenching as they approach the metallic parts of the plasmonic system. The four-fold symmetry of the NPA was used to reduce the necessary number of simulations. The simulation domain used to compute the emissive properties of the system was similar to the domain of the scattering simulations used before. The radiative and non-radiative rates were obtained by integrating the total power radiated out of the entire domain and absorbed from the plasmonic system, respectively. The dominant field component, which couples efficiently to the plasmonic resonance mode at the nanogap of the NPA, is aligned along the z-axis. The x and y components couple weakly to the plasmonic mode in the nanogap and their contribution to the total spontaneous emission is neglected.

Ag nanocubes were colloidally synthesized. 5 ml of ethylene glycol (EG) (Aldrich, 99.8%) was heated at 150° C. for 10 minutes. 60 μL of 1.3 mM sodium hydrosulfide (NaSH) in EG were added to the heated EG. After 2 minutes, 500 µL of 3 mM hydrochloric acid (HCl) in EG and 1.25 mL of poly(vinyl pyrrolidone) (PVP, 20 mg/mL) in EG were added. After another two minutes, 400 µL of 0.125 M silver trifluoroacetate (AgC$_2$Fe$_3$O$_2$) were added to the above mixture and the reaction proceeded for 2.5 hours. The resulting nanocubes were centrifuged at 8500 rpm and re-suspended in deionized water. The synthesis resulted in Ag nanocubes with side lengths of ~70-80 nm, including a ~3 nm residual poly(vinylpyrrolidinone) (PVP) layer coating the nanocubes.

A Cr/Au (5 nm/50 nm) film was deposited via electron beam evaporation onto a clean glass slide and, then, coated with a poly(allylamine) hydrochloride (PAH) layer with a thickness of ~1 nm as determined using spectroscopic ellipsometry and from previous reports. Core-shell CdSe/ZnS QDs (Sigma Aldrich) at a concentration of 0.1 mg/mL in toluene are spin coated onto the PAH layer at 750 rpm for 5 s followed by 1,500 rpm for 60 s. A diluted Ag nanocube solution (1:100) is drop cast on the sample, and the immobilized nanocubes adhere to the slightly negatively charged QDs, forming the final structure.

The optical characterization was performed using a custom-built bright field (BF)/dark field (DF) micro-fluorescence setup. A×100 DF/BF, 0.9 NA microscope objective was used for both the excitation and the collection of the scattering and fluorescence. To locate individual NPAs, an unpolarized halogen light source was used to illuminate the sample and a dark field scattering image of the NPAs was captured using an electron multiplying digital camera (Hamamatsu EM-CCD, model C9100). A continuous wave $\lambda_{ex}$=514 nm laser with a power of ~100 µW was defocused through the objective to a ~20-µm diameter spot on the sample. The fluorescence was collected using the same objective and imaged on the EM-CCD camera. A 550-nm long pass filter (Omega Optics) was used to reject scattered laser light. The QD fluorescence image was then overlaid with the dark field image, and the NPAs that were resonant with the QDs' emission were identified. The NPA scattering and QD fluorescence spectra were characterized using a HR550 Horiba Jobin Yvon spectrometer and Symphony charge coupled device (CCD) camera. A pin-hole aperture was placed at an intermediate image plane to select light from individual NPAs.

After identification of the NPAs, fluorescence enhancement and time-resolved measurements were performed using a 535 nm pulsed laser (Ti:sapphire, 150 fs pulses at a repetition rate of 80 MHz, Coherent). The pulsed laser was focused to a diffraction limited spot to minimize the background fluorescence from the QDs outside the NPA. The time-resolved measurements were performed at an excitation power of ~1 kW cm$^{-2}$, prior to the power dependence measurements to avoid QD bleaching. The fluorescence was detected using a fast timing avalanche photodiode (PMD, Micro Photon Device) and a time-correlated single-photon counting module (Pico-Harp 300, PicoQuant).

In an experiment, the commercial finite-element simulation software (COMSOL Multiphysics) was used to model the NPA. A spherical domain was created around a single NPA and scattering boundary conditions were employed to mimic an open boundary. The permittivity of the silver nanocube and the gold film substrate were modeled based on the dispersive parameters. The corners of the nanocube were smoothed, with a radius of curvature of 8 nm. The nanocube's dimensions were varied in order to always fix the plasmon resonance of the NPA plasmonic system to $\lambda_{sp}$=650 nm. A thin 3 nm insulating shell was placed to surround the metallic nanocube with refractive index n=1.4. The thickness of the spacer layer changed from 2 nm to 12 nm in order to simulate the different number of polymer layers placed in the nanogap. These layers were modeled as dielectrics with an index of refraction equal to n=1.4. The glass substrate was assumed to be semi-infinite with a refractive index of n=1.47 which was placed beneath the gold film substrate. COMSOL simulations were used to calculate the scattering signature of the NPA and the electric field distributions induced at the nanogap both at excitation (535 nm) and resonant (650 nm) frequencies. The scattered-field formulation was employed, which uses the analytical solution for an incident plane wave in the absence of the nanocube as the background field. Transverse-magnetic (TM) polarization and normal incidence is assumed for the impinging plane wave to compute the scattering. However, the scattering response is fairly independent of the angle of incidence and polarization of the plane wave excitation, as it was demonstrated earlier in Lassiter et al. and Moreau et al.

The Ru dye was modeled as a monochromatic point-dipole emitting at $\lambda_{sp}$=650 nm. The Green's function of the system, from which the local density of states, spontaneous decay rate and radiative quantum efficiency can be derived[4], was evaluated by varying the position of the dipole emitter on a discrete 15×15 grid placed beneath the nanocube. The surface formed by this array was placed in different positions along the z-axis inside the spacer layer in order to take into account in our calculations the entire volume of the nanogap. The four-fold symmetry of the NPA was used to reduce the necessary number of simulations. It is noted that the same simulation domain for the scattering calculations was used to compute the emissive properties of the system. The radiative and non-radiative rates were obtained by integrating the total power radiated out of the entire domain and absorbed from the plasmonic system, respectively.

Separate simulations were performed for dipoles oriented along all three Cartesian coordinates. However, it was found that the dominant field component that can couple efficiently to the plasmonic mode at the nanogap of the NPA is the one aligned along the z-axis. The x and y components cannot couple efficiently to the plasmonic mode formed in the nanogap and their contribution to the total spontaneous emission can be safely neglected.

The time-dependent emission decay curves were calculated based on the fact that the emitted power at an arbitrary position r is proportional to the number of the excited molecules and their emitted intensity: $I(r, \theta, t) \propto |E_{ex}(r) \cdot \hat{n}|^2 \gamma_r(r) e^{-\gamma_{sp}(r,\hat{n})t}$, where $E_{ex}(r)$ is the field distribution at the excitation wavelength (535 nm). Only the emitters oriented along the z-axis radiate significantly and, as a result, contribute to the spontaneous emission rate, which can now be written: $\gamma_{sp}(r,\hat{n})=\gamma_{sp}(r,\hat{z})\cos^2\theta$, where $\theta$ is the angle between the emitter orientation h and the z-axis. Assuming a distribution of emitter orientations $C(\theta)=\exp[-(\theta-\theta_0)^2/2\sigma^2]$, which is determined experimentally in section 6, the averaged emitted power over all possible directions is equal to:

$$I(r, t) \propto \frac{1}{2}|E_{ex}(r)|^2 \int_0^{\pi/2} \cos^2\theta \lambda_r(r) e^{-\gamma_{sp}(r)\cos^2\theta t} C(\theta) \sin\theta d\theta. \quad (4)$$

The emission curve as a function of time is then obtained by summing up the contribution of each emitter, or equally integrating I(r,t) over the volume of the emitters V and multiplying by the emitter density, N/V, with N being the number of the emitters. Hence, the final formula to compute the emission decay rate from the NPA is given by:

$$I_{np}(t) = \frac{N}{V} \int_V I(r, t) dV \quad (5)$$

This integral can be computed numerically and the obtained results have excellent agreement with the computed experimental rates for all different nanogaps.

The excitation spot (~300 nm diameter) is much larger than the cube size and consequently dye fluorescence is collected from regions outside the nanogap. To obtain the contribution to the time-resolved fluorescence originating from the nanogap $I_{np}$ (t), time-resolved fluorescence was measured from ~10 spots on each sample that contained no cubes $I_{off}(t)$. Due to quenching from the Au film, the total fluorescence from each of these spots was <10% of the fluorescence obtained from a spot containing a resonant nanocube. The nanocube fluorescence contribution was then obtained from the total collected fluorescence $I_{tot}(t)$ by $$I_{np}(t) = I_{tot}(t) \frac{1}{N} \sum_{n=1}^{N} -I_{off}^{(n)}(t) \quad (6)$$

The electric field in the nanogap is not uniform, and consequently molecules at different positions will experience different emission rates. In such a case, the measured time-resolved emission curve can be expressed generally as the sum of exponential decay terms $$F(t) = \int_0^\infty H(k) e^{-kt} dk \quad (7)$$

where F(t) is the fluorescence intensity and H(k) is the distribution of rate constants. Recovering H(k) from the experimentally obtained emission curve F(t) is in general difficult because extracting H(k) from Eq. (7) is an ill-defined problem. The approach commonly used to recover H(k), is to assume a mathematical function describing the temporal dynamics. Here the modified stretched exponential function is used to model F(t)

$$F(t) = A \exp\left[1 - \left(1 - \frac{t}{\tau_0}\right)^\beta + \right] \quad (8)$$

The shape parameter $0<\beta\leq 1$ determines how sub-exponential the decay curve is, with $\beta=1$ describing purely exponential decay. It is noted that other functions can be used to model a non-exponential decay, as described below.

In the experimental system, the measured time-resolved fluorescence from the NPA $I_{np}(t)$ is a convolution of the instrument response function of the detector $I_{irf}(t)$ with the underlying emission intensity from the cube $I_{em}(t)$ $$I_{np}(t) = I_{em}(t) I_{irf}(t) * \quad (9)$$

Figure 5:
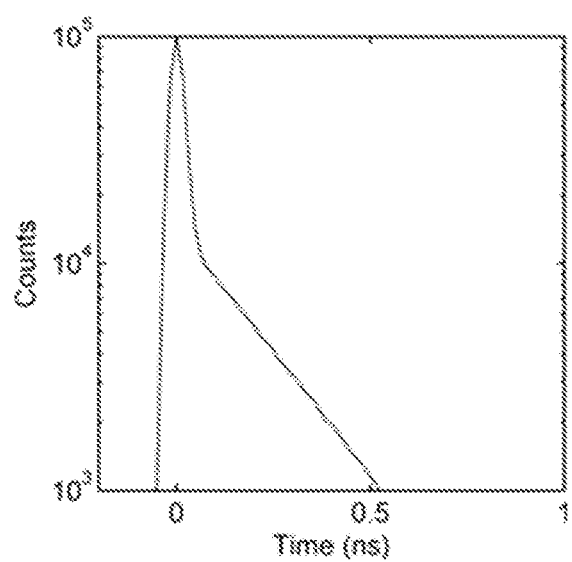
FIG. 5 is a graph of instrument response function of the fluorescence detection system, showing a 35 ps FWHM response time, measured by scattering a small amount of excitation laser light onto the detector.
Figure 6:
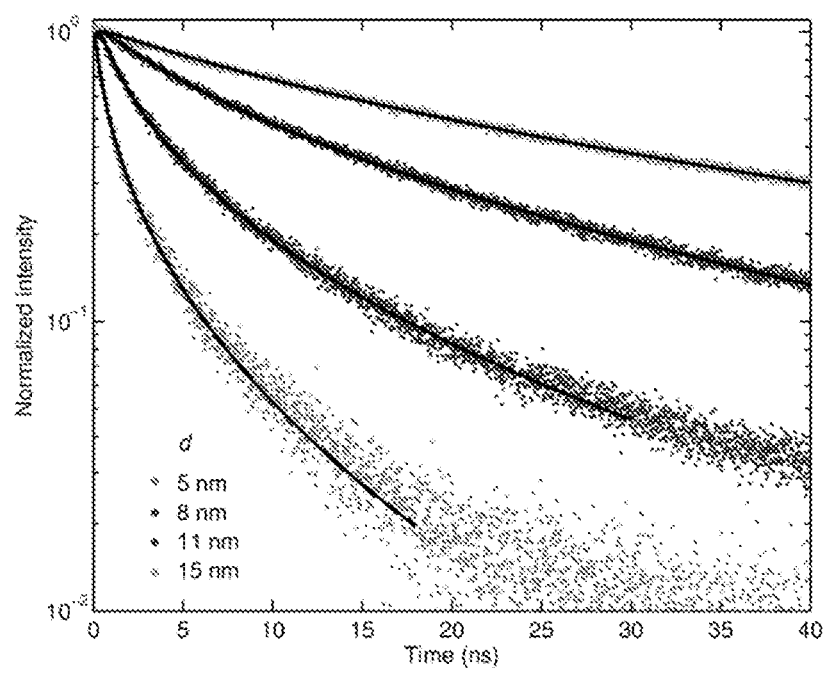
FIG. 6 is a graph showing measured emission decay curves from a single NPA for each gap thickness along with a fit to the stretched exponential function convolved with the instrument response function.

The instrument response function for our experimental system has a full width at half maximum of 35 ps, as shown in FIG. 5, which is a graph illustrating instrument response function of the fluorescence detection system, showing a 35 ps FWHM response time, measured by scattering a small amount of excitation laser light onto the detector. The measured emission decay curves are fit to a function $I_{fit}=F(t)I_{irf}(t)*$ which is a convolution of the stretched exponential and the instrument response, from which the parameters of the stretched exponential are obtained. Such a fit for a single NPA for each gap thickness is shown in FIG. 6, which illustrates a graph showing measured emission decay curves from a single NPA for each gap thickness along with a fit to the stretched exponential function convolved with the instrument response function.

To extract the distribution of rates underlying the stretched exponential, first the decay dynamics of a system was considered with a time-dependent decay constant that can be described by the first order differential equation:

$$\frac{dN}{dt} = -k(t)N \quad (10)$$

where N is the number of excited state molecules. The measured intensity is then assumed to be proportional to N $$F(t) = \frac{N}{N_0} \quad (11)$$

The time-dependent rate constant is then given by $$k(t) = -\frac{d}{dt} \ln F(t) \quad (12)$$

For the stretched exponential function, the time-dependent rate constant is then $$k(t) = \frac{\beta}{\tau_0}\left(1 + \frac{t}{\tau_0}\right)^{\beta-1} \quad (13)$$

A number of parameters characterizing the stretched exponential decay can be calculated. The ensemble average rate constant is $$\langle k \rangle = \int_0^\infty l H(k) dk = k(0) = \frac{\beta}{\tau_0} \quad (14)$$

while the ensemble averaged time constant is $$\langle \tau \rangle = \int_0^\infty F(t)/F(0) dt = \frac{e}{\beta} \Gamma\left(1, \frac{1}{\beta}\right) \tau_0 \quad (15)$$

where $\Gamma(x,a)$ is the incomplete gamma function.

The rate distribution function H(k) for a stretched exponential can only be expressed in terms of elementary functions for discrete values of $\beta$. A stable and accurate numerical solution has been found for H(k) for arbitrary $\beta$, $$H_\beta(k) = \tau_0 \frac{B}{(k\tau_0)^{(1-\beta/2)/(1-\beta)}} \times \exp\left[1 - k\tau_0 - \frac{(1-\beta)\beta^{\beta/(1-\beta)}}{(k\tau_0)^{\beta/(1-\beta)}}\right] f(k) \quad (16)$$

where the auxiliary function $f(k)$ is given by $$f(k) = \begin{cases} \dfrac{1}{1+C(k\tau_0)^\delta}, \delta = \dfrac{\beta(1/2 - \beta)}{1-\beta}, \text{ for } \beta \leq 1/2 \\ 1 + C(k\tau_0)^\delta, \delta = \dfrac{\beta(\beta - 1/2)}{1-\beta}, \text{ for } \beta > 1/2 \end{cases} \quad (17)$$

The parameters B and C are calculated numerically and are given for discrete values in Table 1 below. Intermediate values are obtained by cubic interpolation.

TABLE 1

Parameters for the rate distribution auxiliary function.

| β | 0.1 | 0.2 | 0.3 | 0.4 | 0.5 | 0.6 | 0.7 | 0.8 | 0.9 |
|---|-----|-----|-----|-----|-----|-----|-----|-----|-----|
| B | 0.145 | 0.197 | 0.243 | 0.285 | 0.382 | 0.306 | 0.360 | 0.435 | 0.700 |
| C | 0.89 | 0.50 | 0.35 | 0.25 | 0 | 0.13 | 0.22 | 0.4015 | 0.33 |

Figure 7:
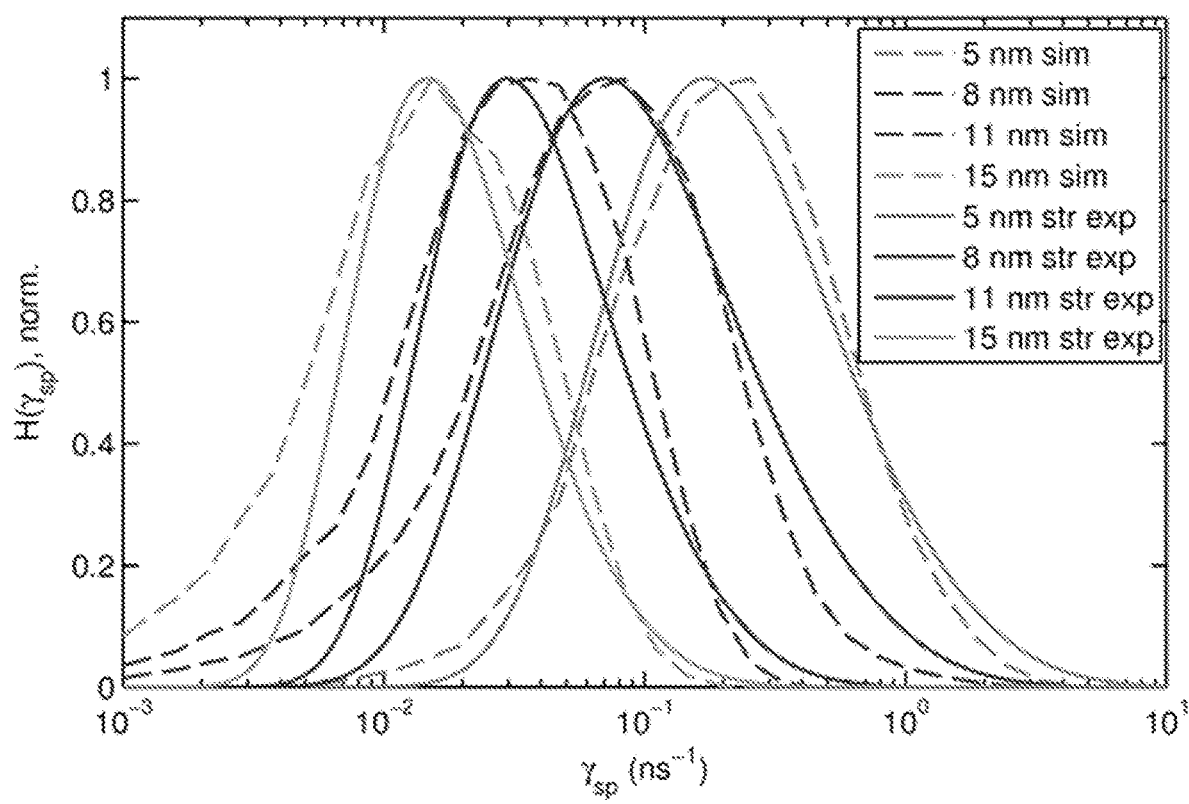
FIG. 7 is a graph showing emission rate distributions for each gap thickness obtained from simulations and from a fit of the experimental data to a stretched exponential.

The rate distribution obtained from a fit of the experimental data to a stretched exponential for each gap thickness is shown in FIG. 7 and shown in FIG. 21B. FIG. 7 illustrates a graph showing emission rate distributions for each gap thickness obtained from simulations and from a fit of the experimental data to a stretched exponential. Also shown here are the rate distributions obtained directly from the simulations, showing good agreement with the experiment without any fit parameters.

It is noted that the problem of extracting a distribution of rates from a time-dependent signal is not a well-defined problem. A number of different functions have been used to model non-exponential decays, with the stretched exponential being the most common. To show the effect of the choice of fitting function on the extracted rate distribution, FIGS. 8A and 8B illustrate graphs showing the analysis from FIGS. 20E-20F for both a stretched exponential and the Laplace transform of the Γ distribution $$F(t) = \frac{1}{(1+\kappa t)^{\alpha+1}} \quad (18)$$

The rate distribution corresponding to this decay is the Γ distribution $$H(k) = \frac{1}{\Gamma(\alpha+1)}\left(\frac{k}{\kappa}\right)^\alpha \exp(-k/\kappa) \quad (19)$$

FIG. 8A shows fits of the time-resolved fluorescence from a single NPA with an 8 nm gap to a stretched exponential and to a Γ distribution, with both functions resulting in good fits. The corresponding rate distributions (see FIG. 8B) show more variation, particularly in the tails of the distributions. While the stretched exponential gives better agreement with simulations for the peak of the distribution, the Γ distribution gives better agreement in the tails of the distribution. Neither function is justified based on the underlying physics of the system since the non-exponential decay from the NPAs is due to spatial inhomogeneity rather than the kinetics of the molecule emission. However, it is noted that the critical parameter of maximum rate is not determined by the particular function used. Rather it is obtained from the initial slope of the time-resolved fluorescence, which is nearly the same regardless of the choice of fitting function shown in FIG. 8B.

Figure 22A:
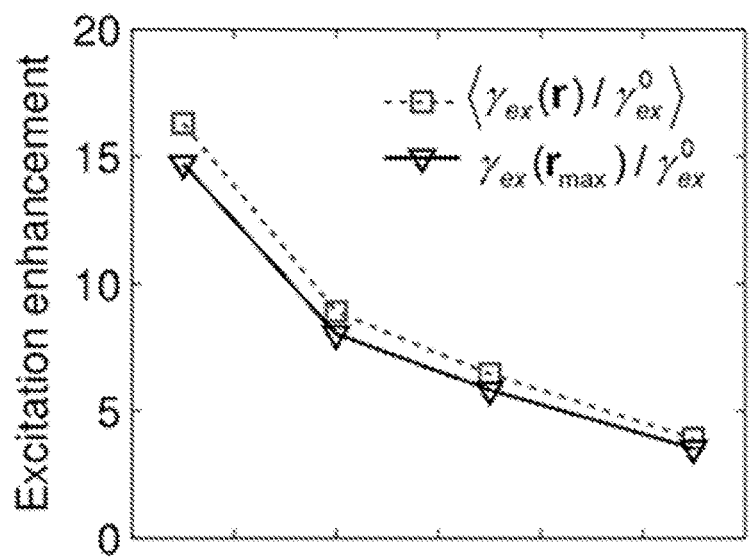
FIG. 22A is a graph showing simulated average excitation rate enhancement for dipoles in the nanogap relative to dipoles on glass (For each gap thickness the averaging is done over lateral position of dipoles under the cube, over the vertical position in the gap and over the dipole orientation distribution. Also shown is the excitation enhancement at the position of maximum emission rate enhancement, $r_{max}$)
Figure 22B:
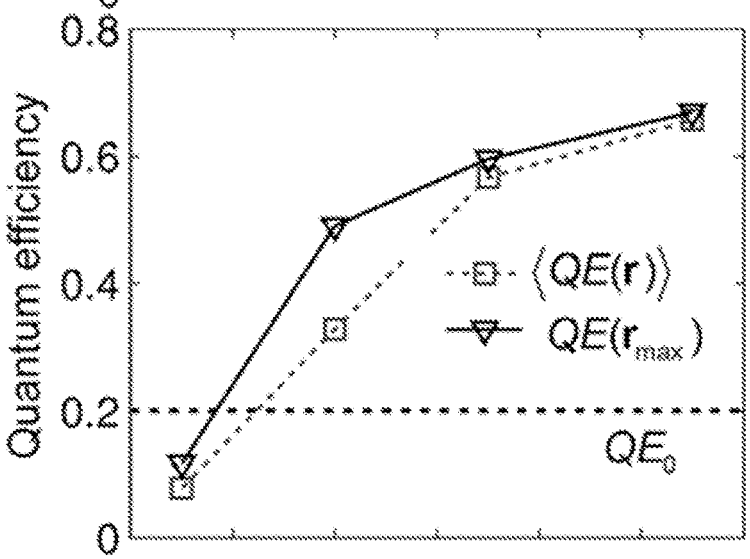
FIG. 22B is a graph showing simulated average QE as a function of gap thickness (The QE is high for a range of gap thicknesses and becomes smaller than the intrinsic quantum efficiency, $QE_0$ only for gaps d<6 nm. Also shown is the QE at the position of maximum emission rate enhancement, $r_{max}$)
Figure 22C:
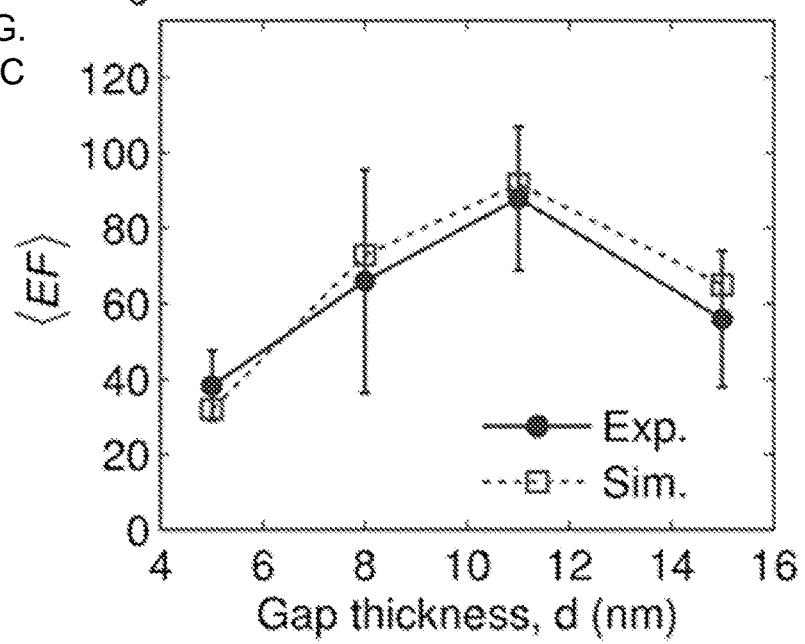
FIG. 22C is a graph showing measured and simulated average fluorescence enhancement factor per emitter ⟨EF⟨ (Measured and simulated ⟨EF⟨ are obtained entirely independently. The experimental error bars represent one standard deviation from a set of ~10 measured NPAs for each gap thickness)

Experimentally, the average time-integrated fluorescence enhancement factor for a NPA, $\langle EF \rangle$, is the ratio of emission per unit area from the NPA divided by the emission per unit area from an equivalent layer of dye molecules on glass, given by $$\langle EF \rangle = \frac{I_{np}}{I_c} \frac{A_c}{A_{np}} \quad (20)$$

where $I_{np}$ is the emission contribution from the NPA as determined from Eq. (3), $I_c$ is the emission intensity from the glass control sample, $A_{np}$ is the area under the nanocube, and $A_c$ is the area of the laser spot on the control sample. The area under the nanocube is given by $A_{np}=l^2$ where l is the cube side length without the PVP layer. This length is inferred from the gap thickness and plasmon resonance wavelength based on previously described methods. The side length depends on gap thickness in order for the resonance to remain fixed at 650 nm. The relationship between nanocube size and gap thickness is given in Table 2. Emission from the control sample originates from the entire excitation spot size, which is a Gaussian spot. To a good approximation, the effective area of emission is from a circle with a diameter equal to the FWHM of the excitation spot, such that $A_c=(350 \text{ nm})^2$. The imaged spot of the control sample emission and the NPA emission is smaller than the APD sensor area (50 μm×50 μm) such that all collected emission is detected and Eq. (20) is valid. The measured $\langle EF \rangle$ is shown in FIG. 22C.

TABLE 2

Nanocube and gap parameters for a constant plasmon resonance of λ = 650 nm.

| Cube size, /(nm) | Gap thickness, d (nm) | Number of PE layers |
|---|---|---|
| 66 | 2 nm PE film and 3 nm PVP shell | 3 |
| 79 | 5 nm PE film and 3 nm PVP shell | 5 |
| 86 | 8 nm PE film and 3 nm PVP shell | 7 |
| 93 | 12 nm PE film and 3 nm PVP shell | 9 |

To ensure proper control samples, it is critical that the density of Ru dye on the control sample is equal to the density of dye in the NPA samples. However, it was found that the polyelectrolyte (PE) layers grow differently on glass and gold substrates. Using ellipsometry, it was shown that the thickness of the PE layers depends on the number of depositions on the two substrates (see FIG. 9). As glass substrates are not suitable for ellipsometry measurements of such thin films, Si with native oxide was used instead. A Cauchy model for the refractive index of the polymer film is used in the analysis of the ellipsometry data. For example, to obtain a polymer layer thickness of ~5 nm, 5 PE layers are grown on gold while 9 PE layers are grown on glass. The polymer films on gold and glass are incubated in the Ru dye solution as described in the Methods, obtaining the same density of Ru dye on both the NPA and control samples.

The fluorescence enhancement factor from simulations at a particular position and dipole orientation is defined as $$EF(r) = \frac{\eta}{\eta_0} \frac{\gamma_{ex}(r, \theta)}{\gamma_{ex}^0(\theta)} \frac{QE(r)}{QE_0} \tag{21}$$

where $\eta$ is the emission collection efficiency, $\gamma_{ex}$ is the excitation rate and $\theta$ is the polar orientation of the dipole. Each of these values for the NPA is normalized by the same quantity calculated for equivalent dipoles on glass. The excitation rate enhancement can be rewritten in terms of the field enhancements $$\frac{\gamma_{ex}(r, \theta)}{\gamma_{ex}^0(\theta)} = \frac{\frac{1}{2}[E(r)_x^2 + E(r)_y^2]\sin^2\theta + E(r)_z^2\cos^2\theta}{E_0^2 \sin^2\theta} \tag{22}$$

Figure 10A:
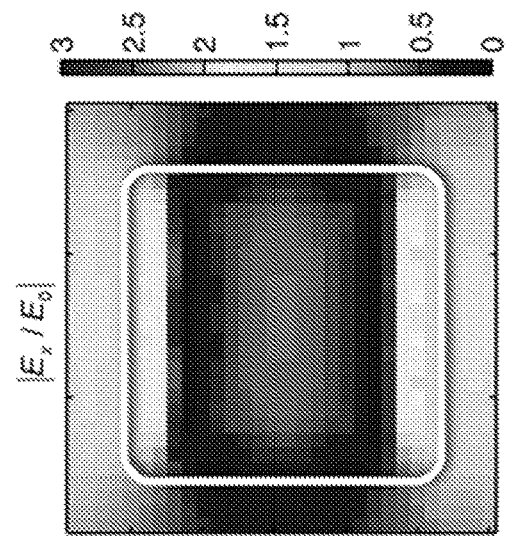
FIGS. 10A-10C show field enhancement for each component in the NPA gap under off-resonant excitation at $\lambda_{ex}$=535 nm, with the incident electric field in the plane.
Figure 10B:
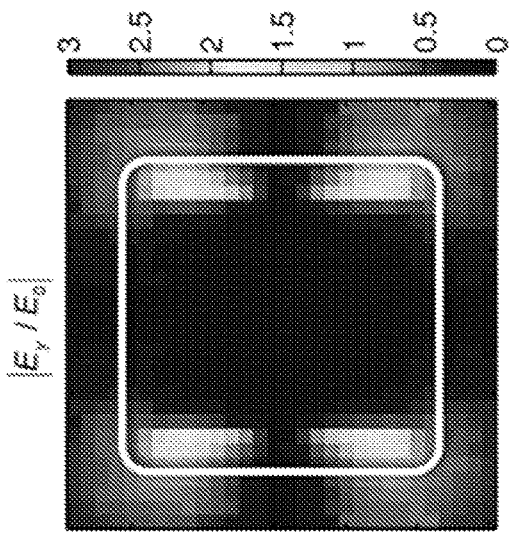
Figure 10C:
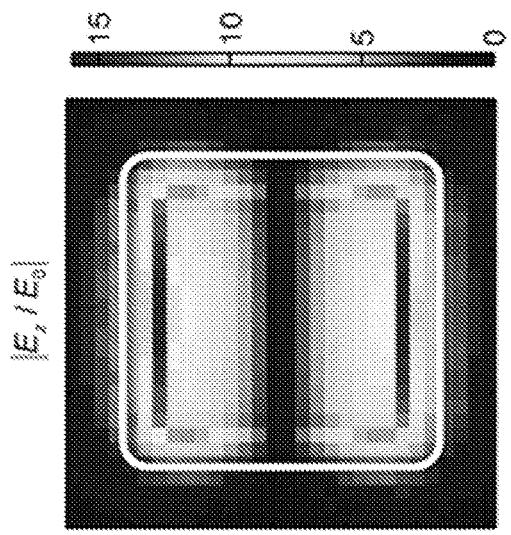

Here the fact that the incident field is in the plane of the sample has been utilized, and hence in-plane molecules can be excited more efficiently in the control sample. The excitation field in the NPA is dominated by the z component, as shown in FIGS. 10A-10C, which show field enhancement for each component in the NPA gap under off-resonant excitation at $\lambda_{ex}$=535 nm, with the incident electric field in the plane. The white outline indicates the boundaries of the nanocube. The dominant field component is in the z direction.

Figure 11B:
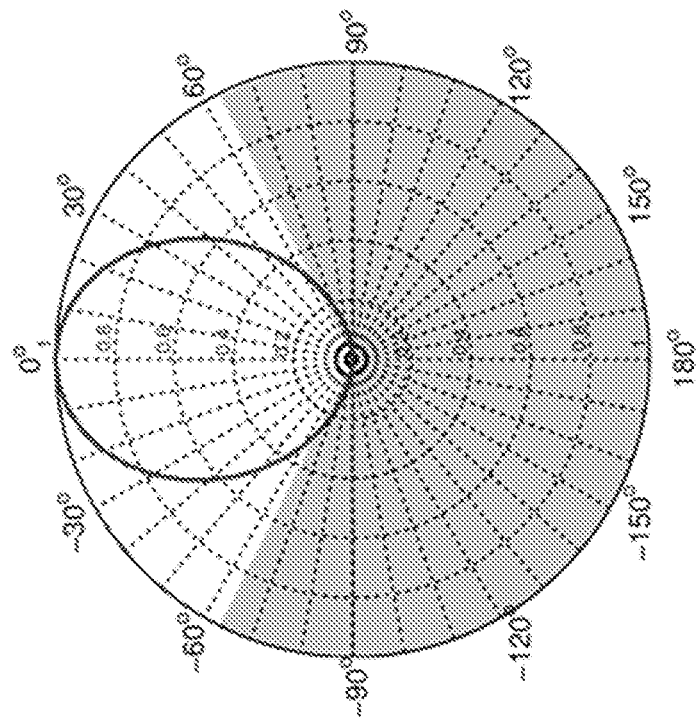
FIGS. 11A and 11B depict radiation pattern of dipoles on glass (11A) and from the NPA (11B)

The collection efficiency of emission for the NPA system is calculated using full-wave simulations in CST with the far-field radiation pattern shown in FIG. 19D and in FIG. 11B. The collection efficiency using an NA=0.9 objective lens is $\eta$=84%, with the collection efficiency, CE, given by $$CE = 2\pi \int_0^{\theta_{max}} \frac{d^2S}{d\Omega^2} \sin\theta d\theta \tag{23}$$

where $d^2S/d\Omega^2$ is the emission per unit solid angle, $\theta$ is the emission angle, and $\theta_{max}$ is the maximum collection angle of the objective, related to the NA by $\theta_{max}$=arcsin(NA). It is noted that since emission from the dipoles is coupled to a single plasmonic mode, the radiation pattern from the NPA is not sensitive to the emission dipole orientation. The collection efficiency of emission from control samples consisting of dipoles situated on a glass surface is calculated analytically using a suitable approach. For the calculation of collection efficiency the dipoles are situated at the interface between air and glass, and the emission is averaged over the angular distribution as determined experimentally below.

Figure 11A:
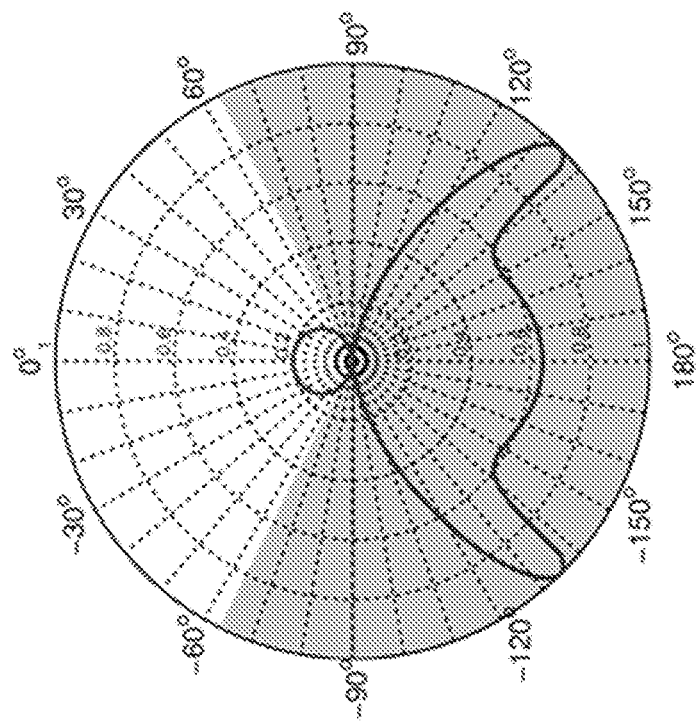

The calculated radiation pattern is shown in FIG. 11A. With the NA=0.9 objective, the collection efficiency from the control sample emission, as defined by Eq. (23) is $\eta_0$=15%. In FIGS. 11A and 11B, the distribution of dipole orientations, as determined experimentally, was used for the calculations. The collection efficiency for the control sample on glass is $\eta_0$=15% while for the NPA it is $\eta$=84%.

Figure 12:
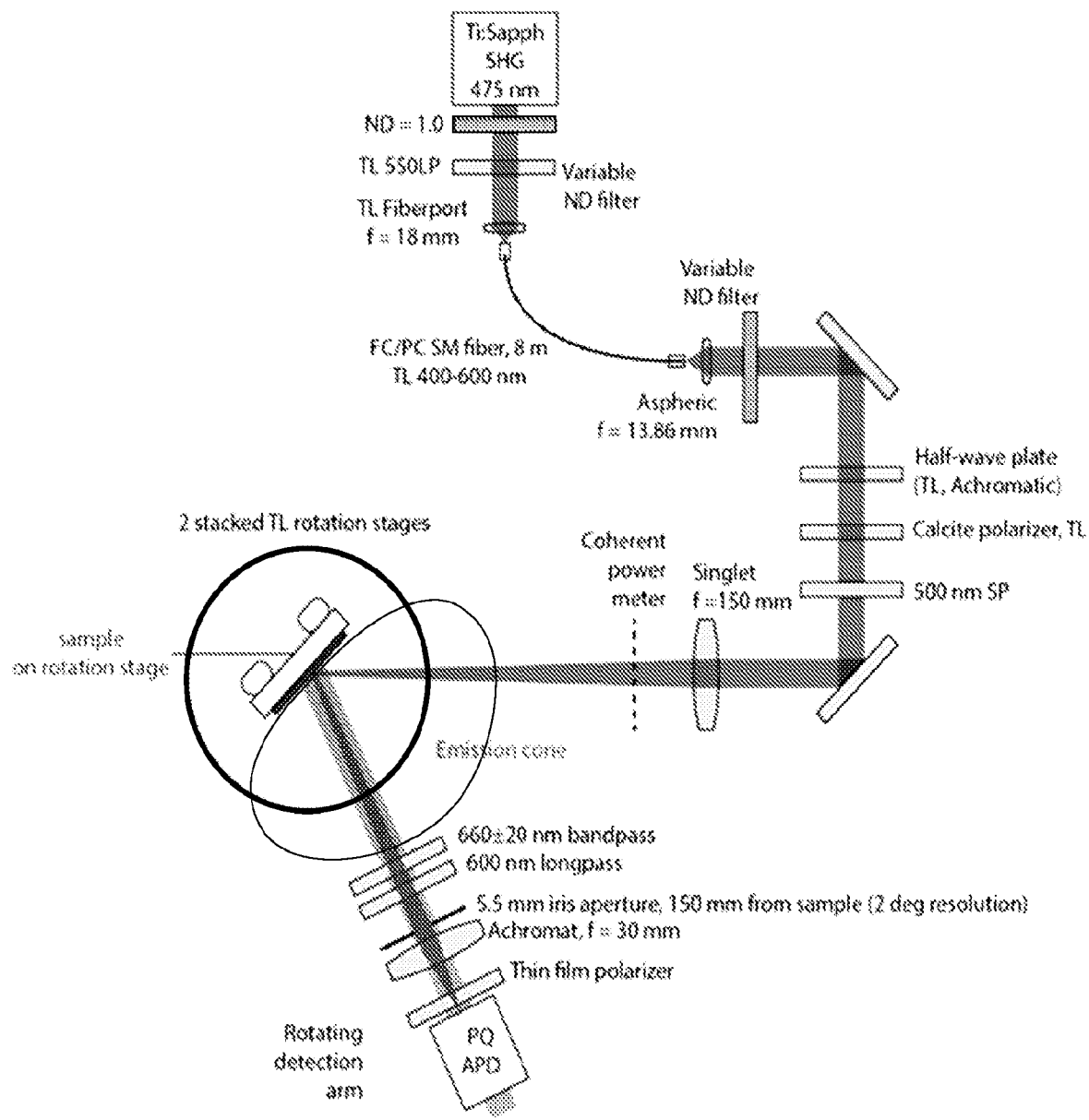
FIG. 12 is a schematic diagram of experimental setup for measuring the distribution of molecular dipoles.
Figures 13A, 13B:
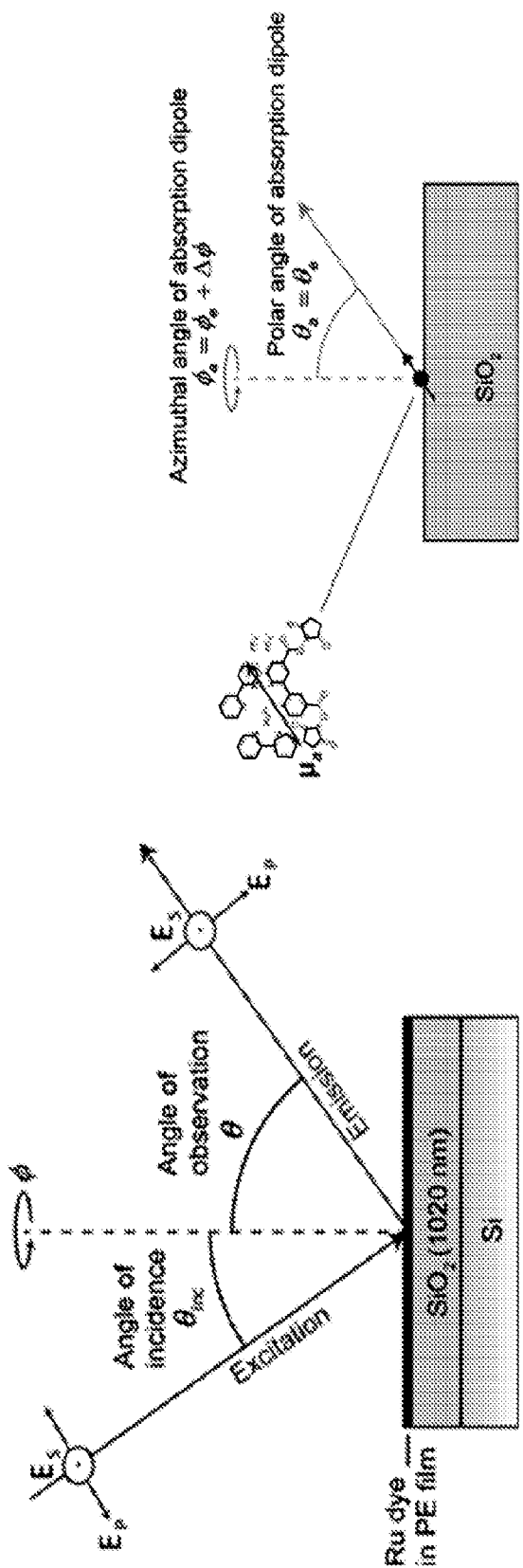
FIG. 13A is a schematic of an example approach for measuring transition dipole orientation of fluorescent molecules.
FIG. 13B is a schematic of the relevant orientation of angles of the transition dipoles on the surface.

Using a suitable technique, the distribution of dipole orientations for Ru dye embedded in the PE layers was determined using an angular resolved fluorescence setup (FIG. 12). The Ru dye is deposited on a 5 nm thick PAH/PSS polymer film on top of a substrate consisting of a $SiO_2$ thermal oxide (1020 nm) on a silicon wafer (FIGS. 13A and 13B). The intensity emitted as a function of polar observation angle $\theta$ and azimuthal angle $\phi$, with incidence angle $\theta_{inc}$ is $$I_{em}(\theta_{inc}, \theta, \phi) = \int_{\theta_a} \int_{\lambda_e} |\mu_a \cdot E_{ex}|^2 \ S(\theta, \phi)C(\theta_a)\sin\theta_a d\theta_a d\lambda_e \tag{24}$$

where $|\mu_a \cdot E_{ex}|^2$ is the excitation rate and $S(\theta, \phi)$ is the emission term. $C(\theta_a, \phi_a)$ is the distribution of dipole orientations, which is the quantity of interest in extracting. The measured emission in a particular direction is an integration over all possible emission dipole orientations and emission wavelengths, determined by the emission spectrum of the Ru dye. The integration over dipole azimuthal angle is left out since the azimuthal distribution is assumed to be isotropic. The excitation rate is given by the interaction of the absorption dipole moment and the incident electric field for each polarization $$|\mu_a \cdot E_s^{ex}|^2 \propto \sin^2(\theta_a)\cos^2(\phi_a) | 1 + r_s^a(\theta_{inc})\exp(j\psi_a) |^2 \tag{25}$$

$$|\mu_a \cdot E_p^{ex}|^2 \propto \sin^2(\theta_a)\sin^2(\phi_a)\cos^2(\theta_{inc}) | 1 - r_p^a(\theta_{inc})\exp(j\psi_a) |^2$$

$$+\cos^2(\theta_a)\sin^2(\theta_{inc}) | 1 + r_p^a(\theta_{inbc})\exp(j\psi_a) |^2$$

$$+\sin^2(\theta_a)\cos(\theta_a)\sin(\phi_a)\sin(2\theta_{inc}) | 1 - r_p^a(\theta_{inc}) |^2$$

where $\phi_a$ is the absorption dipole azimuthal angle, $r_s^a$ and $r_p^a$ are the complex reflection coefficients of the substrate for s and p polarization at the absorption wavelength. These reflection coefficients are calculated using transfer matrix formalism. The phase factor is $\psi_a=[2\pi/\lambda_a]2z\cos\theta_{inc}$, where $\lambda_a$ is the absorption (excitation) wavelength, and z is the vertical position of the emitters above the top surface of the substrate. This phase factor is assumed to be zero because the polymer film in which the Ru dye is embedded is ~5 nm thick.

The emission term for each emission polarization is obtained by decomposing the electric field from a dipole in terms of plane waves in the presence of planar interference layers $$S_s(\theta, \phi) = \sin^2(\theta_e)\sin^2(\phi_e - \phi) | 1 - r_s^e(\theta)\exp(j\psi_e) |^2 \tag{26}$$

$$S_p(\theta, \phi) = | \sin(\theta_e)\cos(\phi_e - \phi)\cos(\theta)[1 - r_p^e(\theta)\exp(j\psi_e)] -$$

$$\cos(\theta_e)\sin(\theta)[1 + r_p^e(\theta)\exp(j\psi_e)]|^2$$

where $\theta_e$ and $\phi_e$ are the polar and azimuthal angles of the emission dipole, $r_s^e$ and $r_p^e$ are the complex reflection coefficients of the substrate for s and p polarization at the emission wavelength, and $\psi_e=0$ is the emission phase factor. The emission angles $\theta_e$ and $\phi_e$ are assumed to be equal to the absorption dipole angles in the absence of more detailed molecular structure information about the Ru dye. This assumption does not make a substantial effect on the final extracted dipole orientation distribution.

FIG. 13A illustrates a schematic of an example approach for measuring transition dipole orientation of fluorescent molecules. FIG. 13B illustrates a schematic of the relevant orientation of angles of the transition dipoles on the surface.

Figure 14:
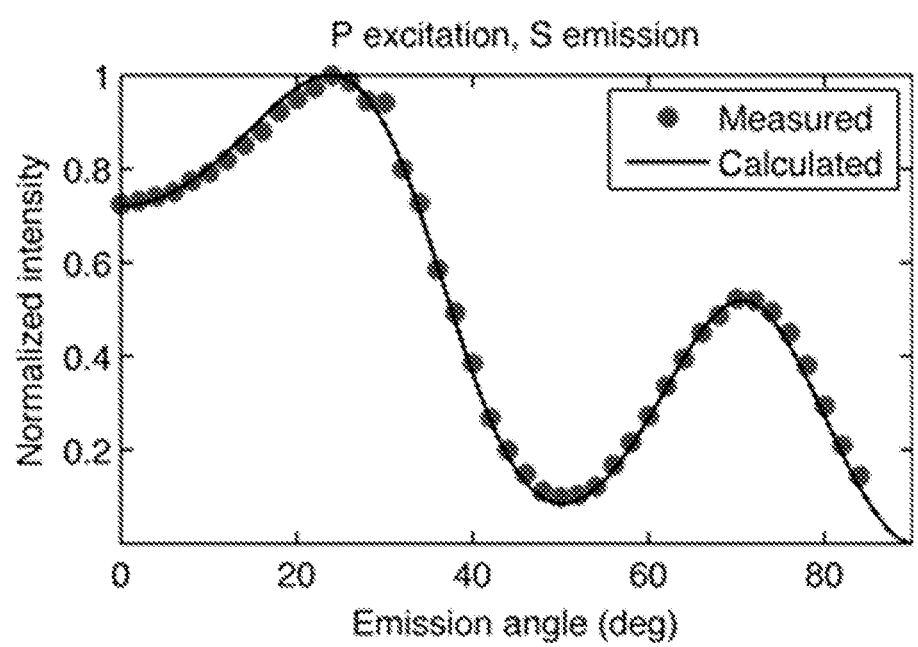
FIG. 14 is a graph showing S polarized fluorescence intensity as function of angle under p polarized excitation of the Ru dye on a thermal oxide substrate.

The angle and polarization resolved emission from the Ru dye samples on thermal oxide substrates may be measured using a suitable system such as the system shown in FIG. 12. Based on the theory presented above, it can be expected that s polarized emission may be independent of the orientation distribution function. Indeed it was found that measurements of the angle resolved emission under p polarized excitation and s polarized emission show excellent agreement with calculations from Eq. (24) (FIG. 14). FIG. 14 illustrates a graph showing S polarized fluorescence intensity as function of angle under p polarized excitation of the Ru dye on a thermal oxide substrate, with a fit to calculations from Eq. (24).

Figure 15:
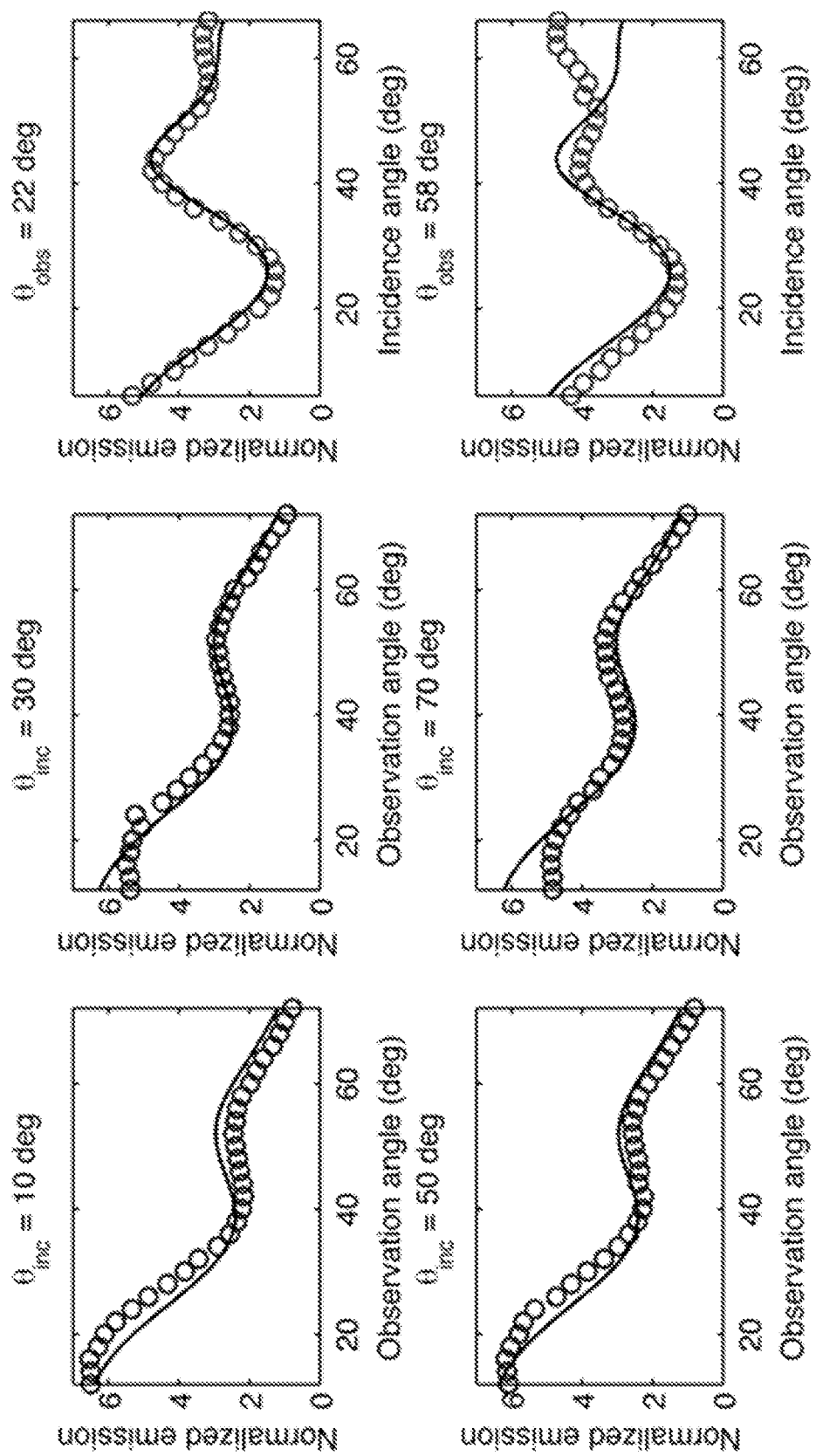
FIG. 15 are graphs showing angle resolved p polarized emission under p polarized excitation under four different incidence angles along with p polarized emission under varying incidence angles for two fixed observation angles (circles are measured values and solid lines are calculated values based on an optimal distribution function $c(\theta_a)$)

The information about dipole orientations is encoded in the angular dependence of the p polarized emission. FIG. 15 shows the p polarized emission under four different incidence angles with p polarized excitation. In addition, the p polarized emission was measured at two constant observation angles while varying the incidence angle. To extract the dipole orientation distribution function, $C(\theta_a)$, perform a simultaneous fit of the calculated angle resolved emission to all the measured curves was performed from FIG. 15, using $C(\theta_a)$ as the fitting parameter. The function which is minimized is given by $$\min || I_{meas}(\theta_{inc}, \theta) - \int_{\theta_a} I_{sim}(\theta_{inc}, \theta, \theta_a) C(\theta_a) d\theta_a ||^2. \quad (27)$$

Figure 16:
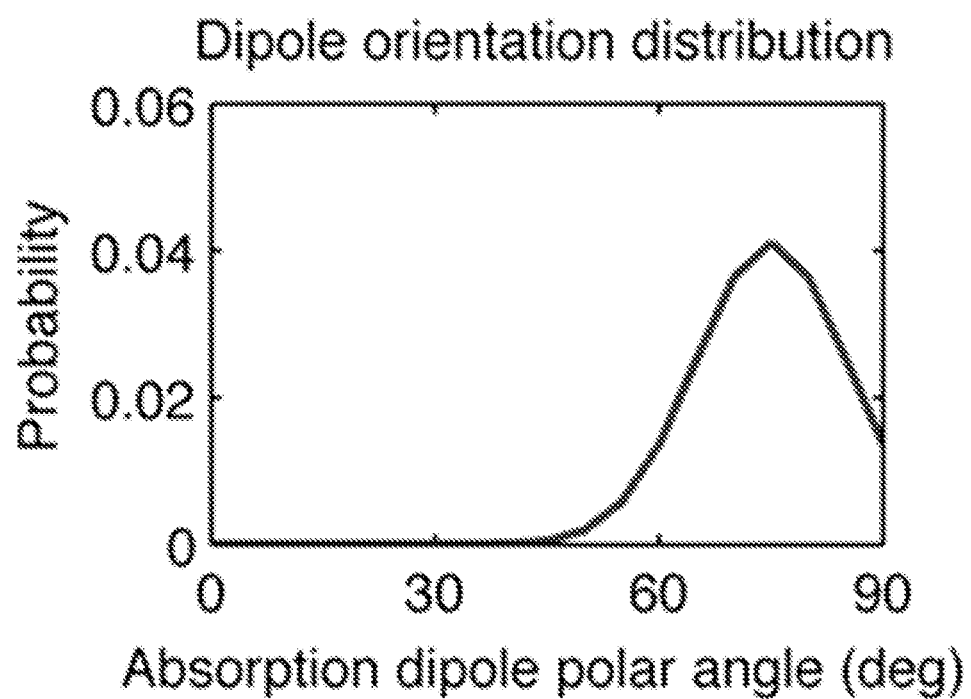
FIG. 16 is a graph showing distribution of Ru dipole orientations on the polymer film based on the fits to the data in FIG. 15.

The results of fitting are shown in FIG. 15, which illustrates graphs of angle resolved p polarized emission under p polarized excitation under four different incidence angles along with p polarized emission under varying incidence angles for two fixed observation angles. Circles are measured values and solid lines are calculated values based on an optimal distribution function $C(\theta_a)$. The corresponding distribution of dipole orientations (shown in FIG. 16) shows that most Ru dipoles embedded in the PAH/PSS polymer film are oriented at 75° relative to the surface normal with a standard deviation for the Gaussian distribution of 10°. This distribution was utilized in the calculation of the spontaneous emission rates in the main text. The near parallel orientation of the dipoles is consistent with other measurements of the orientation of planar organic dyes on surfaces. Other distribution functions, such as an isotropic distribution, show a very poor match to the measured angle resolved fluorescence. This shows that an isotropic distribution is a poor assumption in this plasmonic system and likely in many other systems.

Figure 17:
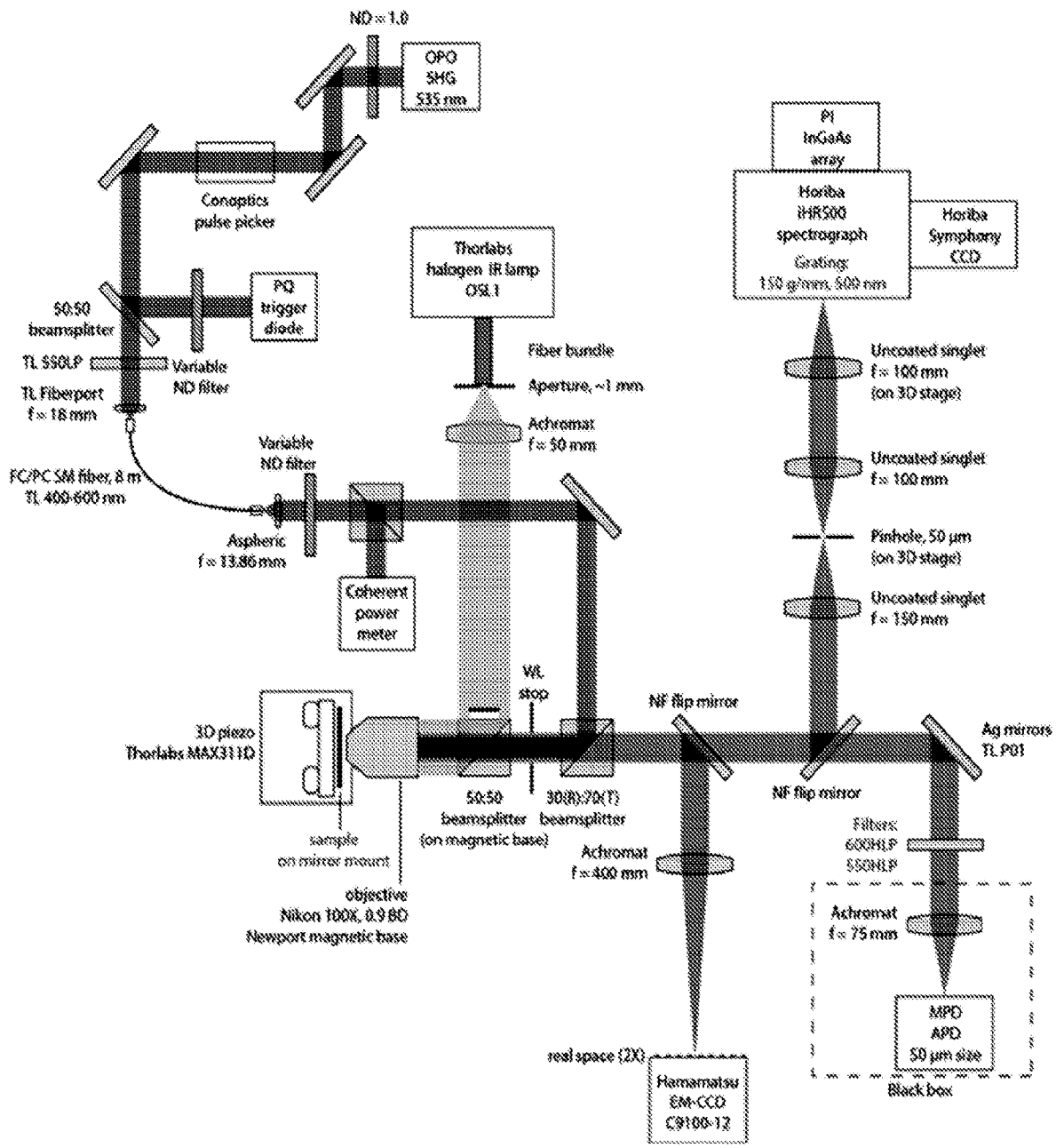
FIG. 17 is a schematic diagram of an example experimental setup for measuring single NPAs.

FIG. 17 illustrates a schematic diagram of an example experimental setup for measuring single NPAs. Referring to FIG. 17, TL indicates Thorlabs, NF indicates New Focus, and PQ indicates PicoQuant.

Figure 18:
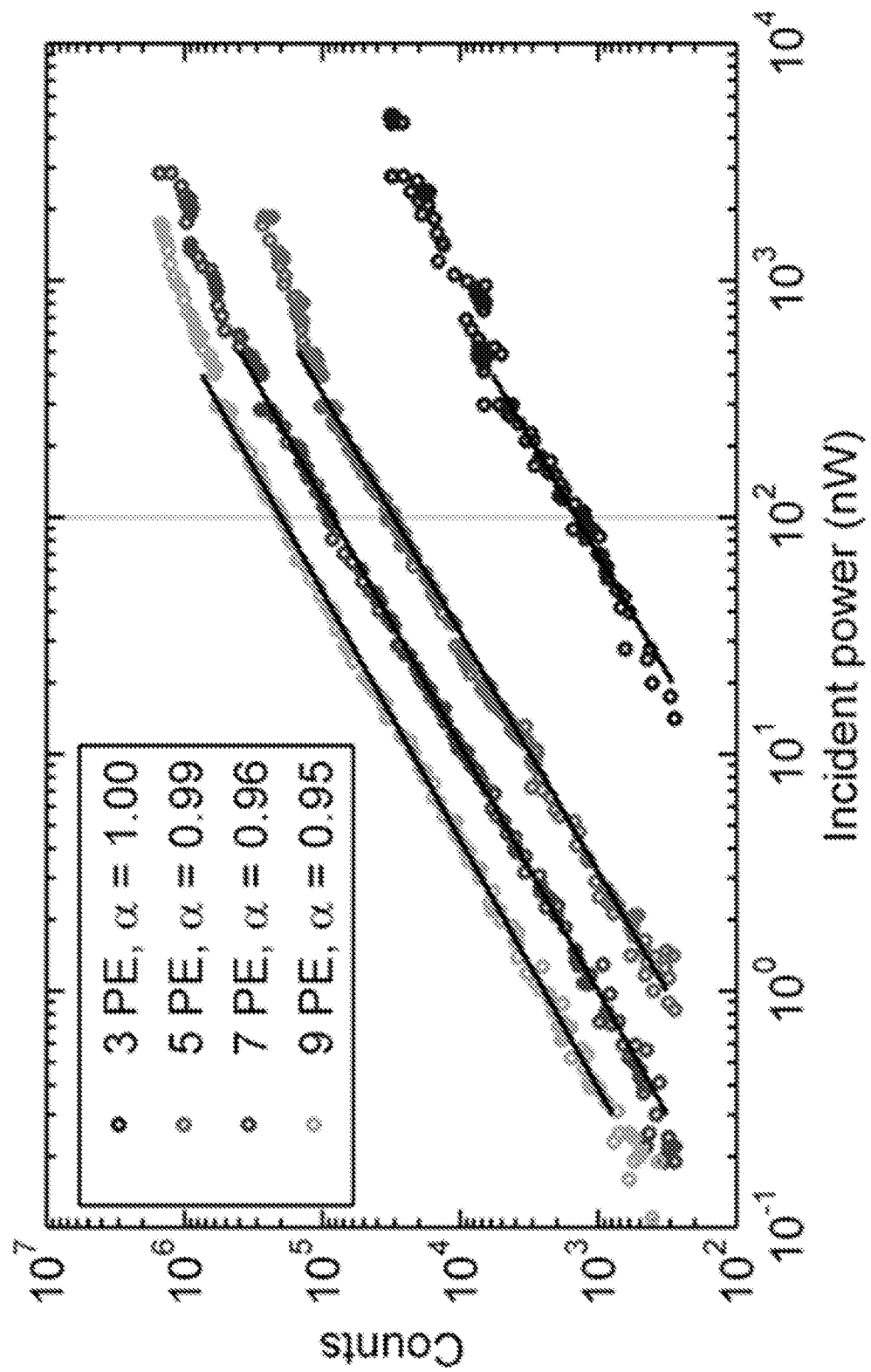
FIG. 18 is a graph showing fluorescence emission from a single cube as a function of power incident on the sample surface for four different gap thicknesses, showing that the power used was in the linear excitation regime.

FIG. 18 illustrates a graph showing fluorescence emission from a single cube as a function of power incident on the sample surface for four different gap thicknesses, showing that the power used was in the linear excitation regime. The data are fitted to a power law function with the exponent, a, indicated in the legend.

Typical luminescent emitters have relatively long emission lifetimes (~10 ns) and non-directional emission, intrinsic optical properties that are poorly matched to the requirements of nanophotonic devices. For example, in the case of single photon sources, fast radiative rates are required to operate at high frequencies and directionality is needed for high collection efficiency. In addition, for plasmonic lasers, enhanced spontaneous emission into the cavity mode can reduce the lasing threshold. As a result, much work has been focused on modifying the photonic environment of emitters to enhance the spontaneous emission rate, known as the Purcell effect. Early approaches focused on integrating emitters into dielectric optical microcavities, which showed modest emission rate enhancements. However, dielectric cavities require high quality factors for large rate enhancements, which makes these cavities mismatched with the spectrally wide emission from inhomogeneously broadened or room temperature emitters. Plasmonic nanostructures are a natural solution to the spectral mismatch problem, owing to their relatively broad optical resonances and high field enhancements. Despite these advantages and the capability for emission rate enhancement, many plasmonic structures suffer from unacceptably high non-radiative decay due to intrinsic losses in the metal or have low directionality of emission. In plasmonic structures the Purcell factor, which is defined as the fractional increase in the total emission rate, has contributions from an increased radiative rate and from an increased nonradiative rate due to metal losses. Therefore, it is critical to specify the fraction of energy emitted as radiation, known as the radiative quantum efficiency (QE). From knowledge of the Purcell factor and the QE, the enhancement in the radiative rate can be obtained.

The largest field enhancements occur in nanoscale gaps between metals, which are challenging to fabricate reliably and, especially, on a large scale. Plasmonic antenna designs such as bowtie antennas rely on gaps defined laterally using electron beam lithography or ion milling, making it difficult to produce sub-10 nm gaps for which the highest Purcell factors occur. The plasmonic patch antenna can overcome these challenges. The plasmonic patch antenna includes emitters situated in a vertical gap between a metal disk and a metal plane. Due to the planar fabrication technique, the gaps in patch antennas can be controlled with nanometer and sub-nanometer precision. Thus far, however, micron scale plasmonic patch antennas have shown only modest emission rate enhancement (~80) and low radiative quantum efficiency.

Systems in accordance with embodiments of the present disclosure have demonstrated a nanoscale patch antenna that shows large emission rate enhancement, high radiative efficiency, directionality of emission, and deep sub-wavelength dimensions. An example NPA can include a colloidally-synthesized silver nanocube (~80 nm side length) situated over a metal film, separated by a well-controlled nanoscale gap (5-15 nm) embedded with emitters (see e.g., FIGS. 19A and 19B). The cone about the nanocube in FIG. 19A indicates the directionality of the enhanced emission originating from the nanogap region. The fundamental plasmonic mode of the film-coupled nanocube is localized in the gap (see FIG. 19C) with the dominant electric field oriented in the vertical (z) direction, transverse to the gap. The resonance wavelength is determined by the size of the optical resonator, defined by the side length of the nanocube and the thickness and refractive index of the gap material. The resonance of the NPAs can be tuned from 500 to 900 nm by controlling these dimensions. On resonance, the maximum field enhancements in the gap can reach 200, resulting in up to 30,000-fold fluorescence intensity enhancement of molecules integrated into the gap as well as enhanced Raman scattering. In FIG. 19C, the dominant component of the gap electric field is in vertical (z) direction and is largest near the corners of the nanocube.

Through full-wave simulations, the radiation pattern of the antenna at the resonance wavelength is predicted to have a single lobe oriented in the surface normal direction (FIG. 19D). The fraction of emitted light collected by the first lens is calculated to be 84% using an objective lens with numerical aperture NA=0.9. The scattered radiation pattern of a single NPA was measured by imaging the back of the objective lens, showing excellent agreement with simulations (see FIG. 19D). Emission at angles greater than 64° falls outside the collection cone of the NA=0.9 objective lens, explaining the small discrepancy between measurements and simulations. While the NPA is less directional than multi-element plasmonic antennas such as the Yagi-Uda, the main radiation lobe of the NPA is normal to the surface, an important feature for applications such as single photon sources where coupling to external optics is needed.

Due to the large field enhancement and increased density of states, emitters placed in the nanogap experience large changes in their spontaneous emission rate. In general the spontaneous emission rate of a dipole is $$\gamma_{sp}(r) = \frac{\pi\omega}{3\hbar\epsilon_0}|p|^2 \rho(r,\omega) + \gamma_{int}^0 \qquad (28)$$

where $\omega$ is the emission frequency, p is the transition dipole moment of the emitter, r is the position, and $\gamma_{int}^0$ is the internal nonradiative decay rate of the emitter. In the plasmonic environment, the large field greatly enhances the local density of states $$\rho(r,\omega) \propto \hat{n}_p \cdot \text{Im}\{G(r;r)\} \cdot \hat{n}_p \qquad (29)$$

where $\hat{n}_p$ is the orientation of the transition dipole of the emitter and G is the dyadic Green's function, which is the electric field interacting with the emitter due to its own radiation. FIGS. 1E and 1F show the emission properties of a NPA with a plasmon resonance of $\lambda_{np}$=650 nm and a gap thickness of d=8 nm computed by full-wave simulations. Referring to FIGS. 19E and 19F, the white dashed line indicates the lateral extent of the nanocube. In this simulation, dipoles are assumed to be vertically oriented for maximum coupling to the gap mode and have a free space quantum efficiency of $QE_0$=0.2. When the emitters are resonant with the plasmon mode, the NPA shows dramatic enhancement in the spontaneous emission rate $\gamma_{sp}$ relative to the emission rate in free space, $\gamma_{sp}^0$ (see FIG. 1E). The calculated emission rate depends on the lateral position of the emitter under the nanocube, with rate enhancements exceeding 4000 near the corners of the nanocube for dipoles oriented along the z direction. At the same time, the emission efficiency remains high (>0.5) and spatially uniform (see FIG. 19F), quantified by the radiative quantum efficiency $QE=\gamma_r/\gamma_{sp}$, where $\gamma_r$ is the radiative rate of the emitter.

Figure 20A:
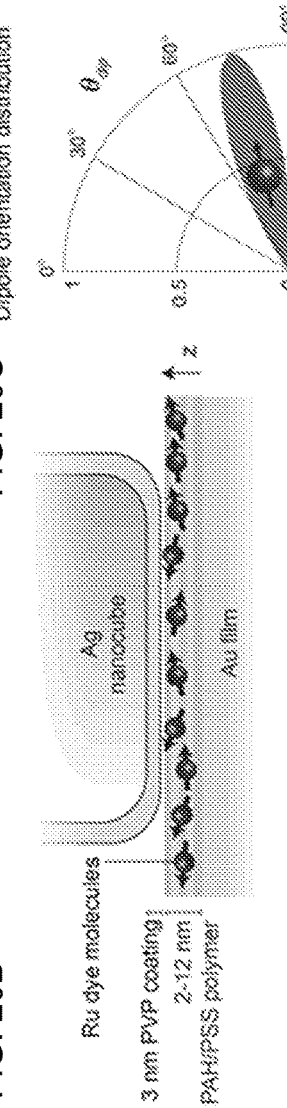
FIG. 20A is a graph showing absorption and fluorescence spectrum of the Ru dye.

Experimentally observing large emission rate enhancements is often challenging due to the intrinsic lifetime of many common emitters (~10 ns) and the temporal resolution limit of single photon detectors (~30 ps). To overcome this limitation, a fluorescent ruthenium metal complex dye (Ru dye) with a long intrinsic lifetime of $\tau_0=1/\gamma_{sp}^0=600\pm50$ ns (FIGS. 20A and 20E) was used. The nanogap of the NPA is fabricated by growing a layer-by-layer poly-electrolyte film with a controlled thickness (2-12 nm) on a gold film (FIG. 20B). The samples are immersed in a solution of Ru dye, allowing the dye to intercalate into the polymer film. This is followed by immersing the sample into a solution containing silver nanocubes covered in a 3 nm thick polymer coating, which electrostatically adhere to the polymer film, completing the structure. Individual antennas are identified by darkfield microscopy and spectroscopy, selecting those with a plasmon resonance of $\lambda_{sp}$=620 650 nm for good spectral overlap with the Ru dye emission (FIG. 20A). The large wavelength shift between absorption and emission of the Ru dye allows for non-resonant excitation at $\lambda_{ex}$=535 nm (FIG. 20A). The relationship between nanocube size, gap size and plasmon resonance has been previously established. Referring to FIG. 20A, the dye fluorescence spectrum overlaps with the film-cube resonance at $\lambda_{np}$≈650 nm. The NPAs were excited non-resonantly at $\lambda_{ex}$≈535 nm.

Figure 20C:
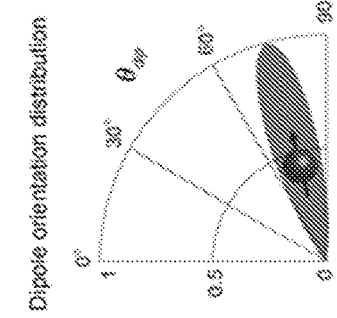
FIG. 20C depicts angular distribution of Ru dye transition dipole moments in the polymer film as determined from angle and polarization resolved fluorescence measurements.
Figure 20D:
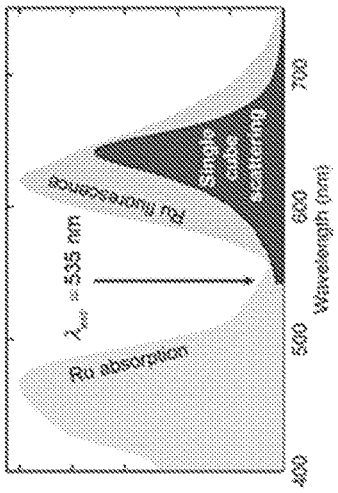
FIG. 20D is a graph showing simulated quantum efficiency for emitters at varying distances away from the gold film in the NPA with an 8 nm gap.
Figure 20E:
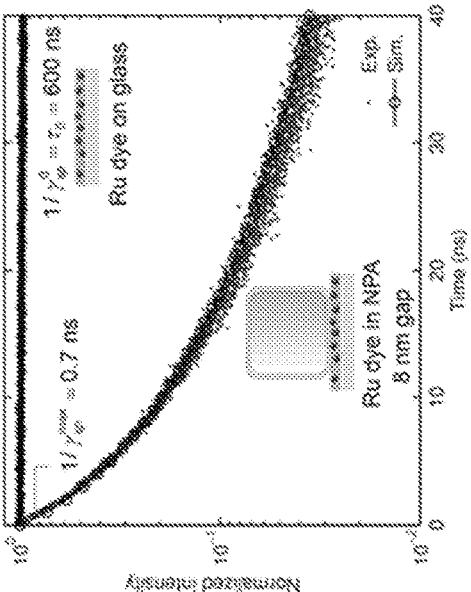
FIG. 20E is a graph showing a comparison of the measured time-resolved fluorescence decay for Ru dye on glass and Ru dye enhanced by a single nanoantenna having a d=8 nm gap (The intrinsic lifetime of the Ru dye on glass is $1/\gamma_{sp}^0$=600 ns. In the nanoantenna, a fast non-exponential decay in fluorescence is observed, with a minimum lifetime of $1/\gamma_{sp}^{max}$=0.7 ns.)

FIG. 20E shows the time-resolved emission from a single NPA with a d=8 nm gap after non-resonant pulsed excitation at $\lambda_{ex}$=535 nm. The emission shows a non-exponential decay with an initial rate at t=0 of $\gamma_{sp}^{max}$=1/0.7 ns$^{-1}$, corresponding to a maximum spontaneous emission rate enhancement, also called the Purcell enhancement, of $\gamma_{sp}^{max}/\gamma_{sp}^0$=860. The slower decay rates contributing to the emission result from the spatial dependence of the rate enhancement (FIG. 19E). Similar results were obtained for 9 other NPAs. The distribution of emission rate constants is extracted by fitting the time-resolved fluorescence to a stretched exponential and then decomposing the fit function into a sum of rate constants by performing a Laplace transform (FIGS. 6 and 7). The extracted distribution shows that a fraction of Ru molecules is optimally positioned, with $\gamma_{sp}^{max}/\gamma_{sp}^0$ approaching 1000, while the most likely enhancement from the NPA is $\gamma_{sp}^*/\gamma_{sp}^0$=60 (FIG. 20E). It is noted that other fit functions for the time-resolved fluorescence produced slightly different rate distributions (FIG. 8). However, the choice of function does not affect the maximum rate enhancement which is obtained from the slope of the fluorescence decay at t=0.

An important parameter in correctly simulating the optical response of the NPA is the orientation of the emitter transition dipoles relative to the gap mode electric field. However, in many plasmon enhanced fluorescence studies the dipole orientation distribution is assumed to be isotropic or to have an optimal orientation. Here, the distribution of dipole orientations may be determined by angle and polarization resolved measurements of Ru dye embedded in a polymer film (FIGS. 12-16). The measurements reveal that most emission dipoles are oriented at 75° relative to surface normal (FIG. 20C). In FIG. 20C, most dipoles were found to be nearly parallel to the gold surface, $\theta_{dip}$=75°, where 0° corresponds to surface normal. While this orientation reduces the maximum rate enhancements that are observed, this feature is specific to the Ru dye in these polymer films, and in general, the emitter orientation can be engineered through suitable chemical means. Furthermore the simulations show that the QE depends on the vertical position of the emitters in the gap, with emitters close to the gold surface experiencing increased nonradiative quenching (see FIG. 20D).

The simulated temporal decay curves are obtained by assuming that dipoles are distributed uniformly in the plane of the gap and in the top 2 nm of the spacer polymer film. The emission from a dipole at position r and angle θ is $$I(r,\theta,t) \propto \gamma_r(r)\exp[-\gamma_{sp}(r)\cos^2\theta t]. \tag{30}$$

Figure 20F:
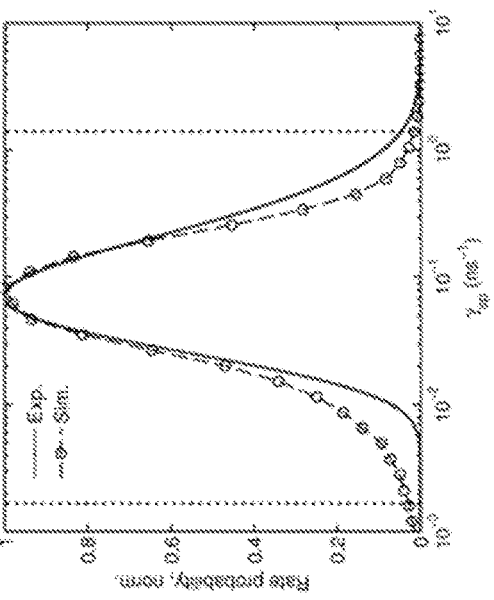
FIG. 20F is a graph showing experimental and simulated distribution of Ru dye emission rates $H(\gamma_{sp})$ from the NPA (experimental distribution is obtained from a fit of the time-resolved fluorescence to a stretched exponential)

After incorporating the distribution of emission dipoles and performing spatial averaging, the predicted temporal emission decay curve and the emission rate distribution were found to be in excellent agreement with experiments (FIGS. 20E and 20F). Other than normalization, no fit parameters were used to obtain the simulated time-resolved decay curve and rate distribution.

To probe the mechanisms and demonstrate control of emission rate enhancement, the gap thickness is tuned from d=5 to 15 nm. FIG. 21A shows time-resolved emission from a single representative nanocube for each of four gap thicknesses. A non-exponential decay is observed for all samples, with a strong increase in emission rate with decreasing gap thickness. The simulated decay curves, obtained as described earlier, show excellent agreement with experiment. From the experimental emission rate distributions (see FIG. 21B), three measures of emission rate enhancement as a function of gap thickness were obtained along with the simulated values (see FIG. 21C). The maximum Purcell enhancement $\gamma_{sp}^{max}/\gamma_{sp}^0$ shows a strong dependence on gap thickness, increasing to ~2000 for the d=5 nm gap. These values are smaller than the simulated situation in FIG. 19E in which the dipoles are vertically oriented. The mostly likely rate enhancement $\gamma^*_{sp}/\gamma_{sp}^0$ shows similar trends to the maximum rate enhancement, but at lower values due to the non-optimal position of most emitters in the NPA.

The observed large emission rate enhancements are only desirable if the QE remains high. In general, it can be difficult to distinguish radiative enhancement from metal quenching because experimentally only the total emission rate is accessible directly. This ambiguity can be resolved by extracting the QE of the NPA from measurements of the time-integrated emission along with simulations. To obtain the QE, first the fluorescence enhancement factor was defined relative to dipoles on glass $$EF = \frac{\eta}{\eta_0} \frac{\gamma_{ex}(r,\theta)}{\gamma_{ex}^0(\theta)} \frac{QE(r)}{QE_0} \tag{31}$$

where η is the emission collection efficiency, and $\gamma_{ex}$ is the excitation rate. Each of these values for the NPA is normalized by the same quantity calculated for equivalent dipoles on glass (FIGS. 10-11). FIGS. 22A and 22B show how the excitation rate enhancement and QE vary with gap thickness. The excitation rate enhancement is modest due to the nonresonant excitation and increases with decreasing gap size. The simulated QE remains high for a wide range of gap thicknesses greater than 6 nm, well above the intrinsic efficiency of the Ru dye $QE_0$=0.2, taken as a typical quantum efficiency of fluorescent dyes. Furthermore, the QE at the position of highest emission rate enhancement, $r_{max}$, is also high, pointing to the possibility of integrating single emitters with the NPA. Notably, due to the large emission rate enhancements, large enhancements in the radiative rate are possible even for embedded emitters with an intrinsically low QE.

Using the predicted collection efficiency of the NPA emission (FIG. 19D) (84%) and the emission from dipoles on glass (15%) (FIG. 11) the average EF is obtained (see FIG. 22C). To obtain experimental values for ⟨EF⟨, the ratio of emission from the NPA and the Ru-polymer films on glass was measured, normalized by the emissive area from each sample. The experimental EF, measured for ~10 NPAs for each sample, shows excellent agreement with simulations without any fitting parameters. The variation in emission intensity between NPAs is likely due to non-uniform distribution of Ru dye molecules in the polymer film because similar spot-to-spot variation was observed in the control sample emission. The accurate prediction of ⟨EF⟨ along with the accurate prediction of the emission decay rates (see FIGS. 21A-21C) provides direct validation that the radiative efficiency of the NPA is high and well-described by the simulations in FIG. 22B. Having established the accuracy of the simulated QE of the system, the critical parameter of radiative rate enhancement can be determined. It was found that due to the high QE, the maximum radiative rate enhancement is $\gamma_r^{max}/\gamma_r^0 \approx 1000$ for gaps d≤8 nm is higher than $\gamma_{sp}^{max}/\gamma_{sp}^0$ for gaps d≥7 nm (FIG. 22C). For gaps d<7 nm quenching of the dye emission by the metal becomes a significant loss mechanism.

The nanopatch antenna described here is a flexible platform for enhancement of radiative properties with high efficiency and directionality. While the present work purposefully utilized emitters with slow intrinsic lifetime, the rate enhancement of the NPA is independent of the intrinsic rates. Other short lifetime and photostable emitters, such as quantum dots and crystal color centers, can readily be integrated into the gap of the NPA. Furthermore by optimal positioning and orientation of the emitter dipoles via chemical or other means, even larger rate enhancements are possible. For example, a vertically oriented dipole near the corners of the nanocube will experience a rate enhancement of 10,000, which for an emitter with a 10 ns intrinsic lifetime will produce THz frequency operation. Furthermore, the NPA is a natural candidate to be used as an efficient single photon source or more generally as a fast nanoscale directional emitter.

Finite-element simulations are used to calculate the scattering signature of the NPA and the electric field distributions induced at the nanogap both at excitation (535 nm) and resonant (650 nm) frequencies. The scattered-field formulation was employed, which uses the analytical solution for an incident plane wave in the absence of the nanocube as the background field. The Ru dye was modeled as a monochromatic point-dipole emitting at $\lambda_{sp}$=650 nm. The Green's function of the system, from which the local density of states, spontaneous decay rate and radiative quantum efficiency can be derived, is evaluated by varying the position of the dipole emitter on a discrete 15×15 grid placed beneath the nanocube. The surface formed by this array was placed in different positions along the z-axis inside the spacer layer in order to take into account in our calculations the entire volume of the nanogap. The radiative quantum efficiency (QE) is obtained by calculating the total decay rate $\gamma_{sp}$ of the dipole from the Green's function (Eqs. (28) and (29)) and calculating the nonradiative decay rate by integrating all metal losses over the volume of the NPA. The radiative QE is then given by $QE=1-\gamma_{nr}/\gamma_{sp}$.

Figure 9:
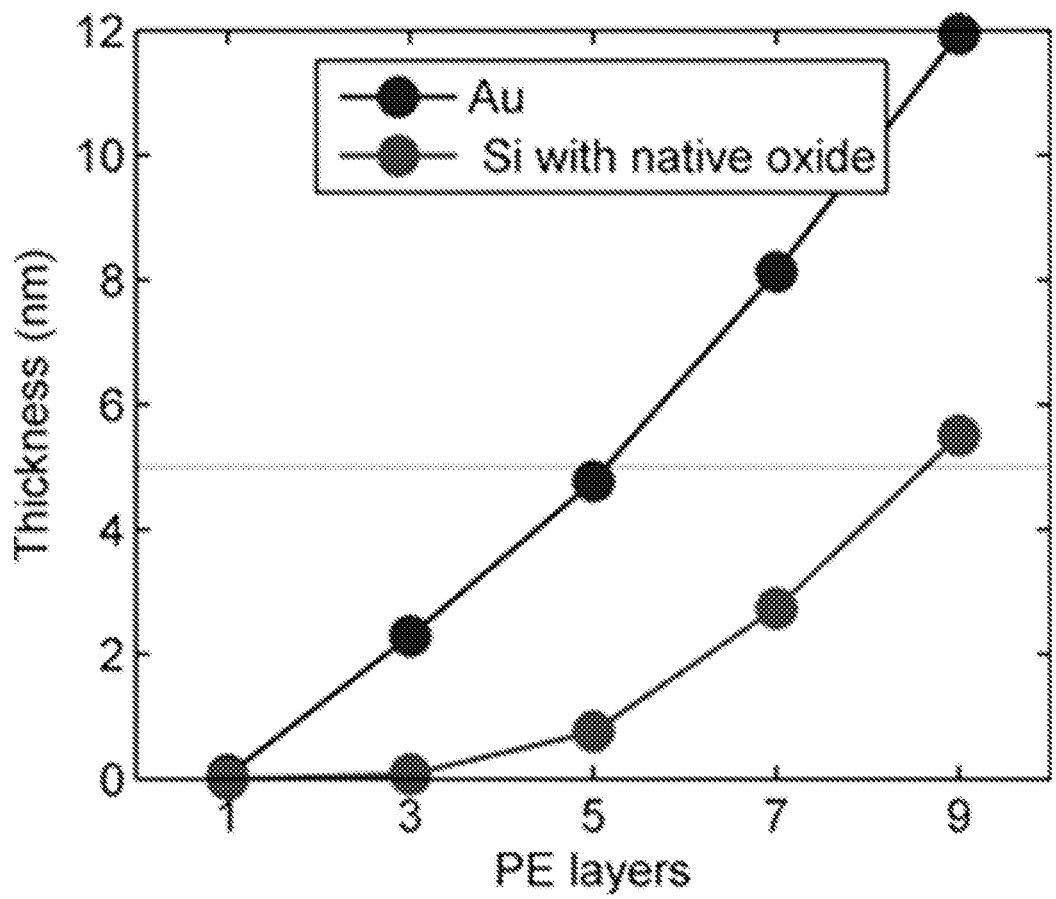
FIG. 9 is a graph showing thickness of PAH/PSS polymer film as a function of number of PE layers on a Si with native oxide surface (lower line) and on a gold surface (upper line) measured by ellipsometry (the PE layer number is defined as the total number of polymer solution dips, including PAH and PSS)

The NPA samples are fabricated on 100 nm thick template stripped gold substrates (Platypus Technologies). Immediately after separation from the template, the polymer spacer layer is grown on the gold substrate by immersion in a cationic solution of 3 mM poly(allyamine) hydrochloride (PAH) and 1 M NaCl for 5 minutes followed by immersion in an anionic solution of 3 mM poly(styrenesulfonate) (PSS) and 1 M NaCl for 5 minutes. The samples are rinsed with a 1 M NaCl solution between successive layers. A 5 nm polymer layer is obtained from 5 polymer layers (terminating with PAH) as measured by spectroscopic ellipsometry, with other gap thicknesses shown in Table 2. The polymer films are immersed for 5 minutes in a 1.8 mM aqueous solution of the Ru dye [(Bis (2,2'-bipyridine)-4,4'-dicarboxybipyridine-ruthenium di(N-succinimidyl ester) bis (hexafluorophosphate)] (Sigma-Aldrich), followed by a thorough water rinse. Control samples for the fluorescence enhancement measurements (FIG. 21C) are grown using the above procedure, but on a glass substrate. The correspondence between polymer film thickness on Au and glass substrates is shown in FIG. 9. Nanocubes are not deposited on the glass control sample.

Silver nanocubes were chemically synthesized using previously described methods. The resulting nanocubes have a corner radius of ~8 nm as determined from transmission electron microscopy, and a 3 nm thick coating of polyvinylpyrrolidone (PVP) (FIG. 21C), which is a result of the synthesis procedure. Nanocubes are separated from other nanoparticles by centrifugation at 8500 RPM, followed by resuspension in water and a 1:100 dilution. A 25 µL drop of the nanocube solution is spread over the surface of the Ru-polymer film with a coverslip and incubated for 5 minutes. The negatively charged nanocubes electrostatically bind to the positively charged top polymer layer (PAH). After incubation, the non-adhered nanocubes are removed with a water rinse and the sample is dried with nitrogen. The final nanocube surface density is ~0.01 $\mu m^{-2}$. Samples are measured within two days of fabrication to avoid silver oxidation and are stored in a vacuum chamber when not being measured.

Samples are measured using a custom-built fluorescence microscope (FIG. 17). Individual NPAs are identified by dark field imaging and spectroscopy to select only those NPAs with a resonance of $\lambda_{sp}$=620 650 nm. White light is coupled into the collar of a 100×, NA=0.9 dark field objective. Light scattered by the nanoparticles is collected by the same objective and imaged onto a charge-coupled device (CCD) camera. Individual NPAs are positioned in the center of the field of view and the scattered light from the particle is imaged onto a CCD spectrograph. A pinhole aperture at an intermediate image plane is used to select light only from the NPA of interest.

Once identified, time-resolved fluorescence emission from individual NPAs is measured in an epifluorescence configuration using time-correlated single photon counting. The excitation source is a Ti:Sapphire laser with an optical parametric oscillator, producing 200 fs pulses at $\lambda_{ex}$=535 nm at a repetition rate of 80 MHz. The laser beam is passed through an electro-optic pulse picker to reduce the repetition rate to 20 MHz, followed by a 550 nm shortpass filter. The beam is then coupled into a single mode optical fiber and collimated at the output, producing a Gaussian beam. The light is directed into the objective lens via a beamsplitter, filling the back aperture of the objective. The resulting focal spot is near diffraction limited with a full width at half maximum of 350 nm. Emission from the NPA, which is positioned in the center of the laser spot, is collected through the objective, passes through two 600 nm longpass filters to remove the excitation laser, and imaged onto a single-photon counting avalanche photodiode (APD). The APD is connected to a timing module which assembles a histogram of photon arrival times. The temporal resolution of the system is ~35 ps (FIG. 5). All measurements were done at an average power incident on the sample of 100 nW. Based on the dependence of emitted intensity as a function of excitation power, it was concluded that measurements of all samples are done in the linear (unsaturated) regime (FIG. 18).

Figure 23:
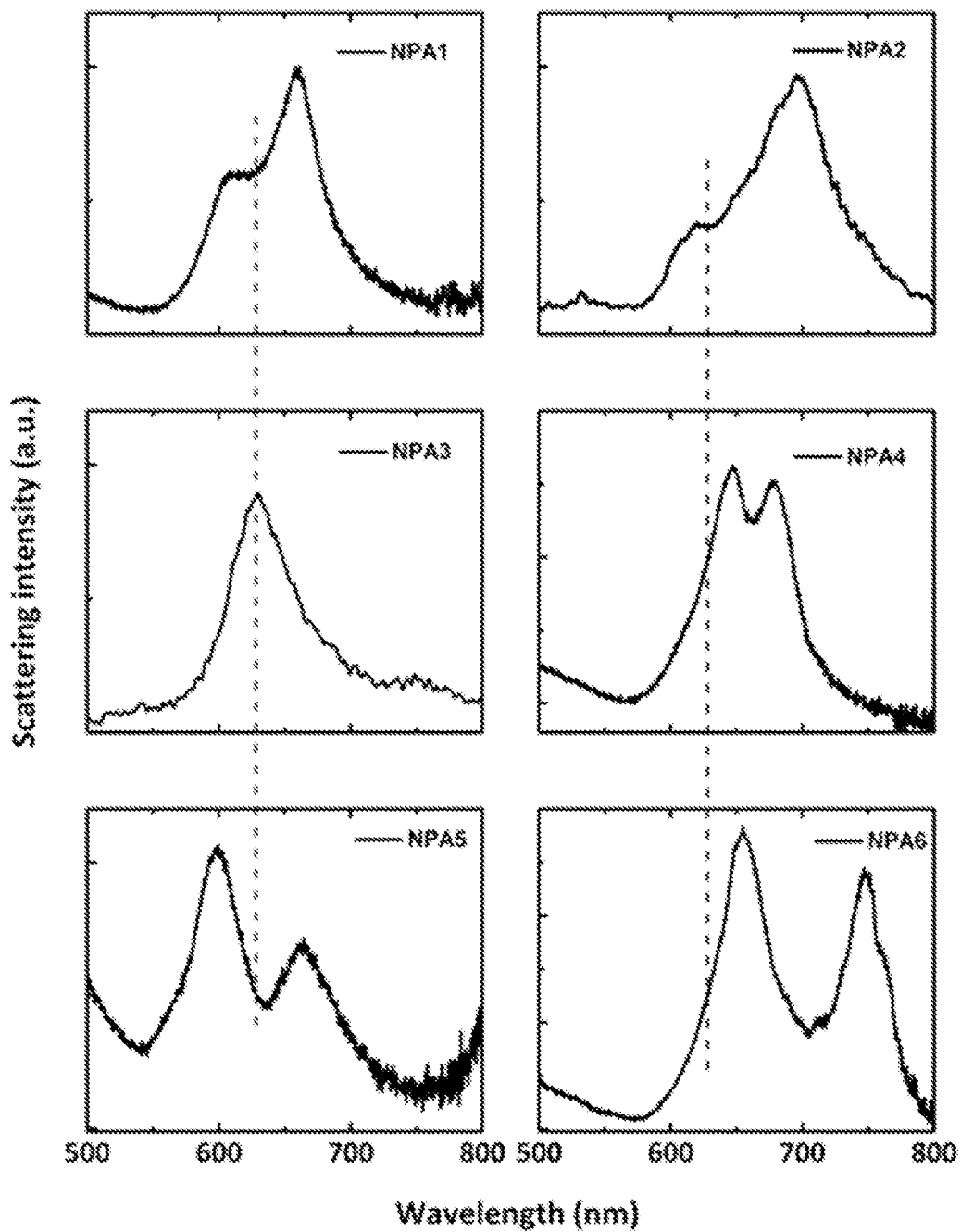
FIG. 23 are graphs showing scattering spectra from several nanopatch antennas with the presence of quantum dots in the gap region.

FIG. 23 illustrates graphs showing scattering spectra from several nanopatch antennas with the presence of quantum dots in the gap region. The QD emission wavelength is indicated by the dashed lines.

Figure 24:
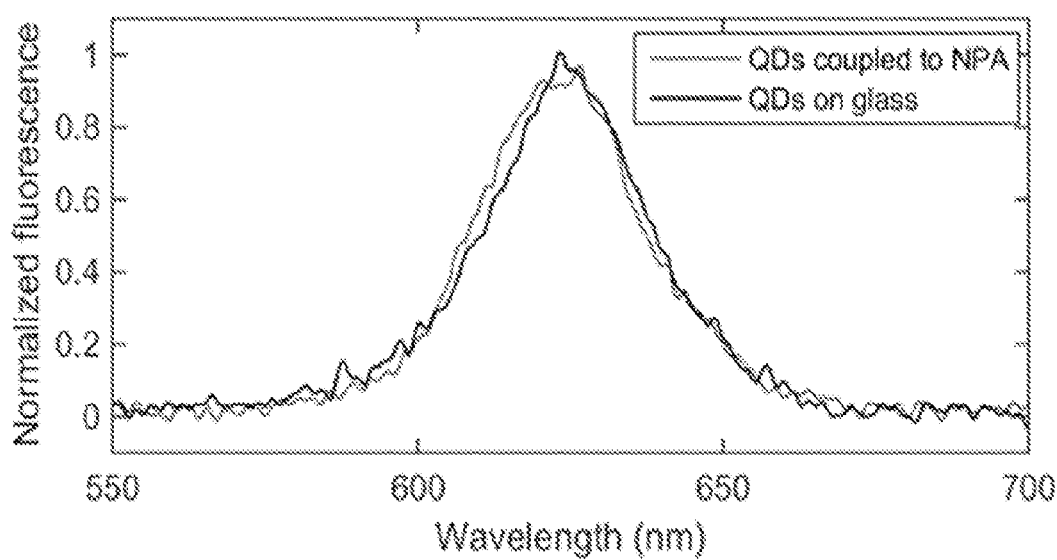
FIG. 24 is a graph showing comparison of normalized fluorescence spectrum from QDs on glass and QDs coupled to the NPA, showing that it is unmodified.

FIG. 24 is a graph showing comparison of normalized fluorescence spectrum from QDs on glass and QDs coupled to the NPA, showing that it is unmodified.

FIG. 25 is an SEM image of a sample containing a single nanocube and CdSe/ZnS QDs (light small dots), similar to the samples used for the optical experiments. The image was taken within a few seconds after the area was exposed to the electron beam to avoid charging of the QDs, the nanocube, and the polyelectrolyte (PE) layers.

FIGS. 26A-26C depict field enhancement maps in the nanogap region for an excitation wavelength of 535 nm for the x, y, and z field components. The white dashed line indicates the lateral extent of the nanocube.

Here it is discussed whether the mode splitting in the scattering spectrum observed with QDs coupled to the nanoantennas can be attributed to strong coupling. To estimate the coupling energy (Rabi splitting) between the QDs and the nanocavity mode, the following expression is used:

$$\Delta F_0 = \hbar g = \vec{\mu} \cdot \vec{E}_{vac} \qquad (32)$$

where $\Delta E$ is the coupling energy, g is the coupling rate, µ is the dipole moment for a single QD, and $E_{vac}$ is the vacuum electric field. The dipole moment for a single epitaxial QD may be µ=29 D. Here, the approximation that the colloidal QDs have a transition dipole moment of a similar magnitude. This assumption is supported by the similar magnitude of the absorption cross-section that has been measured for colloidal QDs ($\sigma$=1.1×10$^{-14}$ cm$^2$) and for epitaxial QDs[4] ($\sigma$=4×10$^{-15}$ cm$^2$). The vacuum electric field in a cavity of mode volume $V_m$ is $$E_{vac} = \sqrt{\frac{hc}{2\lambda V_m n^2 \varepsilon_0}} \qquad (33)$$

where $\lambda$ is the wavelength of light, n is the refractive index of the cavity region, and $\varepsilon_0$ is the vacuum permittivity. The cavity mode volume is estimated based on the geometrical dimensions of the nanocube cavity given by $V_m$=75 nm×75 nm×10 nm=5.6×10$^{-5}$ µm with a refractive index of n=1.5. This estimate of the cavity mode volume is consistent with the volume obtained from the Purcell factor formula F=4/$3\pi^2(\lambda/n)^3(Q/V_m)$, which gives $V_m$=2.3×10$^{-5}$ µm. From Eqs. (32) and (33) and the geometrical volume, a single QD coupling energy of $\Delta E_0$=7 meV was found. As the number of coupled dipoles N is increased, the coupling energy follows the relationship $\Delta E = \sqrt{N} E_0$. Based on transmission electron microscopy (TEM) analysis, a typical nanocube is coupled to ~10 QDs. Hence, coupling energy may be expected to be $\Delta E$=22 meV. At $\lambda$=650 nm, this corresponds to a splitting of $\Delta\lambda$=7 nm, which is much smaller than the linewidth of the cavity mode (~50 nm corresponding to $\Delta E_{cav}$=150 meV) and the linewidth of the QD ensemble exciton absorption (~35 nm corresponding to $\Delta E_{QD}$=100 meV). Therefore, the conditions for strong coupling are not satisfied in our experiment and the system operates in the weak coupling regime, making application of the Purcell effect valid.

To reach the regime of strong coupling in the future, such that $\Delta E \geq \Delta E_{cav}$, ~450 QDs would need to be coupled to a single nanocavity. The volume of the nanocavity dimensions allow for a maximum of only ~150 QDs to be coupled assuming a close-packed single layer. Therefore, it is believed that reaching strong coupling may not be possible with the current geometry and QD materials.

As experimental verification that our system is in the weak coupling regime, it was found that the emission spectrum of the QDs is not modified when coupled to the NPA, as seen in FIG. 24. This is in contrast to the behavior observed, for example, for J-aggregates coupled to a plasmonic structure, in which the fluorescence spectrum is strongly modified under conditions of strong coupling.

FIG. 27 depicts a schematic of a photodetector structure including an ultrathin silicon layer integrated into a nanogap of a nanopatch antenna in accordance with embodiments of the present disclosure. Referring to FIG. 27, the band diagram shows the Schottky barrier that is formed between the gold film and the silicon. Hot electrons are generated in the gold film from plasmon decay. The hot electrons then diffuse over the Schottky barrier which results in photocurrent generation.

Figure 28:
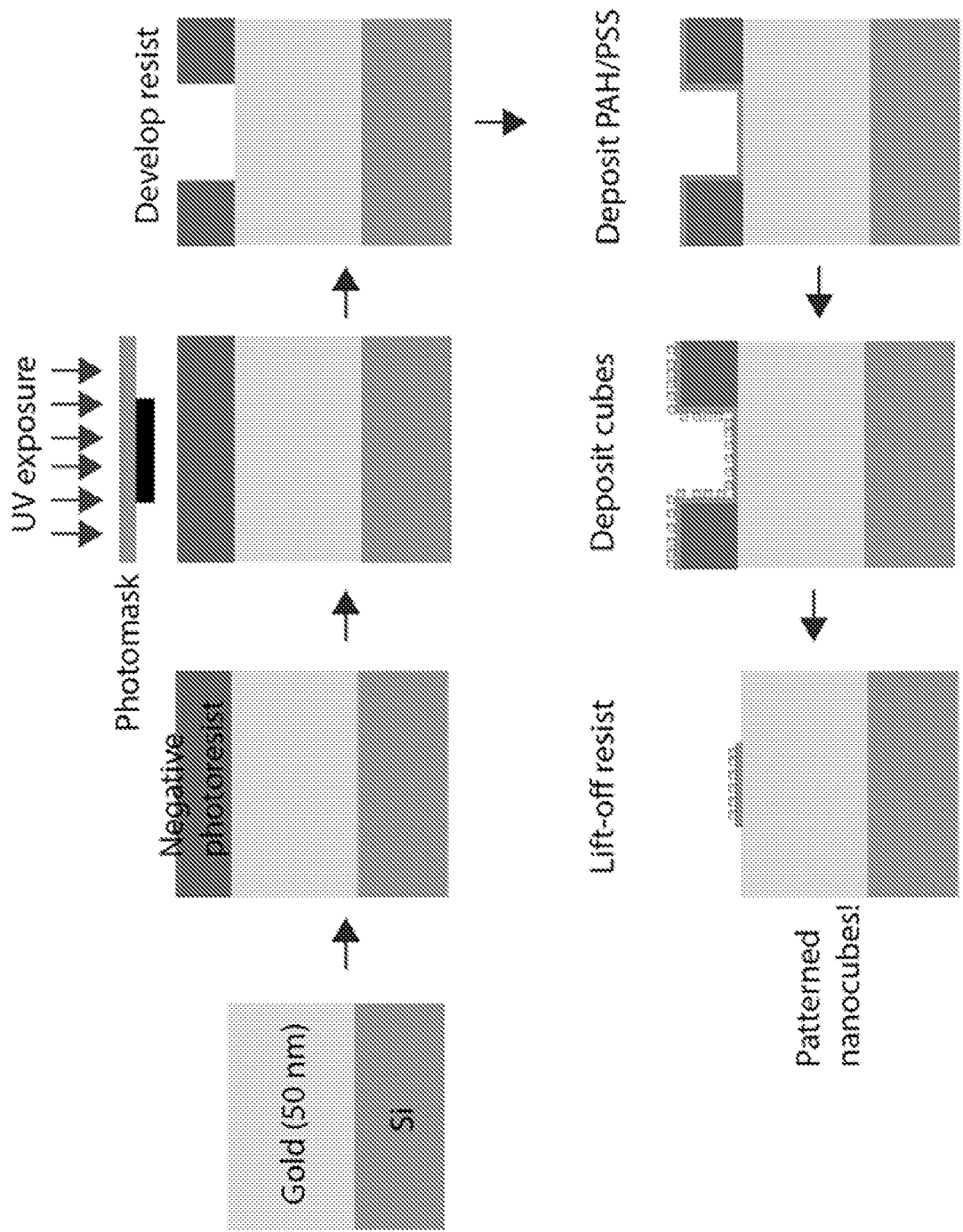
FIG. 28 shows an example fabrication process for patterning regions of nanocubes on the planar metal film.

FIG. 28 illustrates an example fabrication process for patterning regions of nanocubes on the planar metal film.

Figure 29A:
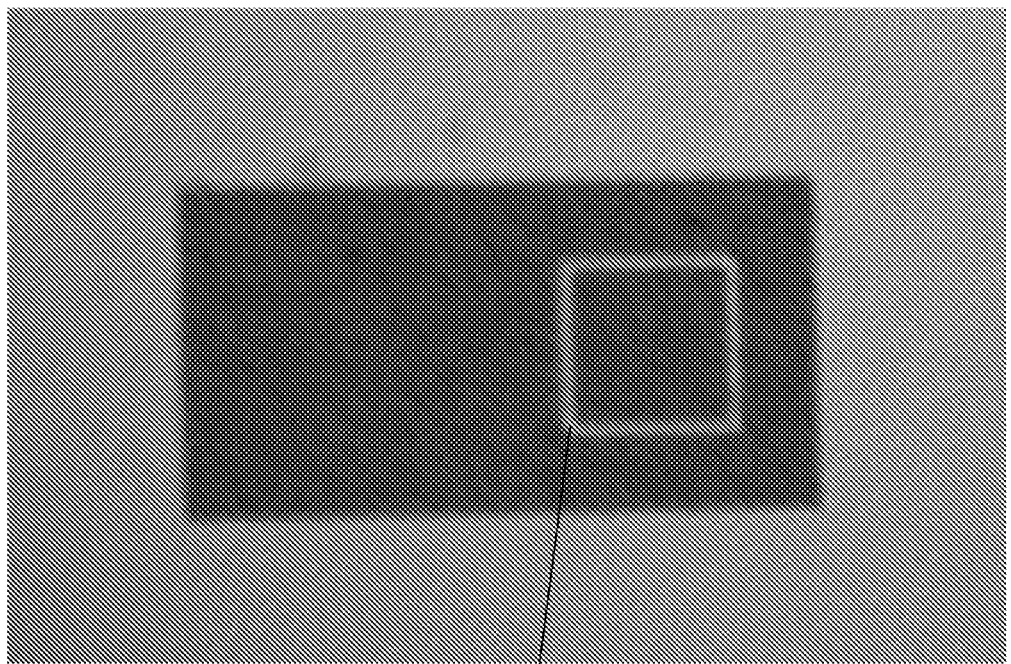
FIG. 29A is an optical microscope image of a ~100 μm region of nanopatch antennas, fabricated using the method described in FIG. 30.
Figure 29B:
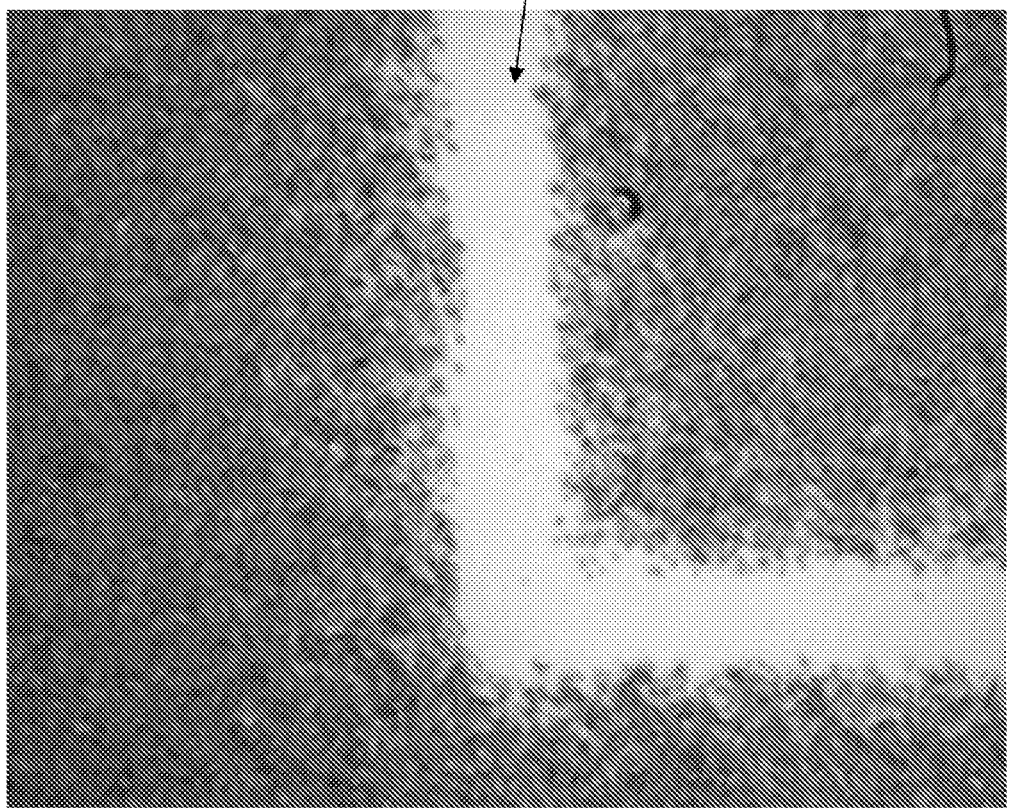
FIG. 29B is a higher-magnification image of the same area, showing a 5 μm-wide feature between nanocube patterned regions.

FIGS. 29A and 29B are SEM images of nanopatch antennas in accordance with embodiments of the present disclosure. Particularly, FIG. 29A shows a top view of a nanocube, and FIG. 29B shows a close-up view of a portion of the nanocube.

FIG. 30A illustrates a side cross-sectional view of a nanopatch antenna in accordance with embodiments of the present disclosure. Referring to FIG. 30A, the silver nanocube is spaced with GST and spaced between about 2-10 nm from a gold film. FIG. 30B depicts schematic of the atomic structure of the chalcogenide phase-change material that is embedded in the gap region. Referring to FIG. 30B, the phase-change material can be switched between the amorphous and crystalline phases using thermal, optical, or electrical excitation. FIG. 30C is a graph of the simulated scattering resonance of the nanopatch antenna with the gap material in the amorphous and crystalline phases. FIG. 30D is a graph of experimental scattering resonance of the nanopatch antenna with the gap material in the amorphous and crystalline phases.

Figure 31A:
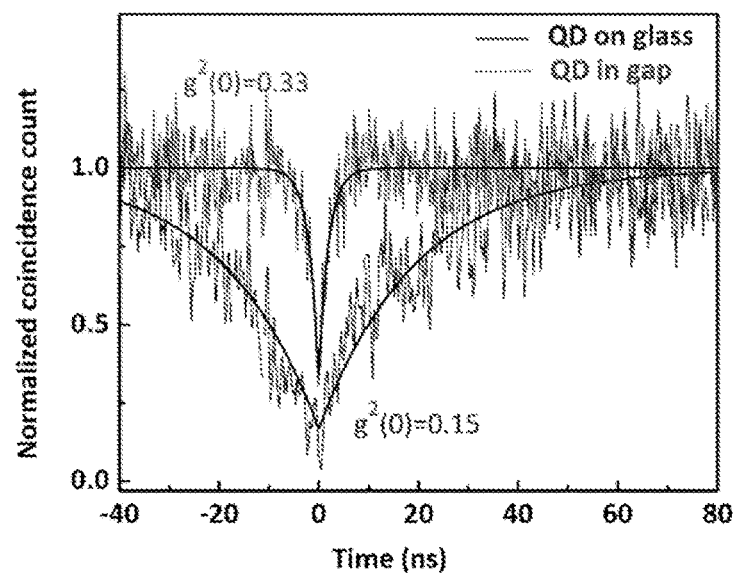
FIG. 31A is a graph showing the second-order temporal correlation function for emission from a nanopatch antenna with a single embedded quantum dot and for emission from a single quantum dot on glass.
Figure 31B:
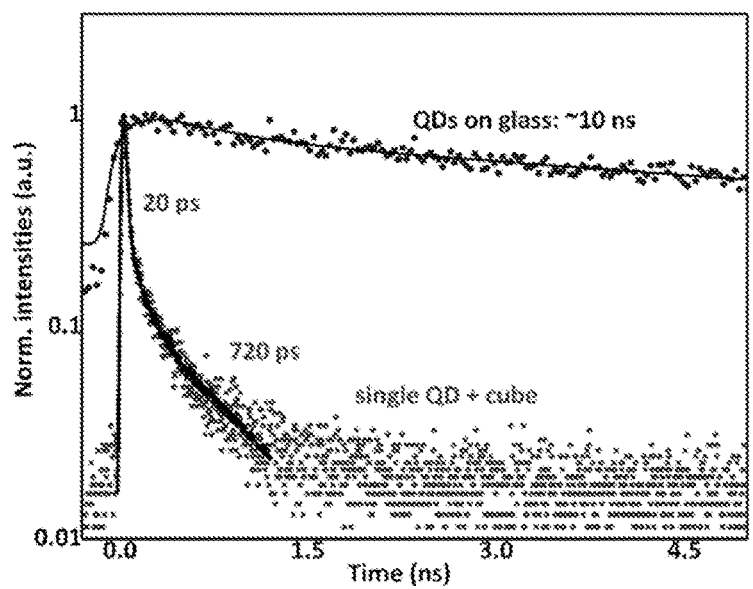
FIG. 31B is a graph showing the emission decay lifetime from a nanopatch antenna with a single embedded quantum dot and for emission from a single quantum dot on glass.
Figure 31C:
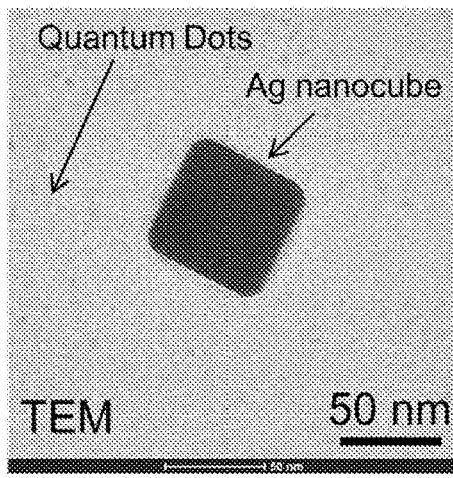
FIG. 31C is a TEM image of a nanocube and quantum dots in accordance with embodiments of the present disclosure.

FIG. 31A is a graph showing the second-order temporal correlation function for emission from a nanopatch antenna with a single embedded quantum dot and for emission from a single quantum dot on glass. FIG. 31B is a graph showing the emission decay lifetime from a nanopatch antenna with a single embedded quantum dot and for emission from a single quantum dot on glass. FIG. 31C is a TEM image of a nanocube and quantum dots in accordance with embodiments of the present disclosure.

Figure 32:
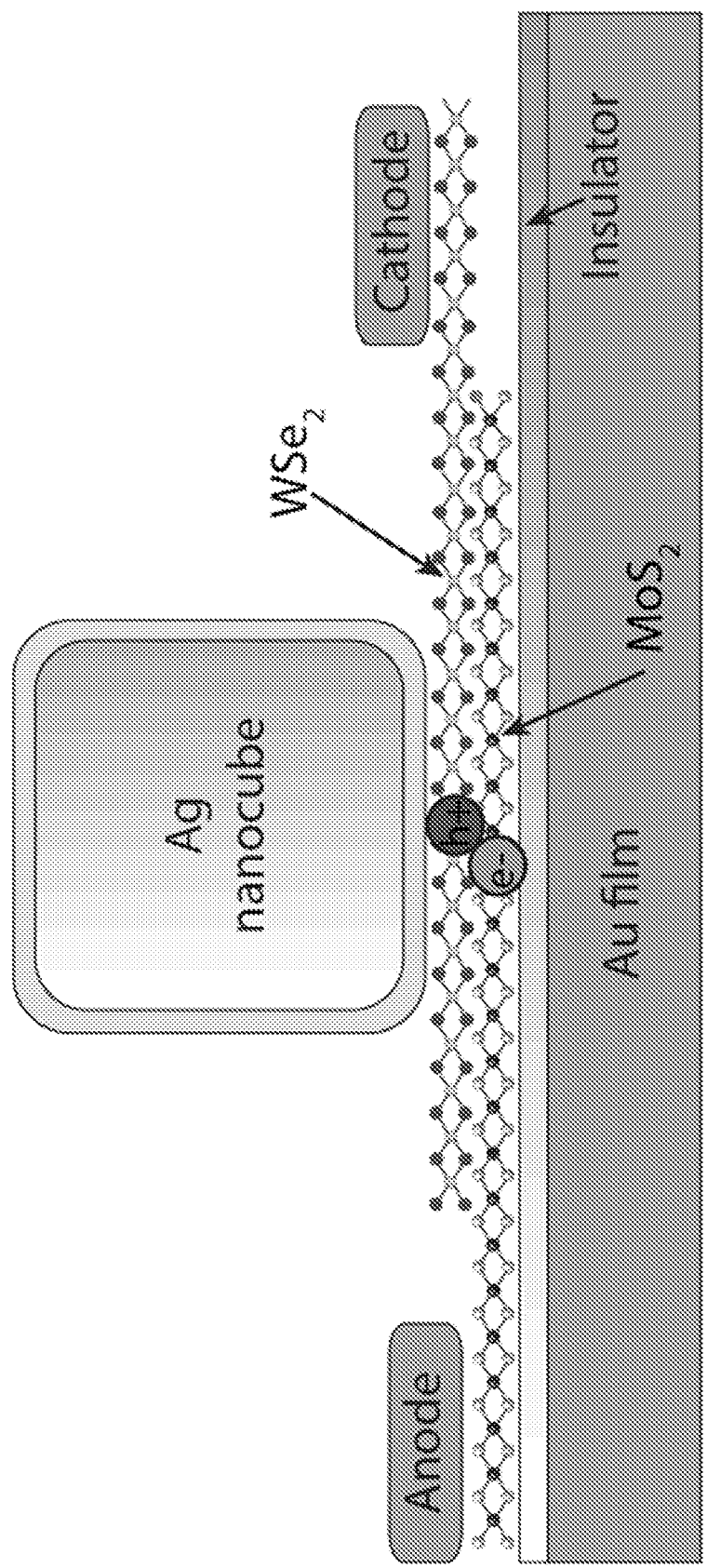
FIG. 32 is a side cross-sectional view of a nanopatch antenna embedded with a van der Waals heterostructures in accordance with embodiments of the present disclosure.

FIG. 32 illustrates a side cross-sectional view of a nanopatch antenna embedded with a van der Waals heterostructures in accordance with embodiments of the present disclosure. The structure can be excited electrically by injecting electrons and holes into the gap materials.

FIG. 33A is a perspective view of a nanopatch antenna which is undergoing lasing action in accordance with embodiments of the present disclosure. FIG. 33B is a side view of the nanopatch antenna shown in FIG. 33A, embedded with a lasing gain medium in the gap region.

Figure 34:
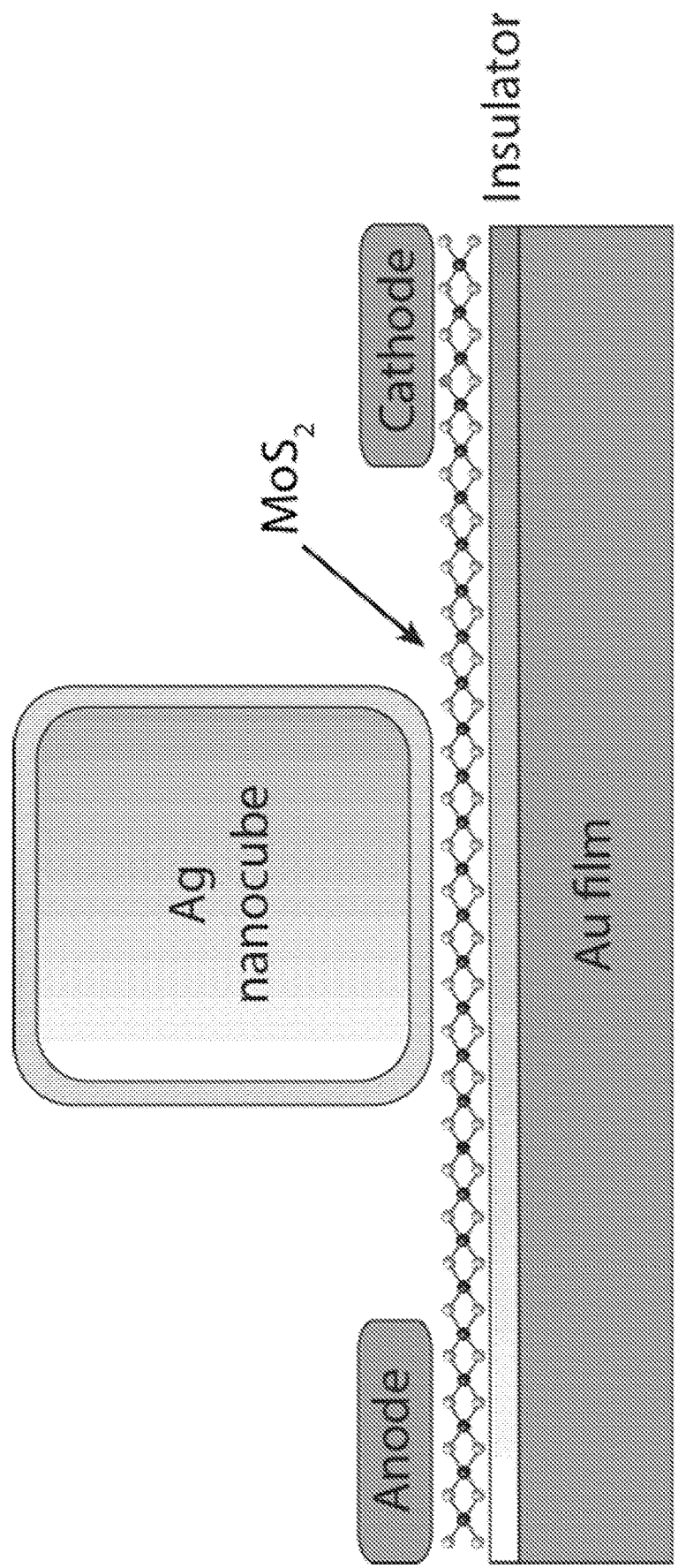
FIG. 34 is a side cross-sectional view of a nanopatch antenna embedded with a two-dimensional semiconducting monolayer in accordance with embodiments of the present disclosure.

FIG. 34 illustrates a side cross-sectional view of a nanopatch antenna embedded with a two-dimensional semiconducting monolayer in accordance with embodiments of the present disclosure.

Figure 35:
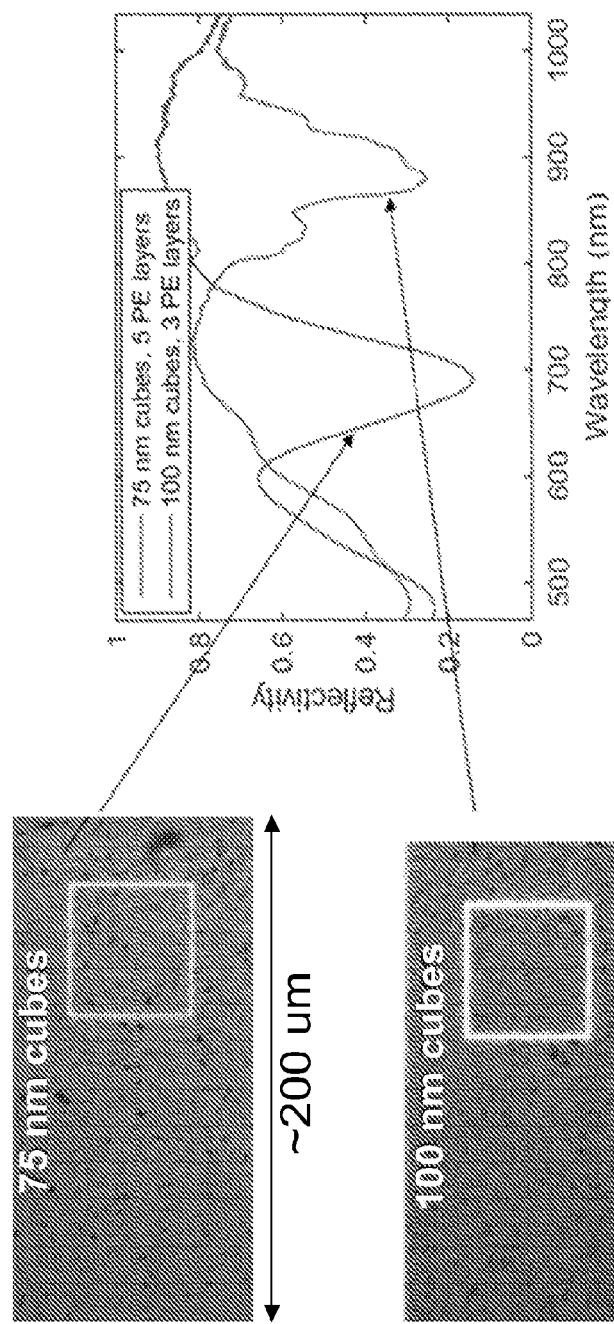
FIG. 35 is an optical microscope image of two patterned regions each containing nanocubes with a different resonance, as shown in the graph.

FIG. 35 depicts an optical microscope image of two patterned regions each containing nanocubes with a different resonance, as shown in the graph. These regions were formed using the method described in FIG. 28.

Figure 36A:
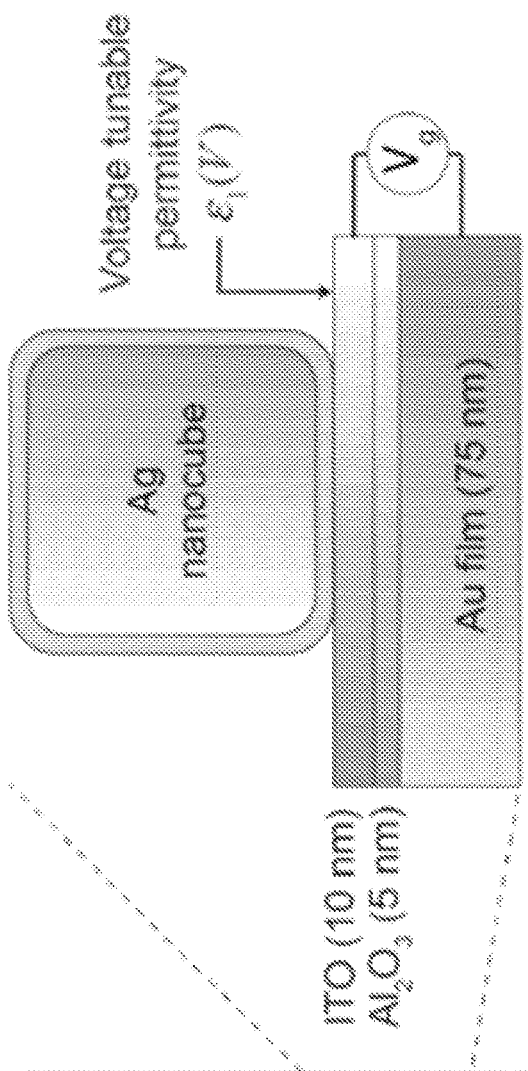
FIG. 36A is schematic image of a perspective view of example nanopatch antennas covering a curved surface in accordance with embodiments of the present disclosure.
Figure 36B:
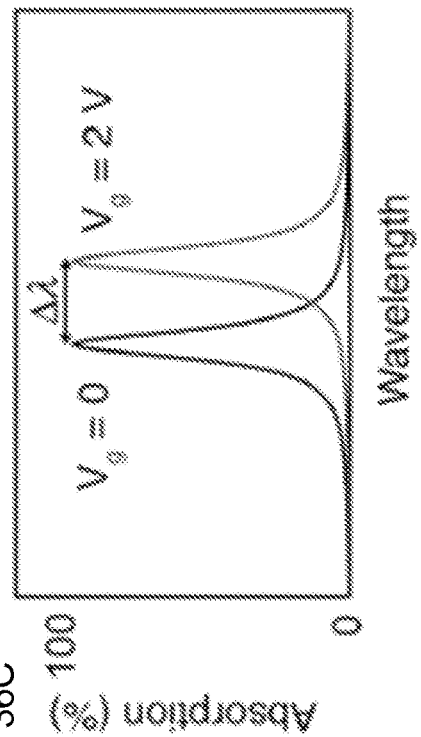
FIG. 36B illustrates a side cross-sectional view of one of the nanopatch antennas shown in FIG. 36A integrated with a material that changes its dielectric constant under applied voltage.
Figure 36C:
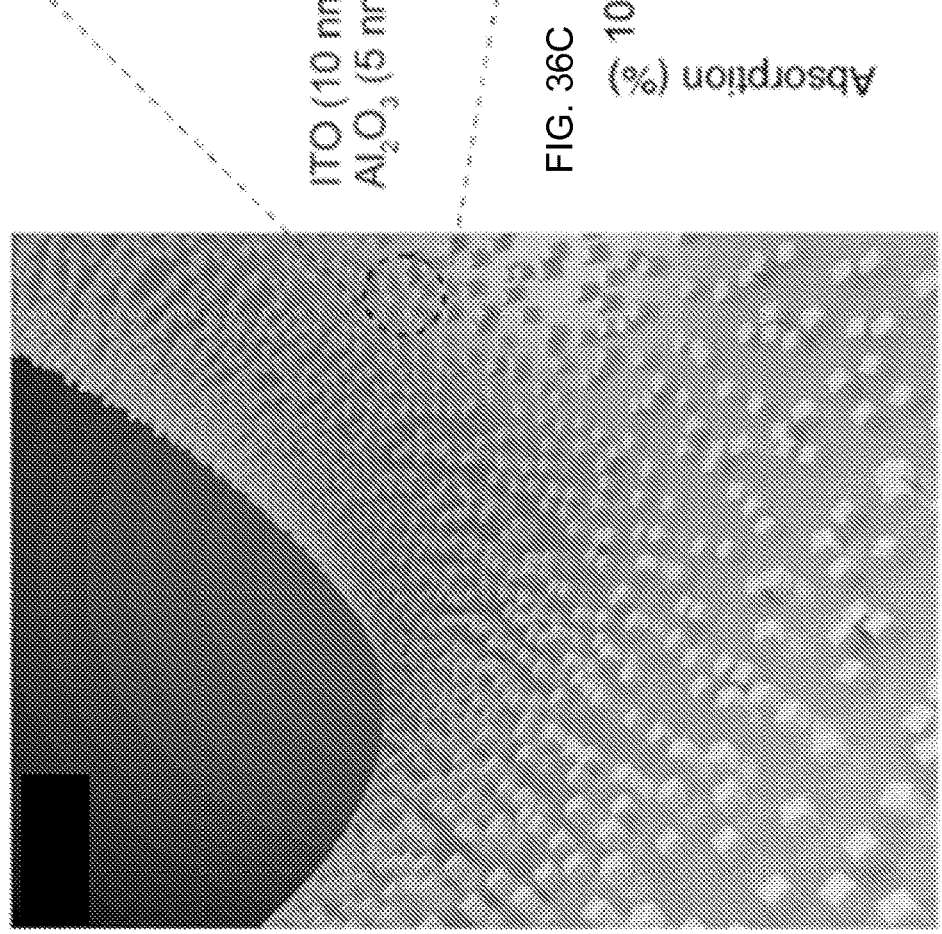
FIG. 36C illustrates a graph of the changing absorption spectrum of the surface covered with nanopatch antennas under applied voltage.

FIG. 36A is an image of a perspective view of example nanopatch antennas in accordance with embodiments of the present disclosure. FIG. 36B illustrates a side cross-sectional view of one of the nanopatch antennas shown in FIG. 36A. FIG. 36C illustrates a graph of the changing absorption spectrum of the surface covered with nanopatch antennas under applied voltage.

Figure 37A:
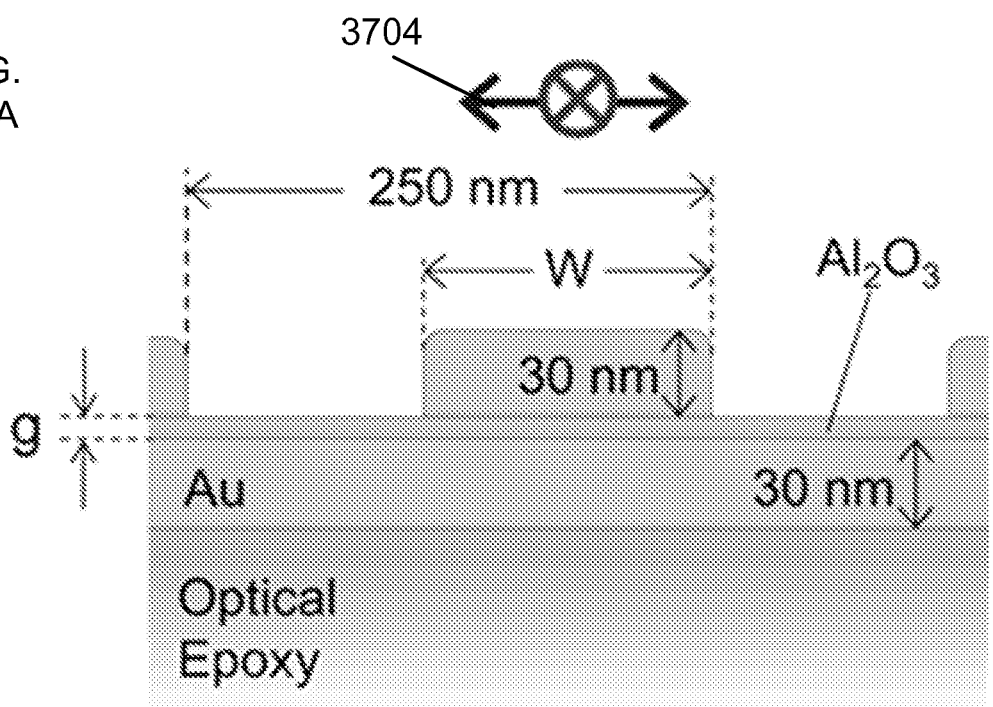
FIG. 37A depicts a side cross-sectional view of an example plasmonic stripe geometry in accordance with embodiments of the present disclosure.
Figure 37B:
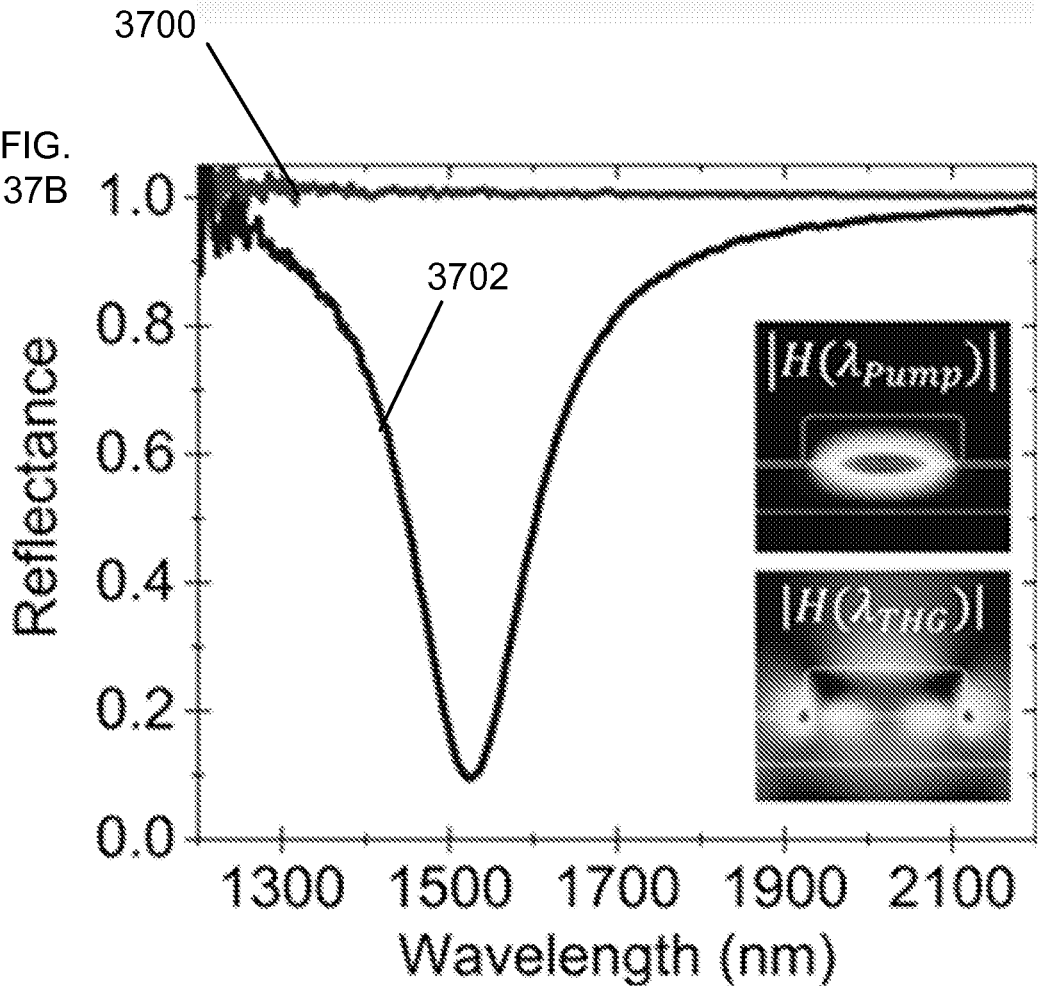
FIG. 37B illustrates a graph showing representative polarized reflectance spectra of the thinnest gap sample.

FIG. 37A depicts a side cross-sectional view of an example plasmonic stripe geometry in accordance with embodiments of the present disclosure. FIG. 37B illustrates a graph showing representative polarized reflectance spectra of the thinnest gap sample (g=2.83 nm). Line 3702 represents spectra taken with incident light polarized according to arrows 3704 shown in FIG. 371A. The insets of FIG. 37B show the magnetic field profiles of the waveguide-cavity modes at both the pumping and third-harmonic generatio (THG) wavelengths.

In an example, the plasmonic stripe can be made by using lithographically fabricated gold stripes positioned over a gold film separated by a thin layer of $Al_2O_3$. Although the gold stripes may be fabricated by lithography, the samples do not suffered from the feature size limitations typically associated with lithography because the plasmonic junctions are defined by atomic layer deposition (ALD) of the $Al_2O_3$. The resonance wavelength of each structure may be fixed around 1500 nm, for example, by varying the gap size and the width of the stripes. The THG from these structures may be characterized as a function of the gap size between the stripes and film, comparing the signal level to that of a bare gold film control sample. From this comparison, it can be shown that the THG signal is enhanced by almost 5 orders of magnitude relative to that of the gold film. The experiments are supported with numerical simulations in which the contributions of both the gold and the $Al_2O_3$ spacer layer, formed using ALD, to the nonlinear enhancement are taken into account. It is shown that although $Al_2O_3$ has a relatively small third-order susceptibility, the THG is greatly enhanced due to the large field enhancements of the film-coupled nanostripes.

A schematic of the sample geometry used in this study is shown in FIG. 37A. First, a 30 nm gold film can be fabricated by template stripping. This technique results in a gold film on a hardened optical epoxy (NOA 61, Norland Products Inc.) substrate with an ultrasmooth top surface. On top of the gold film, a thin layer of $Al_2O_3$ may be deposited by ALD at 50° C. to define a plasmonic nanoscale junction between the Au film and the metal stripes deposited on top of the $Al_2O_3$ layer. A periodic array of Au stripes were fabricated on top of the $Al_2O_3$ layer by electron beam lithography. The period between stripes was fixed at 250 nm, the height of the stripes was set at 30 nm, and the length was set at 50 µm. This geometry results in a coupled plasmonic structure that behaves as an optical frequency patch antenna such that the $Al_2O_3$ gap defines a waveguide cavity resonator where plasmons can propagate along the width and are reflected at the edges. As a result, both the width, W, and the gap size, g, determine the plasmon resonance frequency. The width can determine the cavity length, while the gap size can determine the effective index in the waveguide. Here the electric fields are mostly confined inside the gap, and thus near-field coupling between the stripes is minimized. Six different samples were fabricated with gap sizes ranging from 2.83 to 11.40 nm. With all other geometric parameters fixed, increasing gap size blue-shifts the plasmon resonance, pushing the THG toward the UV range. The shifted plasmon resonance introduces an additional mechanism to the THG amplitude, since the material properties of the gold disperse as a function of wavelength. To eliminate any changes in the THG due to the material dispersion, we fix the resonance wavelength of each sample to 1500 nm by varying simultaneously the gap size and the width of the stripe. The variation of the stripe width affects only the resonance wavelength, while variation of the gap affects both the enhancement as well as the resonance wavelength. By studying film-coupled stripes with varying gap sizes at the fixed resonance wavelength of 1500 nm, we are able to directly correlate THG enhancement with field enhancement.

A representative reflectance spectrum, measured by Fourier transform infrared spectroscopy, is shown in FIG. 37B for the sample with the smallest gap size (2.83 nm). When the polarization (electric field) of the incident field is oriented along the length of the stripe (transverse electric, or TE), no resonance is observed because the length of the waveguide is too long to support resonances in this wavelength range. For the opposite polarization (transverse magnetic, or TM), in which the electric field is oriented along the width of the stripe, a strong minimum approaching zero is observed in the reflectance spectrum near 1500 nm, indicating the film-coupled stripe behaves as a near-perfect absorber 36 where most of the photonic energy incident on the structures is coupled into the gap region. As a result, the electric field is drastically enhanced in the gap region with a maximum electric field at the edges of the stripe and maximum magnetic field at the center of the stripe, characteristic of a half-wavelength resonator (FIG. 37B). For the g=2.83 nm case, the enhancement of the electric field in the gap half way between the gold stripe and the gold substrate is 57. This large electric field is the determining factor for the enhancement of THG. For each of the six samples, the desired width of the stripes was determined by the experimental requirement that the plasmon resonance be positioned near 1500 nm in wavelength. This requirement resulted in an increasing stripe width as the gap size was increased, in order to maintain a resonance near 1500 nm for all of the samples. The widths of the stripes were measured by SEM to be 104, 119, 127, 153, 166, and 188 nm, respectively, in order of the thinnest to thickest gap samples.

Figure 38:
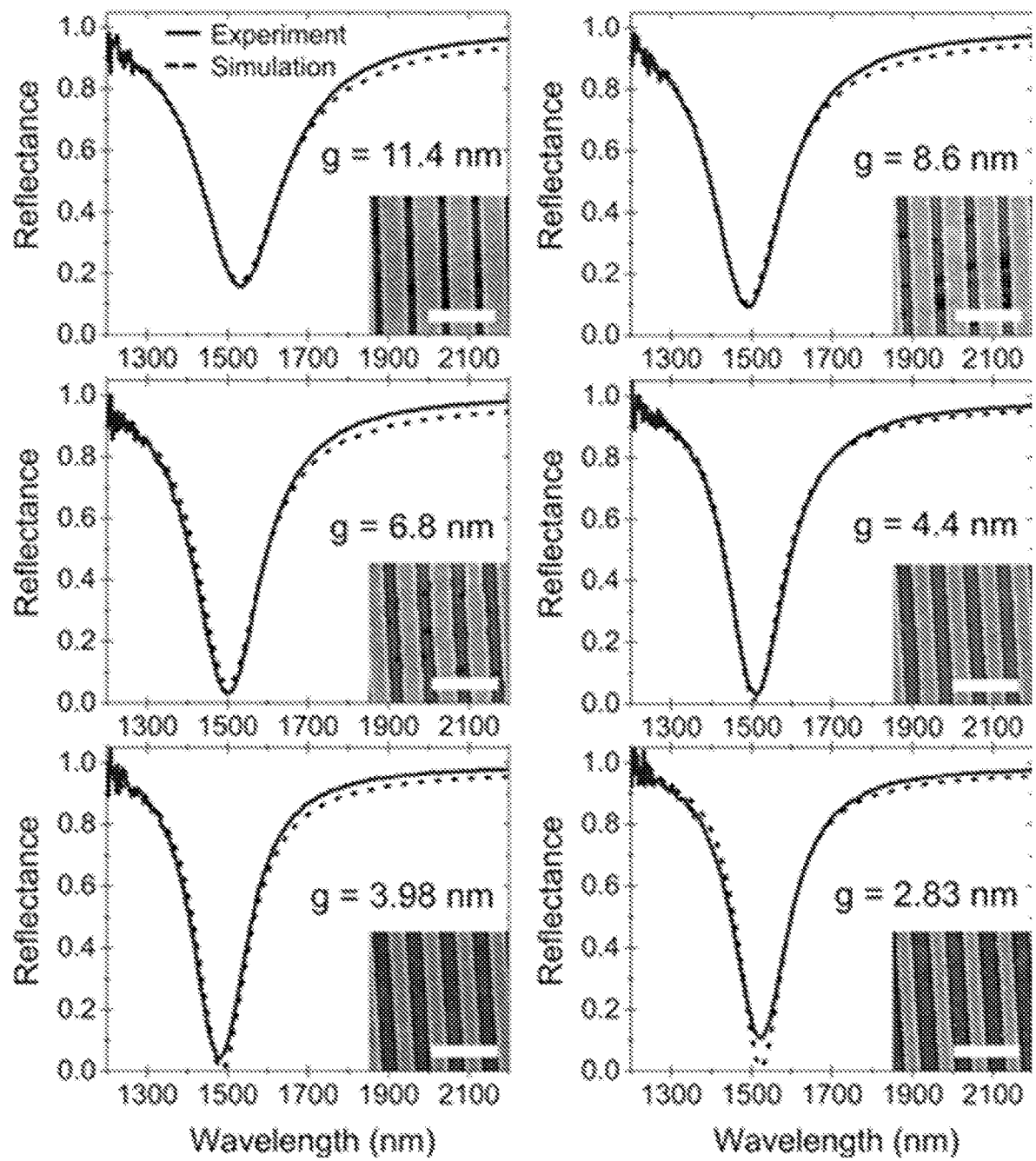
FIG. 38 illustrates graphs of experimental and simulated (broken line) reflectance spectra for each of the stripe samples.

The reflectance spectrum for each sample is shown in FIG. 38, along with the simulated spectrum fitted to the experimental data. FIG. 38 illustrates graphs of experimental and simulated (broken line) reflectance spectra for each of the stripe samples. Each of the six experimental samples supported plasmon resonances within the range 1485 to 1530 nm. The simulated spectra were obtained using two-dimensional finite element method simulations (COMSOL Multiphysics) with periodic boundary conditions and plane wave illumination at normal incidence. The simulations were fitted to the experimental spectra by varying the gap size, while the other parameters remained fixed for each sample: stripe width measured by SEM, 30 nm stripe thickness, 30 nm gold film thickness, 250 nm period, and a 5 nm rounding radius on the top corners of the stripes. Although the rounding of the corners can be quite important in many geometries, here the enhanced fields are confined mostly to the gap, so the rounding of the top corners did not have a significant effect. The thickness of the $Al_2O_3$ layer may differ slightly from the nominal values, and thus the final experimental gap sizes were determined by fitting the plasmonic spectra to simulations. The gap sizes were determined to be 2.83, 3.98, 4.40, 6.80, 8.60, and 11.40 nm. Because the gap size varies, but the resonance remains the same, the electric field in the gap increases with smaller gap sizes, enhancing the THG. By requiring the resonance to remain as close to the same wavelength as possible for all samples, we ensure that the effects of spectral dispersion in both the linear and nonlinear optical properties of the materials are minimized in our experiments. In order to probe THG enhancement for these structures, we pulses (~200 fs) from a tunable OPO source (Coherent, Chameleon) onto the sample using a broadband-corrected microscope objective (Mitutoyo Plan Apo NIR, 50×). The experiment is performed in a reflection configuration such that the microscope objective also collects the generated third harmonic signal. The fundamental laser line is filtered out using a dichroic mirror and short-pass filters, and the THG signal is directed into a spectrograph/CCD (Acton sp2500i/Princeton Instruments 400 BR Excelon) for data collection and analysis. Each measurement of the THG from a sample was taken as a spectrum (FIG. 3, inset), and the THG signal for each sample was defined as the peak of a Gaussian fit to the measured spectrum. For each of the six samples shown in FIG. 38, the polarization of the laser was oriented along the width of the stripes and was tuned to be at the minimum of the reflection spectrum in order to be efficiently coupled into the plasmon resonance mode. The experimentally measured THG signal for each sample is shown in FIGS. 40A-40C. FIG. 40A illustrates a graph showing a third harmonic generation enhancement (as compared to a bare gold film) vs gap size (g). FIG. 40B illustrates a graph showing power dependence of the THG signal from a bare 30 nm gold film. FIG. 40C illustrates a graph showing power dependence of the THG signal from a stripe pattern on the g=4.2 nm sample.

For each sample, five different stripe patterns were exposed to the laser, and the THG signal was collected during a 300 s exposure. The mean of the signal recorded from the five different stripe patterns is shown, and the error bars represent one standard deviation. Because the system is nonlinear with laser power, and because the local gap fields exponentially increase for smaller gaps, it was not possible to find a laser power where THG could be measured and laser damage could simultaneously be avoided from all six samples. Instead, the samples were separated into two groups. The 11.40, 8.60, and 6.80 nm samples were exposed to a higher average power (112 µW), while the 2.83 and 3.98 nm gap size samples were exposed to a lower average power (45 µW) to prevent laser damage. The 4.40 nm gap sample was exposed to both incident powers in order to provide a means of normalizing between the two groups. The THG signals measured from the 2.83 and 3.98 nm samples were normalized by multiplying by the ratio between the measured signals from the 4.40 nm gap sample at both incident powers (18.19). This normalization is justified by measuring the incident power dependence of the THG signal from the 4.40 nm gap sample (FIG. 40C). The THG signal power dependence is plotted on a log scale plot, and follows a power law (slope=~3). By using this normalization, the trend for the dependence of the THG signal versus the gap size between the stripes and the metal film can be clearly observed. Further justification and discussion use a custom optical setup (FIG. 39, which illustrates a schematic diagram of an experimental setup for measurement of THG; inset shows a representative THG spectrum measured from a film-coupled stripe sample) that focuses ultrafast laser pulses (~200 fs) from a tunable OPO source (Coherent, Chameleon) onto the sample using a broadband-corrected microscope objective (Mitutoyo Plan Apo NIR, 50×). The experiment is performed in a reflection configuration such that the microscope objective also collects the generated third harmonic signal. The fundamental laser line is filtered out using a dichroic mirror and short-pass filters, and the THG signal is directed into a spectrograph/CCD (Acton sp2500i/Princeton Instruments 400 BR Excelon) for data collection and analysis. Each measurement of the THG from a sample was taken as a spectrum (FIG. 39, inset), and the THG signal for each sample was defined as the peak of a Gaussian fit to the measured spectrum. For each of the six samples shown in FIG. 38, the polarization of the laser was oriented along the width of the stripes and was tuned to be at the minimum of the reflection spectrum in order to be efficiently coupled into the plasmon resonance mode. The experimentally measured THG signal for each sample is shown in FIGS. 40A-40C. For each sample, five different stripe patterns were exposed to the laser, and the THG signal was collected during a 300 s exposure. The mean of the signal recorded from the five different stripe patterns is shown, and the error bars represent one standard deviation. Because the system is nonlinear with laser power, and because the local gap fields exponentially increase for smaller gaps, it was not possible to find a laser power where THG could be measured and laser damage could simultaneously be avoided from all six samples. Instead, the samples were separated into two groups. The 11.40, 8.60, and 6.80 nm samples were exposed to a higher average power (112 µW), while the 2.83 and 3.98 nm gap size samples were exposed to a lower average power (45 µW) to prevent laser damage. The 4.40 nm gap sample was exposed to both incident powers in order to provide a means of normalizing between the two groups. The THG signals measured from the 2.83 and 3.98 nm samples were normalized by multiplying by the ratio between the measured signals from the 4.40 nm gap sample at both incident powers (18.19). This normalization is justified by measuring the incident power dependence of the THG signal from the 4.40 nm gap sample (FIG. 40C). The THG signal power dependence is plotted on a log scale plot, and follows a power law (slope=~3). By using this normalization, the trend for the dependence of the THG signal versus the gap size between the stripes and the metal film can be clearly observed.

For the experimental data to be quantitatively compared to simulations, it must be expressed in terms of a known reference signal that is present and measurable in both simulation and experiment. The THG signal was chosen from the background gold film as a convenient reference, and thus, all data points in FIG. 40A are expressed as an enhancement with respect to a 30 nm template-stripped gold film (i.e., THG signal from the stripe sample divided by the THG signal from the bare gold film). For the experimental data, this reference THG signal was measured from a 30 nm bare gold reference sample fabricated by template-stripping in the same manner as the bottom layer of the film-coupled nanostripes samples but without the $Al_2O_3$ layer or the gold stripes. However, the THG signal is too weak to be observed from the bare gold sample at the same incident power level as was used for the stripe samples. Thus, in order to accurately express the data as an enhancement factor, the THG signal from the bare gold sample was measured as a function of incident power at higher powers where the signal could be observed. The data were fitted to a straight line on the log scale plot (power law) with slope=3.01. Because the fit is high quality (R2=0.9999992) and the slope is approximately 3, we can extrapolate the fit function to the lower powers used to measure the stripe patterns (0.367 counts at an input power of 112 µW, indicated by the blue cross in FIG. 40B). The experimental THG signal from the stripe samples were divided by this value in order to get the enhancement with respect to the background gold film, shown as the blue data points in FIG. 40A. These enhancement values are beneficial because they can be quantitatively compared with similar enhancement values from numerical simulations. The data appear to show a linear trend on the semilog plot suggesting an exponential increase in the measured THG signal with decreasing gap size. A line in FIG. 40A represents a fit to the experimental data with an exponential function, y=a+be−cx, where the fit parameters are a=37, b=3.1×105, and c=0.6. This trend is due to the increase in the electric field as the gap size is made smaller. Note that the volume of the gold and $Al_2O_3$ layers are also changing across the samples, and thus the conversion volume is also changing, but the signal actually decreases as the conversion volume increases. Because of this and because the volume changes are small as compared to the more than 2 orders of magnitude difference in signal between the largest and smallest gap samples, it can be assumed that any effect due to changes in the conversion volume is insignificant.

For the 2.83 nm gap sample, the THG enhancement is measured to be 4.8 orders of magnitude greater than that from a bare gold film, indicating that this geometry is highly efficient at enhancing the THG. In order to understand these results, we performed nonlinear simulations of the structures using the commercial software COMSOL Multiphysics. For these simulations, third-harmonic fields were calculated by assuming that the fundamental fields are negligibly affected, undepleted pump approximation, by the up-conversion process. That is, the fields at the fundamental wavelength ($\lambda$) were used in the source term for computing the response at the third-harmonic wavelength ($\lambda/3$). Here, the permittivity of the 30 nm template stripped gold film and evaporated gold stripes were taken from empirical data, and thus any absorption of the ~500 nm THG emission due to the interband transitions of gold was fully accounted for in our simulations. The $\chi(3)$ used for calculating the THG from the bare gold film was 2.45×10-19 (m/V)2, which is an orientational average of the $\chi(3)$ tensor of polycrystalline gold film. The $\chi(3)$ for the gold in the film coupled stripes is uncertain and could be a complex value. However, $\chi(3)$=2.45×10-19 (m/V)2 was an approximation. Though the properties of $\chi(3)$ for crystalline $Al_2O_3$ are well-known, the very thin, amorphous spacer layer may not necessarily have the same properties as larger bulk crystals. The spacer layer was treated as an isotropic nonlinear material whose third-order nonlinear polarization was given by $$P = \frac{1}{4}\varepsilon_P \chi^{(3)}(E \cdot E)E.$$

The simulation results were then fitted to the experimental measurements, finding a value of $\chi(3)$ (Al2O3)=2.3×10-23 (m/V)2, which is relatively reasonable when compared to the $\chi(3)$ (~10−22 m2/V2) of crystalline $Al_2O_3$. As shown in FIG. 40A, the fitted trend of the simulated THG as a function of gap size is in good agreement to that measured in the experiments, following an exponential increase with decreasing gap size. However, the fit in FIG. 40A does not account for the nonlinear contribution of gold in the structured samples. Because the gold film and nanostripes both possess a relatively large χ(3) that could potentially give rise to the observed THG, we performed a numerical study to investigate the THG that would arise from the gold alone. In FIG. 40A, a simulated THG curve is presented that takes into account only the nonlinear contribution from the gold. In this case, the trend of the simulated THG as a function of gap size is distinct from that measured in the experiments. The trend observed in the simulations results from the limited field penetrating into the gold. When decreasing the gap size, the fields confined within the gap are stronger, as are the fields inside the gold; however, due to the large losses in gold, only the field near the gold surface is significantly enhanced. The trade-off between the field enhancement and loss mechanisms due to the gold nonlinearity results in a much flatter curve in FIG. 40A. Note that the curve exceeds the experimentally measured THG enhancement for gap sizes larger than 6 nm. One possible cause of this discrepancy is that our current models do not account for other possible nonlinear effects that can occur in this system. It is possible, for example, that competition between enhancement by the $Al_2O_3$ spacer layer and reduction by nonlinear absorption and other processes could account for the observed experimental enhancement values. It is also possible that nonlinear absorption could severely decrease the observed THG signal in simulation and hence bring both the green and the red curve down below the experimental curve. In FIG. 40A, the simulation result including both nonlinearities from the gold and the spacer layer is shown. The THG from the gold and the spacer interfere constructively, resulting in a total THG enhancement exceeding that from either the gold or the spacer alone.

In an example application, a nanoantenna hot electron photodetector may be produced in accordance with embodiments of the present disclosure. It is desired to achieve infrared (IR) photodetection, imaging, and photovoltaics using silicon electronics. In embodiments, near-perfect absorption of film-coupled nanoparticle arrays may be used as an efficient hot electron photodetector. Plasmons generated in the metal film of in the nanoparticles can decay into excited hot electrons with an energy above the Schottky barrier. These hot electrons can diffuse to the metal-semiconductor interface and where the electron and hole are separated, generate a photocurrent. The semiconductor can be placed under the metal film, within the electron diffusion length of the gap region, in the gap region itself, or near the metal nanoparticle. A wide variety of semiconductors can be used including, but not limited to, silicon, gallium arsenide, titanium oxide, graphene, and two-dimensional semiconductor materials such as transition metal dichalcogenides.

In another example application, photodetection by use of the present disclosure may be based on photoconductive or bolometric effect. A similar geometry as described above can be used to detect light based on photoconductive gain or the bolometric effect. For example, graphene coupled to a layer of semiconductor quantum dots results in large (about $10^6$) photoconductive gain due to the mismatch in charge mobility between the quantum dot layer and graphene. The overall efficiency of such a device can be dramatically enhanced by integrating it into the nanoantenna to harness its large absorption. Likewise, large absorption in the plasmonic gap region by a thin material such as graphene can change its electron temperature and hence the conductivity, resulting in a bolometric detector.

In another example application, nanoscale and microscale patterning of nanoantennas may be implemented based on the present disclosure. To create an imaging sensor based on the nanoantennas, a substrate may be patterned where different micron-scale regions contain nanoantennas with different resonances. Such patterning can enable hyperspectral imaging from the UV to the IR spectrum. This may be achieved by, for example, lithographically defining regions in a photoresist, exposing desired areas of the metal film. The nanopartiples can be deposited over the entire or substantially all the surface, and the resist is lifted off, with only nanoparticles adhering to the metal film remaining. This process can then be repeated with other nanoparticles creating a patterned substrate. In this case, within each defined region the distribution of nanoparticles may be random. Also the nanoantennas can be patterned on the nanoscale by, for example, defining the adhesion layer for individual nanoparticles on the metal film. This can be done using, for example, nanolithography such as electron beam lithography or using stamping techniques. Creating periodic arrays of nanoantennas or unit cells including specifically positioned and/or oriented nanoantennas can enable tailored absorption and emissivity spectra from the surface as well as other photodynamic processes, and control of the far field radiation pattern and polarization.

In another example application, spontaneous enhancement may be achieved. It is noted that the speed of optoelectronic devices, such as light emitting diodes, is limited by the time for electron-hole recombination in semiconductors. The rate of the resulting spontaneous emission can be greatly enhanced, exceeding 4,000-fold, by integrating the emitting material into the plasmonic nanoantenna. This is particularly important for enhancement of IR emitters such as PbS quantum dots, which have an intrinsically slow lifetime of about 1 µs. Enhancing the emission rate of these IR emitters using the plasmonic antenna has applications for light-emitting diodes for telecommunications and single photon sources for quantum communications. The spontaneous emission rate of a wide range of materials can be enhanced including single, few, and ensembles of emitters, semiconductors, and heterostructures.

In another example, application, single photo source emitters may be produced. Single photon emitters can be critical components of quantum information systems such as quantum key distribution. At present, no high speed and robust single photon emitters exist. One of the main limitations is the slow intrinsic spontaneous emission rate of single emitters like quantum dots and crystal color centers. In accordance with embodiments, single quantum dots, crystal color centers, or defect states can be integrated into the plasmonic antenna to increase the spontaneous emission rate and hence the maximum single photon emission rate. This approach can be applied to any dipolar quantum emitter.

In another example application, two-dimensional heterostructures may be integrated. Structures composed of layered two-dimensional single layer semiconductors can provide for atomically thin p-n junctions. These structures can enable ultrathin and fast optoelectronic devices such as light emitting diodes, lasers, phototransistors, and photodetectors. In accordance with embodiments, these heterojunctions can be integrated into the plasmonic antenna to increase their intrinsically weak absorption and photoluminescence and to increase the orientation speed via the enhancement of the spontaneous emission rate. The orientation of the electron-hole pair dipole moment across the two heterojunction can result in optimal coupling to the plasmonic gap electric fields.

In another example application, light-emitting diodes and lasers may be produced based on an antenna described herein. By electrically injecting charge into the optically active layer in the nanogap, the nanoantenna can serve as a light emitting diode. These light emitting diodes can have the ability for fast modulation due to the shortened spontaneous emission lifetime, directional emission, and high external quantum efficiency. Furthermore, by arranging the light emitting diode antennas into periodic arrays, the directionality can be dynamically modulated. Under conditions of fast pumping, the nanoantenna can act as an amplifying cavity to produce lasing. In such a situation, the coherence between antennas in the array can be utilized to dynamically control the angular emission profile in the far field. By using the plasmonic resonance tuning techniques described herein, the wavelength of emission of the light emitting diodes can also be dynamically changed. In addition, by using anisotropic nanoparticles, the electric field of the emission from the devices can be polarized.

In another example application, nanoantenna-based displays may be produced. Displays based on plasmonic antennas can be achieved by making pixelated and multiplexed arrays of LEDs or lasers. These can have low power consumption due to the high radiative quantum efficiency of the antennas. The image produced may be highly saturated due to the narrow band emission.

In another example application, the present disclosure may be used for enhanced nonlinear effects. Plasmonic antennas may also be utilized to enhance nonlinear effects of the material or materials placed in the gap region. For example, the plasmonic nanoantennas may be utilized to create enhanced up-conversion, down-conversion, second-harmonic generation, third-harmonic generation, higher-order generation, four-wave-mixing, and other nonlinear effects.

In another example application, the present disclosure may be used for energy harvesting. Plasmonic nanoantennas may be used to create enhanced absorption over a large wavelength range or at specific wavelength bands to enable more efficient absorption for photovoltaic devices. Plasmonic antennas may also be leveraged to convert mid-IR radiation into DC power or for the conversion of solar spectrum into thermal radiation (solar thermophotovoltaics). Additionally, the nanoantennas may be utilized to enhance catalysis of various processes.

In another example application, the present disclosure may be used for sensors and catalysis. Nanoantennas as described herein may be used as efficient sensors. For example, the dielectric material in the gap region as described herein can be undercut, and the structure can be integrated with nanofluidics to enhance the detection of a variety of optically active materials and molecules through either enhanced absorption or photoluminescence or a combination of the two. Additionally, the nanoantennas may be utilized for catalysis of various processes such as drive chemical reactions relevant to the storage of energy, production of fuels, and other energy-related materials, as well as to hasten the breakdown of hazardous or unwanted byproduct materials into benign or even useful materials (environmental remediation).

In another example application, the present disclosure may be used for dynamically tunable plasmon resonance. The optical resonance of surfaces based on the nanoantennas can be tuned by dynamically changing the dielectric properties of the material in the gap region. This can be accomplished by electrical, optical, or thermal tuning. The underlying mechanism of the dielectric function change can be, for example, a structural phase transition, electron or hole doping, or mechanical deformation. A wide variety of materials can be employed, including, but not limited to, chalcogenide phase change glasses, graphene, and related materials, and photochromic, photorefractive, and thermosrefractive polymers. This dynamic tuning capability may be added to any of the devices or effects described herein.

One skilled in the art will readily appreciate that the present subject matter is well adapted to carry out the objects and obtain the ends and advantages mentioned, as well as those inherent therein. The present examples along with the methods described herein are presently representative of various embodiments, are exemplary, and are not intended as limitations on the scope of the present subject matter. Changes therein and other uses will occur to those skilled in the art which are encompassed within the spirit of the present subject matter as defined by the scope of the claims.

What is claimed:

1. An apparatus comprising:
   a conductive material defining a substantially planar surface;
   a conductive nanostructure defining a substantially planar surface, wherein the conductive material and the conductive nanostructure are positioned such that the planar surface of the conductive material faces the planar surface of the conductive nanostructure, such that the planar surfaces are substantially parallel, and such that the planar surfaces are spaced by a selected distance; and
   an active material positioned between the planar surfaces;
   wherein the planar surface of the conductive nanostructure, the planar surface of the ground plane, and lateral edges of the conductive nanostructure are configured to confine multiple optical modes; and
   wherein the optical modes include a lowest energy (fundamental) mode having a dipolar and antisymmetric spatial profile and an effective magnetic dipole.

2. The apparatus of claim 1, wherein the wavelength of the optical modes is one of in the visible, near infrared, and mid infrared spectral regions, determined by the size of the nanostructure and a thickness of a space between the planar surfaces of the conductive nanostructure and the conductive material.

3. The apparatus of claim 1, wherein radiation of one of the optical modes into free space occurs at about the same rate as decay of the mode into excited electrons in the conductive material.

4. The apparatus of claim 1, wherein the active material comprises optically emissive material,
   wherein the conductive material and the conductive nanostructure form a nanopatch antenna, and
   wherein the optically emissive materials experience an enhanced emission rate due to the presence of the nanopatch antenna.

5. The apparatus of claim 1, wherein the conductive material comprises one of gold, silver, aluminum, and plasmonic material.

6. The apparatus of claim 1, further comprising depositing a layer of one of a dielectric material and an optically active material on the planar surface of the conductive material.

7. The apparatus of claim 1, wherein the optically-active material comprises a luminescent material.

8. The apparatus of claim 7, wherein the luminescent material includes one of quantum dots, organic dyes, quantum wells.

9. The apparatus of claim 7, further comprising depositing the luminescent material on the planar surface of the conductive material.

10. The apparatus of claim 7, wherein the luminescent material includes quantum dots having diameters between about 3-10 nanometers.

11. The apparatus of claim 7, wherein the luminescent material include quantum dots made of a compound semiconducting material.

12. The apparatus of claim 11, wherein the quantum dots are deposited by one of spin coating, dip coating, electrophoresis, and Langmuir-Blodgett deposition.

13. The apparatus of claim 1, wherein the conductive nanostructure is substantially covered with a layer of polyvinyl pyrrolidone (PVP).

14. The apparatus of claim 13, wherein the layer of PVP is about 3 nanometers thick.

15. The apparatus of claim 1, further comprising positioning a dielectric material between the planar surfaces.

16. The apparatus of claim 1, wherein the planar surface of the conductive nanostructure is about 50-150 nanometers in width.

17. The apparatus of claim 1, wherein a width of the planar surface of the conductive nanostructure is a selected width for controlling the resonance wavelength of the nanostructure.

18. The apparatus of claim 1, wherein the optically-active material comprises at least one of semiconductor material, quantum dots, and luminescent material.

19. The apparatus of claim 1, wherein the selected distance between the planar surfaces is about 1-20 nanometers.

20. The apparatus of claim 1, further comprising a spacer material positioned between the planar surfaces for spacing the planar surfaces at the selected distance.

21. The apparatus of claim 1, wherein the planar surfaces are spaced at the selected distance for controlling at least one of an electric field enhancement and resonance wavelength of the active material.

22. The apparatus of claim 1 wherein the conductive nanostructure, the conductive material and the active material form a nanopatch antenna, and
wherein the apparatus further comprises a plurality of nanopatch antennas.

23. The apparatus of claim 22, further comprising fabricating the nanopatch antennas in random or periodic arrays with subwavelength spacing on a surface to form a metasurface.

24. The apparatus of claim 23, further comprising spatially patterning the metasurface on the micro-scale using one of photolithographic and lift-off techniques.

25. The apparatus of claim 22, wherein the conductive material is a ground plane, and
wherein a spacer material is positioned between the conductive nanostructure and the conductive material to thereby provide a semiconductor forming a Schottky barrier with the ground plane and the conductive nanostructure.

26. The apparatus of claim 22, wherein a spacer material is positioned between the conductive nanostructure and the conductive material, and wherein the spacer material has a resisitivity dependent upon temperature.

27. The apparatus of claim 22, wherein a spacer material is positioned between the conductive nanostructure and the conductive material, and
wherein the spacer material becomes more or less conductive upon optical excitation of the nanopatch antenna.

28. The apparatus of claim 22, wherein the active material comprises a luminescent material including one of a single quantum dot, a single dye molecule, or other single quantum system that can emit only one photon at any given time.

29. The apparatus of claim 22, wherein the active material comprises a luminescent material that is a layered material including monolayers of two-dimensional materials.

30. The apparatus of claim 29, wherein the layered material includes one of graphene, boron nitride, and transition metal dichalcogenides.

31. The apparatus of claim 1, further comprising providing a spacer material between the conductive nanostructure and the conductive material, wherein the spacer material has nonlinear optical response that is enhanced by the presence of the nanopatch antenna.

32. The apparatus of claim 1, further comprising providing a spacer material between the conductive nanostructure and the conductive material, wherein the spacer material is responsive to heat or chemicals for changing the resonance of the nanopatch antenna.

33. The apparatus of claim 1, further comprising providing a spacer material between the conductive nanostructure and the conductive material, wherein the spacer material changes the optical refractive index upon application of a voltage.

34. An apparatus comprising:
a conductive material defining a substantially planar surface;
a conductive nanostructure defining a substantially planar surface, wherein the conductive material and the conductive nanostructure are positioned such that the planar surface of the conductive material faces the planar surface of the conductive nanostructure, such that the planar surfaces are substantially parallel, and such that the planar surfaces are spaced by a selected distance; and
an active material positioned between the planar surfaces;
wherein the conductive nanostructure comprises a nanocube.

35. The apparatus of claim 34, wherein the nanocube is made of silver.

36. The apparatus of claim 34, wherein the nanocube is a colloidally synthesized silver nanocube.

37. The apparatus of claim 34, wherein the nanocube has a diameter between about 50-150 nm.

* * * * *